US009000967B2

(12) United States Patent
Pagnanelli

(10) Patent No.: US 9,000,967 B2
(45) Date of Patent: Apr. 7, 2015

(54) APPARATUSES AND METHODS FOR LINEAR TO DISCRETE QUANTIZATION CONVERSION WITH REDUCED SAMPLING VARIATION ERRORS

(71) Applicant: Syntropy Systems, LLC, Costa Mesa, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

(21) Appl. No.: 14/056,917

(22) Filed: Oct. 17, 2013

(65) Prior Publication Data

US 2014/0043177 A1  Feb. 13, 2014

Related U.S. Application Data

(63) Continuation-in-part of application No. 13/535,037, filed on Jun. 27, 2012, now Pat. No. 8,581,768.

(60) Provisional application No. 61/549,739, filed on Oct. 20, 2011, provisional application No. 61/536,003, filed on Sep. 18, 2011, provisional application No. 61/554,918, filed on Nov. 2, 2011, provisional application No. 61/501,284, filed on Jun. 27, 2011.

(51) Int. Cl.
*H03M 1/12* (2006.01)
*H03M 3/00* (2006.01)

(52) U.S. Cl.
CPC ............ *H03M 3/30* (2013.01); *H03M 1/121* (2013.01); *H03M 3/468* (2013.01)

(58) Field of Classification Search
CPC ........ H03M 3/30; H03M 3/468; H03M 1/121
USPC .......... 341/155, 143, 139, 123, 159, 122, 144
See application file for complete search history.

(56) References Cited

U.S. PATENT DOCUMENTS

| 6,683,919 B1 | 1/2004 | Olgaard et al. |
| 7,224,939 B2 | 5/2007 | Takayama et al. |

(Continued)

OTHER PUBLICATIONS

Mazlouman, S., "Digital Compensation Techniques for Frequency-Translating Hybrid Analog-to-Digital Converters", IEEE Transactions on Instrumentation and Measurement, vol. 60, No. 3, 2011.

(Continued)

*Primary Examiner* — Peguy Jean Pierre
(74) *Attorney, Agent, or Firm* — Joseph G. Swan, P.C.

(57) ABSTRACT

Provided is an apparatus for converting a continuous-time, continuously variable signal into a sampled and quantized signal, which includes an input line for accepting an input signal, multiple processing branches coupled to the input line, and an adder coupled to outputs of the plurality of processing branches. Each of the processing branches includes a sampling/quantization circuit and a digital bandpass interpolation filter having an input coupled to an output of the sampling/quantization circuit. The digital bandpass interpolation filters in different ones of the processing branches have frequency responses that are centered at different frequencies. The digital bandpass interpolation filter in at least one of the processing branches includes: (i) a quadrature downconverter, (ii) a first lowpass filter and a second lowpass filter, (iii) a first interpolator and a second interpolator, each having an input for inputting a variable interpolant value, and (iv) a quadrature upconverter.

26 Claims, 32 Drawing Sheets

(56) References Cited

U.S. PATENT DOCUMENTS

| | | | |
|---|---|---|---|
| 7,324,036 | B2 | 1/2008 | Petre et al. |
| 8,089,382 | B2 | 1/2012 | Pagnanelli |
| 2010/0130156 | A1 | 5/2010 | Jin et al. |
| 2012/0322399 | A1 | 12/2012 | Sheikholeslami |

OTHER PUBLICATIONS

Petraglia, A., "High Speed A/D Conversion using QMF Filter Banks", Proceedings: IEEE International Symposium on Circuits and Systems, 1990.

Velazquez, S., "Design of Hybrid Filter Banks for Analog/Digital Conversion", IEEE Transactions on Signal Processing, vol. 46, No. 4, 1998.

Ding, G., "Frequency-Interleaving Technique for High-Speed A/D Conversion", Proceedings: IEEE International Symposium on Circuits and Systems, 2003.

Aziz, P., "Multi Band Sigma Delta Analog to Digital Conversion", IEEE International Conference on Acoustics, Speech, and Signal Processing, 1994.

Smilkstein, T., "Jitter Reduction on High-Speed Clock Signals" (PhD Thesis), University of California, Berkeley, 2007.

Hewlett Packard Product Note 11729C-2, "Phase Noise Characterization of Microwave Oscillators: Frequency Discriminator Method", Sep. 1985.

Lee, S. T., et al., "A 1.5V 28mA Fully-Integrated Fast-Locking Quad Band GSM-GPRS Transmitter with Digital Auto-Calibration in 130nm CMOS", IEEE Journal on Solid-State Circuits, 2004.

Gheidi, H., et al., "An Ultra-Broadband Direct Demodulator for Microwave FM Receivers", IEEE Transactions on Microwave Theory and Techniques, vol. 59, No. 8, Aug. 2011.

Beards, R. D., "An Oversampling Delta-Sigma Frequency Discriminator", IEEE Transactions on Circuits and Systems II, vol. 41, No. 1, Jan. 1994.

Kwon, J., et al., "Impact of Sampling Clock Phase Noise on Frequency Discriminators", IEEE Transactions on Circuits and Systems II, vol. 54, No. 11, Nov. 2007.

Sullivan, T., "Gauging Limitations on DFD Performance", Microwave and RF Magazine, Nov. 2005.

Thorton, M. J., "Frequency Discriminators for Broadband Applications", Proceedings of Automated RF & Microwave Measurement Society, 2011.

Farrow, C.W., "A Continuously Variable Digital Delay Element", IEEE International Symposium on Circuits and Systems, 1988.

Gardner, Floyd M., "Interpolation in Digital Modems—Part I: Fundamentals", IEEE Transactions on Communications, vol. 41, No. 3, Mar. 1993.

Gardner, Floyd M., "Interpolation in Digital Modems—Part II: Implementation and Performance", IEEE Transactions on Communications, vol. 41, No. 6, Jun. 1993.

"A Filter Primer", AN-733, Maxim Integrated, 2008.

Zumbahlen, H., "State Variable Filters", MT-223, Analog Devices, 2012.

Prosecution history of related U.S. Appl. No. 12/824,171 (now US Patent 8,089,382).

Prosecution history of related U.S. Appl. No. 12/985,238 (now US Patent 8,299,947).

Prosecution history of related U.S. Appl. No. 13/363,517.

Prosecution history of parent U.S. Appl. No. 13/535,037 (now US Patent 8,581,768).

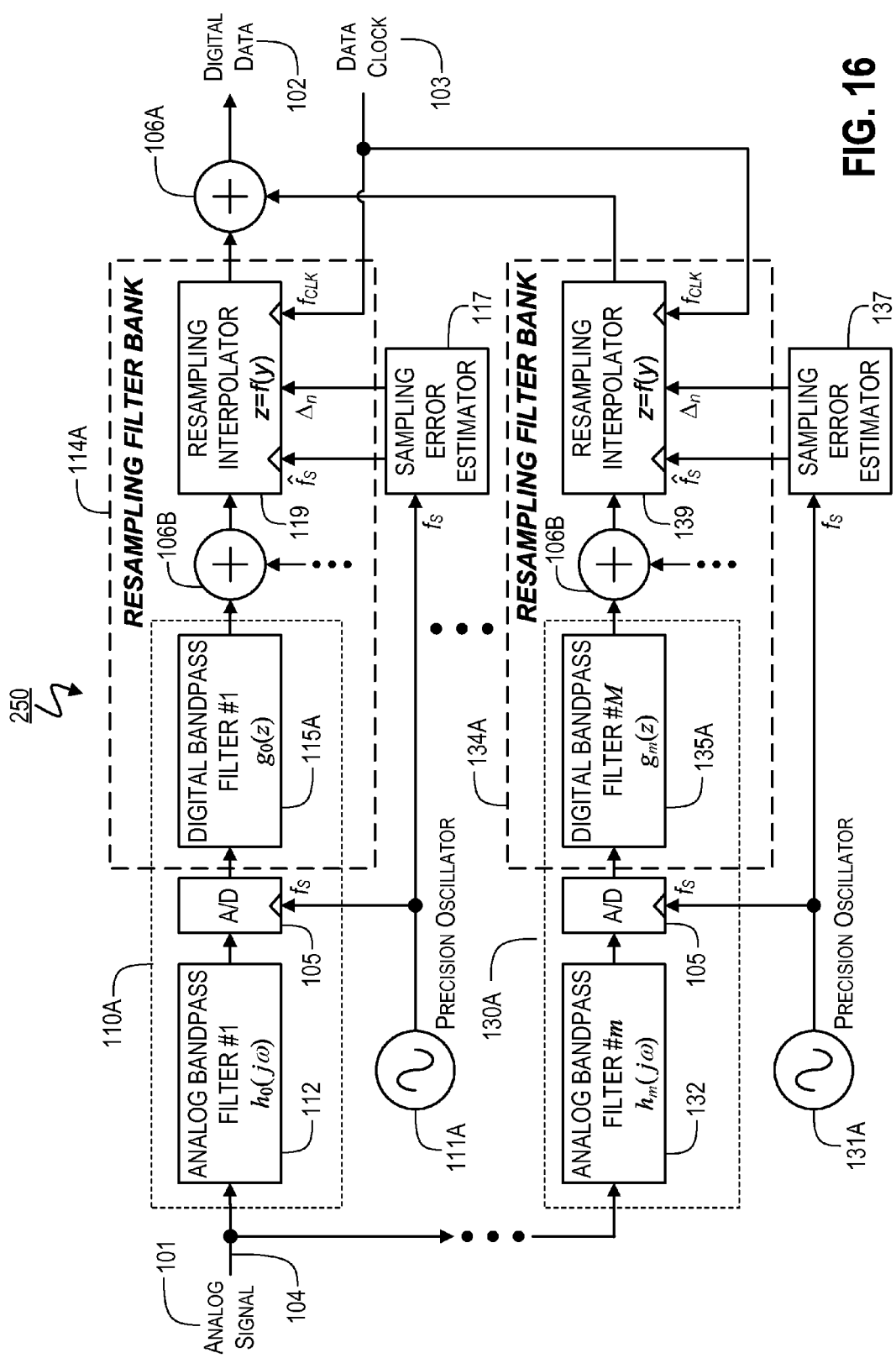

APPARATUSES AND METHODS FOR LINEAR TO DISCRETE QUANTIZATION CONVERSION WITH REDUCED SAMPLING VARIATION ERRORS

This application is a continuation in part of U.S. patent application Ser. No. 13/535,037, filed on Jun. 27, 2012, and titled "Linear to Discrete Quantization Conversion with Reduced Sampling Variation Errors" which, in turn, claimed the benefit of U.S. Provisional Patent Application Ser. No. 61/549,739 (the '739 Application), filed on Oct. 20, 2011; U.S. Provisional Patent Application Ser. No. 61/554,918 (the '918 Application), filed on Nov. 2, 2011; U.S. Provisional Patent Application Ser. No. 61/536,003 (the '003 Application), filed on Sep. 18, 2011, and titled "Method and Apparatus for Reducing Frequency Drift"; and U.S. Provisional Patent Application Ser. No. 61/501,284, filed on Jun. 27, 2011, and titled "Sampling/Quantization Converters". The foregoing applications are incorporated by reference herein as though set forth herein in full.

FIELD OF THE INVENTION

The present invention pertains to systems, methods and techniques for reducing errors caused by sampling uncertainty in the conversion of continuous-time continuously variable signals into sampled, quantized signals. It is particularly applicable to data converters that operate at high sampling rates and quantize high-frequency input signals with high precision. The present invention also pertains to systems, methods and techniques for changing the sampling rate of a discrete-time signal in order to obtain a new discrete-time representation of an underlying continuous-time signal.

BACKGROUND

Many applications in modern electronics require that continuous-time signals be converted to discrete signals for processing using digital computers and signal processors. Conventionally, this transformation is made using a method similar to converter circuit 5, illustrated in FIG. 1. Circuit 5 converts analog input 6 (i.e., both continuous in time and continuously variable) to discrete digital output 16 (i.e., both sampled in time and quantized in value) using lowpass filter 8, sample-and-hold circuit 10 (sampler), and quantizer 14. The instantaneous bandwidth of such a sampled system is limited by the Nyquist criterion to a maximum theoretical value equal to one-half the sample clock ($f_{CLK}$) frequency (i.e., the Nyquist limit). Therefore, the purpose of lowpass filter 8, in circuit 5, is to reject frequencies above the Nyquist limit, so that discrete output 16 is not corrupted by errors related to aliasing. For this reason, filter 8 is often referred to in the prior art as an anti-aliasing filter. At time intervals determined by clock frequency 12, sample-and-hold circuit 10 captures the output value of anti-aliasing filter 8 (i.e., an analog signal), and holds that value while quantizer 14 produces, using a rounding operation, discrete-time, discretely-valued output 16 (i.e., a digital signal). The number of discrete levels in the rounding operation of quantizer 14 determines the conversion resolution, or maximum precision, associated with analog-to-digital converter circuit 5. Converter precision is often specified as an effective number of bits (ENOB), such that for Q levels in the rounding operation, the ENOB is less than or equal to $\log_2(Q)$.

In general, the precision of an analog-to-digital converter (ADC) is less than $\log_2(Q)$ because of impairments such as sampling uncertainty, or timing jitter, that degrade the accuracy of the sampling/quantization operation and reduce the quality of the conversion process. Although one source of sampling uncertainty is the inability of sample-and-hold circuit 10 to consistently capture signals on the transitions (i.e., rising and falling edges) of sample clock 12, a primary source of sampling jitter/uncertainty in conventional ADCs tends to be the sample clock source itself. The sample clock is produced by a circuit, often called an oscillator, which conventionally includes a network that is resonant at a particular frequency (i.e., a resonator). FIG. 2A is an exemplary conventional oscillator known as a Pierce oscillator. Sampling jitter/uncertainty results when the oscillator output frequency varies or drifts over time due to resonator instabilities, and/or other circuit imperfections. Fluctuations (perturbations) in oscillator output frequency and/or phase are generally classified according to the time scale over which the fluctuations occur. For example, rapid fluctuations in oscillator output frequency, such as those having periods on the order of nanoseconds to microseconds, produce what is referred to as short-term jitter, or high-frequency jitter (i.e., white phase noise). Conversely, slow fluctuations in oscillator output frequency, such as those having periods on the order of milliseconds to tenths of seconds, produce what is referred to as long-term jitter or low-frequency jitter (i.e., flicker-phase noise or white-frequency noise). Finally, extremely slow fluctuations in oscillator output frequency, such as those with periods on the order of seconds to many seconds, produce what is referred to as wander (i.e., flicker-frequency noise or random frequency walk). FIG. 2B provides a classification of clock frequency instability based on the rate of variation exhibited by the fluctuations in the oscillator output. As shown in FIG. 2B, low-frequency jitter and wander typically have greater magnitudes (i.e., are associated with larger deviations in desired frequency and time period) than high-frequency jitter.

To illustrate the effects of sampling jitter on an ADC, it is informative to consider first the case of a narrowband (sinusoidal) input signal, such as $x(t)=A_m \cdot \sin(\omega_m t+\phi_m)$, with arbitrary amplitude ($A_m$), arbitrary phase ($\phi_m$), and angular frequency $$\omega_m < \frac{1}{2} \cdot f_{CLK}.$$

Assuming infinite resolution (i.e., number of rounding levels $Q \to \infty$, the discrete-time output of the converter is given by $$\hat{y}_k(n)=A_m \sin(\omega_m T \cdot n+\phi_m+\omega_m \cdot \phi),$$

where the sampling interval $T=1/f_{CLK}$ and $\phi$ is a white, Gaussian noise sequence produced by sampling jitter (uncertainty) having power $\sigma_\phi^2$ and power spectral density $N_0$ (i.e., $$N_0 = \sigma_\varphi^2 \Big/ \left(\frac{1}{2} \cdot f_{CLK}\right)\Big).$$

For the case where $|\phi| \ll 1$, which is typical for high-precision clock sources, it is relatively straightforward for those skilled in the art to show that $$\hat{y}(n) \approx A_m \cdot \sin(\omega_m T \cdot n+\phi_m)+A_m \cdot \cos(\omega_m T \cdot n+\phi_m) \cdot (\omega_m \cdot \phi),$$

where the first term in the above equation is the sampled input signal and the second term is noise introduced by sampling jitter. The power in the noise term increases with the square of the input angular frequency $\omega_m$ according to $$P_{Noise} = \frac{1}{2} \cdot A_m^2 \cdot \sigma_\varphi^2 \cdot \omega_m^2,$$

and this noise adds directly to the converter output to degrade conversion accuracy. Specifically, the effective resolution (i.e., ENOB) of a data converter degrades by 0.5 bits for every factor of two increase in output noise.

The jitter analysis above can be extended to the case of a broadband input signal by considering that any real, bandlimited signal can be approximated by a finite sum of sinusoids via a Fourier series. In analyzing the effects of sampling jitter, therefore, it is convenient to represent a broadband input signal (x), with bandwidth $f_B$, as the sum of K sinusoids having arbitrary amplitude and arbitrary phase, where $$x(t) = \sum_{k=0}^{K-1} A_k \cdot \sin(\omega_k t + \phi_k),$$

and: (1) amplitude values $A_k$ are uniformly distributed over the interval $[-1, 1]$; (2) phase values $\phi_k$ are uniformly distributed over the interval $(-\pi, +\pi]$; and (3) angular frequency values $\omega_k$ are uniformly distributed over the interval $[0, 2\pi \cdot f_B]$ (i.e., $\omega_0=0$ and $\omega_{K-1}=2\pi \cdot f_B$). Again assuming infinite resolution (i.e., number of rounding levels $Q \to \infty$), the discrete-time output of the converter is given by $$\hat{y}_k(n) = \sum_{k=0}^{K-1} A_k \sin(\omega_k T \cdot n + \phi_k + \omega_k \cdot \varphi)$$

$$\approx \sum_{k=0}^{K-1} A_k \cdot \sin(\omega_k T \cdot n + \phi_k) + \sum_{k=0}^{K-1} A_k \cdot \cos(\omega_k T \cdot n + \phi_k) \cdot (\omega_k \cdot \varphi),$$

where the second term, which is the output noise introduced by sampling jitter, has power $$P_{Noise} = \frac{1}{2} \cdot K \cdot E\{A_k^2\} \cdot \sigma_\varphi^2 \cdot \frac{1}{K} \cdot \sum_{k=0}^{K-1} \omega_k^2.$$

As $K \to \infty$ the power in the noise term converges to $$P_{Noise} = \frac{1}{3} \cdot \sigma_S^2 \cdot \sigma_\varphi^2 \cdot (2\pi \cdot f_B)^2,$$

where $\sigma_S^2$ is the input signal power. Therefore, the extent to which sampling jitter degrades conversion accuracy is proportional to the square of the input signal bandwidth $f_B$.

As a result of the above analysis, the present inventor has identified a need for minimizing the effects of sampling jitter in data converter circuits, particularly those that are required to process input signals with high-frequency content (i.e., large $\omega_k$), or wide bandwidth (i.e., large $f_B$). To overcome the processing speed limitations of electronic circuits, high-frequency converters conventionally employ an arrangement where multiple, distinct converters are operated in parallel (i.e., parallel processing). Conventional parallel processing arrangements include time-interleaving (time-slicing) converters and frequency-interleaving (frequency-slicing) converters. For interleaving in time, a high-speed sample clock is decomposed into multiple, lower-speed sample clocks at different phases. Each converter in the time-interleaving array is clocked with a different clock phase, such that the conversion operation is distributed in time across multiple converters. Distributing processing operations across time is a technique that often is referred to as polyphase decomposition in the prior art. While converter #1 is processing the first sample, converter #2 is processing the next sample, and so on.

For interleaving in frequency, the total bandwidth of the continuous-time signal is uniformly divided into multiple, narrowband segments (i.e., sub-bands). Processing a wideband signal as multiple narrowband segments is a technique that often is referred to in the prior art as frequency (spectral) decomposition or decomposition in frequency. Each parallel processing branch converts one narrowband segment, and all the converter processing branches operate from a single, common sampling clock. One representative implementation of a frequency-interleaving ADC is circuit 30A, shown in FIG. 3A, where the individual bands are separated out and downconverted to baseband. More specifically, the input signal 31 is provided to a set of multipliers 32 together with the band's central frequencies 33-35. The resulting baseband signals are then provided to a set of identical, lowpass filters 36 that are designed to spectrally decompose the input signal (i.e., a process conventionally referred to as signal analysis), in addition to minimizing aliasing. Each such filtered baseband signal is then digitized by sampling/quantization circuits 40A, digitally upconverted by multipliers 42, using digitized sinusoids 43-45 (or alternatively simply upsampled), and then bandpass filtered (i.e., within reconstruction filters 46-48) in order to restore the input signal to its previous frequency band (i.e., a process conventionally referred to as signal synthesis). Finally, the individual bands are recombined within a set of one or more adders 49. Instead of operating at a sampling frequency equal to twice the bandwidth of the input signal, each converter 40A in the interleaved array is able to operate at a lower sampling frequency equal to twice the bandwidth of each subdivided, downconverted band (i.e., the portion of the input signal intended to be converted by the respective processing branch).

Frequency-interleaving converter circuit 30A, illustrated in FIG. 3A, is typically referred to as a frequency-translating hybrid (FTH) architecture. See Mazlouman, S., "Digital Compensation Techniques for Frequency-Translating Hybrid Analog-to-Digital Converters", IEEE Transactions on Instrumentation and Measurement, Volume 60, Number 3, 2011. An alternative, conventional frequency-interleaving converter, first described by Petraglia and Mitra in 1990, is the hybrid filter bank (HFB) converter circuit 30B, shown in FIG. 3B. See Petraglia, A., "High Speed A/D Conversion using QMF Filter Banks", Proceedings: IEEE International Symposium on Circuits and Systems, 1990. The operation of the HFB converter is similar to that of the FTH converter, except that input signal 31 is provided to a set of analog, bandpass filters 36-38 (i.e., conventionally referred to as signal analysis filters) for spectral decomposition, before being provided to multipliers 32 for downconversion to baseband using the band's central frequencies 33-35. The analog input (bandpass-decomposition) filters are conventionally designed for minimum spectral overlap (i.e., non-overlapping passbands), with preferred bandwidths of $f_{CLK}/2M$, where $f_{CLK}$ is the converter sample-rate frequency and M is the number of parallel processing branches. See Velazquez, S., "Design of Hybrid Filter Banks for Analog/Digital Conversion", IEEE Transactions on Signal Processing, Volume 46, Number 4, 1998. As in the FTH approach, each converter 40A in the interleaved array of the HFB converter operates at a sampling frequency equal to twice the bandwidth of each subdivided, downconverted band (i.e., the portion of the input signal intended to be converted by the respective processing branch). Conventionally, the FTH approach is preferred over the HFB approach because: (1) matched lowpass-decomposition filters are easier to implement than matched bandpass-decomposition filters, (2) filtering after downconversion ensures minimal spectral overlap between sub-bands; and (3) filtering prior to digitizing reduces errors due to aliasing. See Ding, G., "Frequency-Interleaving Technique for High-Speed A/D Conversion", Proceedings: IEEE International Symposium on Circuits and Systems, 2003. The present inventor has discovered, however, that since the FTH approach employs no bandlimiting prior to the downconversion operation, intermodulation distortion that is introduced by the input multipliers can degrade conversion accuracy.

A variation on the conventional hybrid filter bank (HFB) converter is the multiband delta-sigma (MBΔΣ) converter circuit 30C, shown in FIG. 3C. See Aziz, P., "Multi Band Sigma Delta Analog to Digital Conversion", IEEE International Conference on Acoustics, Speech, and Signal Processing, 1994. This approach attempts to solve the difficulties associated with implementing matched bandpass-decomposition (analysis) filters by eliminating them completely. And unlike conventional FTH and HFB converters, the MBΔΣ converter performs no spectral (frequency) decomposition in the analog domain. The input signal 31 instead is provided directly to the sampling/quantization circuits 40B, which consequently prevent aliasing errors by sampling at twice the bandwidth of the input signal, rather than at twice the bandwidth of a subdivided band. The present inventor has discovered that a primary disadvantage of MBΔΣ approach is increased sensitivity to timing jitter, due to the presence of wideband signals at the inputs of each sampling/quantization circuit (i.e., no analog bandlimiting prior to sampling and quantization). The present inventor also has discovered that another disadvantage of frequency decomposition in the analog domain, as in FTH and HFB converters, is that the practical (e.g., manufacturing) constraints associated with analog bandpass filter quality factor (i.e., quality factor Q, defined as the ratio of filter center frequency to filter bandwidth) limits the number of processing branches to about 25 to 30, a number which may be insufficient for realizing desired bandwidth and conversion-accuracy targets.

Although, conventionally, frequency-interleaving converters are considered to be less sensitive to timing jitter than time-interleaving converters, as a result of downconversion to baseband and use of a common sampling clock (Ding 2003), timing jitter is a problem for any converter that processes high-frequency input signals. Conventional methods for reducing timing jitter generally attempt to attenuate the short-term jitter (i.e., white phase noise) of the sampling clock source, ignoring longer-term jitter and drift. See Smilkstein, T., "Jitter Reduction on High-Speed Clock Signals" (PhD Thesis), University of California, Berkeley, 2007. These conventional methods typically involve improving the stability of the clock oscillator itself, for example using high-precision atomic or quartz resonators, or involve use of phase-locked loop (PLL) techniques (Smilkstein, 2007) to slave the frequency of a relatively stable oscillator (i.e., atomic or quartz) to the average frequency of a relatively unstable or noise-corrupted clock source.

Circuit 50, illustrated in FIG. 4A, is an exemplary PLL of the type conventionally used for reducing the high-frequency jitter of a sampling clock source. In circuit 50, the output phase of clock source 52, which has been corrupted by noise, is compared to the output phase of low-jitter, controlled oscillator 60 within phase detector 56. The phase difference 57 (i.e., phase error) between the noisy (high-jitter) clock source and the precision oscillator is lowpass filtered, by loop filter 58, to produce control signal 59. Control signal 59 adjusts the frequency of controlled oscillator 60 to match the average frequency of noisy clock source 52. A frequency divider (e.g., divider 62) can be included in the feedback path of the PLL such that the frequency ($f_{OSC}$) at PLL output 61 equals $f_{OSC}=D \cdot f_0$, where $f_0$ is the nominal frequency of the noisy clock source and D is the frequency-input to frequency-output ratio (i.e., divide ratio) of the divider.

The jitter transfer function of circuit 50 is the frequency response from output 53 of noisy oscillator 52, to output 61 of the PLL. For phase detector 56 having gain $K_D$, controlled oscillator 60 having gain (i.e., modulation sensitivity) $K_V$, and loop filter 58 having second-order, lag-lead response $$H(s) = \frac{1 + \beta \cdot s}{\alpha \cdot s},$$

the jitter transfer function, $H_{JTF}$, has a lowpass response given by $$H_{JTF} = \frac{\omega_n^2}{1 + 2\zeta\omega_n + \omega_n^2},$$

where the PLL natural frequency $\omega_n = \sqrt{K_D \cdot K_V/\alpha}$ and the PLL damping factor $$\zeta = \frac{1}{2} \cdot \omega_n \cdot \beta.$$

For reference, the jitter transfer function for PLL circuit 50 is plotted in FIG. 4B. As illustrated in FIG. 4B, jitter that fluctuates at a rate greater than $\omega_n$ is attenuated by the PLL. The clock signal at the output of the PLL will be more stable than the output of noisy clock source 52, when: (1) controlled oscillator 60 has very low jitter (i.e., the output of oscillator 60 is relatively stable) and (2) $\omega_n$ is lower than the fluctuation rate (frequency) for the dominant source(s) of jitter (e.g., white frequency, flicker phase, white phase) on noisy clock source 52.

Conventional methods for estimating the instantaneous frequency drift (i.e., and resulting jitter) of oscillators also exist, but rather than being used to compensate for sampling uncertainty and jitter-related system impairments, these methods are conventionally used for the characterization of oscillator phase noise, for the coarse automatic frequency control/calibration of receivers, and/or for the demodulation of angle modulated (FM/PM) carriers. See Hewlett Packard Product Note 11729C-2, "Phase Noise Characterization of Microwave Oscillators: Frequency Discriminator Method", 1985; Lee, S. T., et al., "A Quad Band GSM GPRS Transmitter with Digital Auto Calibration", IEEE Journal on Solid-State Circuits, 2004; and Gheidi, H., et al., "An Ultra-Broadband Direct Demodulator for Microwave FM Receivers", IEEE Transactions on Microwave Theory and Techniques, 2011. These conventional methods include the conventional oversampling discriminator, similar to that described in Beards, D., "An Oversampling Delta-Sigma Frequency Discriminator", IEEE Transactions on Circuits and Systems II, 1994; and the conventional delay-line discriminator, similar to circuit 70 illustrated in FIG. 5A. Referring to conventional discriminator circuit 70, the output x of mixer 75 is equal to $$x = K_M \cdot \cos(2\pi \cdot (f_0 + \Delta f) \cdot t) \cdot \cos(2\pi \cdot (f_0 + \Delta f) \cdot (t - T))$$
$$= \frac{1}{2} K_M \cdot \cos(2\pi \cdot (f_0 + \Delta f) \cdot T) +$$
$$\frac{1}{2} K_M \cdot \cos(4\pi \cdot (f_0 + \Delta f) \cdot t - 2\pi \cdot (f_0 + \Delta f) \cdot T)$$

where: (1) $K_M$ is a constant that depends on the peak-to-peak output voltage of mixer 75; (2) input signal 71 has a nominal frequency equal to $f_0$; (3) the nominal frequency $f_0$ deviates (fluctuates) by an amount equal to $\Delta f$; and (4) delay element 72 has a delay equal to T. In essence, delay element 72 produces a frequency-dependent phase shift equal to $2\pi \cdot (f_0 + \Delta f) \cdot T$. Conventionally, delay element 72 is adjusted for a delay of $$T = \frac{1}{4} \cdot (2 \cdot k + 1) / f_0,$$

where k is an integer, such that the signals at the inputs of mixer 75 are in quadrature, and the corresponding variation in amplitude ($\Delta y$) at the output of lowpass filter 78 is equal to $$\Delta y = \pm K_M \cdot \sin(2\pi \cdot \Delta f \cdot T)$$
$$\approx \pm 2\pi \cdot K_M \cdot T \cdot \Delta f,$$

for $T \cdot \Delta f \ll 1$. Thus, the signal level $\Delta y$ at the output of discriminator 70 is periodic in frequency with period $1/T$; and is approximately proportional to the instantaneous frequency deviations $\Delta f$ with a constant of proportionality equal to $2\pi \cdot K_M \cdot T$. It should be noted that delay element 72 is typically made as long as practical (i.e., the integer k is made as large as practical) to increase the sensitivity of the conventional discriminator to small deviations (fluctuations) in frequency.

Conventional methods for estimating instantaneous frequency deviation operate on the principle of slope detection, a process in which frequency fluctuations (i.e., frequency modulation or FM) are converted to amplitude fluctuations (i.e., amplitude modulation or AM) that can be recovered using an envelope detector (i.e., circuitry 76 in FIG. 5A). For example, frequency responses (i.e., curves 79A&B) for a conventional delay-line discriminator are shown in FIG. 5B, where: (1) curve 79A is a plot of output magnitude versus frequency deviation for a conventional discriminator with delay T=1 microsecond; and (2) curve 79B is a plot of output magnitude versus frequency deviation for a conventional discriminator with delay T=1 nanosecond. As curves 79A&B illustrate, the discriminator has a linear response (i.e., constant slope) for a range of input frequency deviations. With proper tuning of the discriminator delay T, the linear region can be made to bound the intended dynamic range of operation, such that an input signal of constant amplitude produces an output signal whose amplitude (magnitude) is linearly dependent on input frequency deviation. A comparison of curves 79A&B illustrates that the linear region can be extended by reducing the discriminator delay T, at the expense of reducing the sensitivity (i.e., reducing the magnitude) of the discriminator output to small deviations in frequency. Operation of the discriminator at frequency deviations that lie outside of this linear region conventionally is avoided because: (1) nonlinearities (i.e., slope changes) in the output response can introduce harmonic distortion that degrades the accuracy of the conversion from frequency variation (deviation) to amplitude variation; and (2) the periodic response of the discriminator output creates an ambiguity region where the relationship between frequency variations and amplitude variations is not a one-to-one function. More specifically, a region of ambiguity occurs for input frequency deviations greater than $\Delta f = \frac{1}{2}T$.

Conventional apparatuses for estimating instantaneous frequency drift suffer from design limitations that make them inadequate and/or impractical for use in the correction of sampling uncertainty/jitter. These design limitations can result from a combination of: (1) the inability to resolve small frequency fluctuations due to the relative insensitivity of conventional delay-line discriminators (i.e., inability to resolve deviations where $\Delta f \ll 1/T$, such that $2\pi \cdot T \cdot \Delta f$ is approximately zero); (2) the inability to resolve large frequency fluctuations due to ambiguities resulting from the periodic response of conventional delay-line discriminators (i.e., deviations where $\Delta f > \frac{1}{2}T$, such that $2\pi \cdot T \cdot \Delta f$ is larger than $\pi$ radians); and/or (3) the inability to make accurate measurements due to the susceptibility of oversampled frequency discriminators to the errors introduced by sampling clock jitter (see Kwon, J., et al., "Impact of Sampling Clock Phase Noise on $\Sigma\Delta$ Frequency Discriminators", IEEE Transactions on Circuits and Systems II, 2007). The above limitations generally constrain the use of conventional discriminators to narrowband applications, such as the demodulation of FM signals and/or the measurement of low-frequency phase noise, and preclude their use in jitter detection and compensation applications, which require both wide bandwidth and high estimation sensitivity/accuracy. Although conventional methods for extending the usable range of delay-line discriminators exist, these methods typically rely on the integration of multi-tiered delay elements, and are impractical for many applications, including those targeting a small form factor. See Sullivan, T., "Gauging Limitations on DFD Performance", Microwave and RF Magazine, November 2005; and Thorton, M. J., "Frequency Discriminators for Broadband Applications", Proceedings of Automated RF & Microwave Measurement Society", 2011.

In addition to methods for estimating instantaneous frequency drift, conventional techniques for sample-rate conversion can be used to adjust/change the sampling rate and phase of discrete-time signals (i.e., in order to obtain a new discrete-time representation of an underlying continuous-time signal). Sample-rate conversion is a process that sometimes is referred to in the prior art as digital interpolation, or digital resampling, and is based on oversampling structures, such as Farrow interpolators, which fabricate new data samples from existing/known data samples using curve-fitting with polynomial functions (i.e., polynomial estimation). See Farrow, C. W., "A Continuously Variable Digital Delay Element", IEEE International Symposium on Circuits and Systems, 1988. Conventionally, these techniques are used to synchronize two or more oscillators in oversampled systems. See Gardner, Floyd M., "Interpolation in Digital Modems I—Fundamentals", IEEE Transactions on Communications, 1993; and Gardner, Floyd M., "Interpolation in Digital Modems II—Implementation and Performance", IEEE Transactions on Communications, 1993. Adapting these conventional structures for use in Nyquist-sampled systems, or for correcting the instantaneous frequency drift (i.e., and resultant jitter) of a local oscillator, however, has not been contemplated in the prior art.

FIG. 6A illustrates a conventional first-order polynomial estimator (i.e., interpolator 80A) that fabricates new data samples ($y_n$) from existing data samples ($x_n$) according to the linear function $$y_n = x_n \cdot (1+\Delta_n) - x_{n-1} \cdot \Delta_n,$$

which is realized using digital delay (i.e., register 83A), addition (i.e., adders 82A&B), and multiplication (i.e., multiplier 84A) operations. The parameter $\Delta_n$ is sometimes referred to as the curve-fit interpolant (i.e., an independent control variable that specifies the unit-interval offset between a current sample-time instant and a new sample-time instant). With respect to the above equation, more negative interpolant values (e.g., $\Delta_n \to -1$) advance the sample-time instant (i.e., shift sampling to an earlier point in time) and less negative interpolant values (e.g., $\Delta_n \to 0$) delay the sample-time instant (i.e., shift sampling to a later point in time). FIG. 6B illustrates a conventional second-order polynomial estimator (i.e., interpolator 80B) that, based on interpolant $\Delta_n$, fabricates new data samples ($y_n$) from existing data samples ($x_n$) according to the parabolic function $$y_n = x_n \cdot \left(\frac{1}{2}\Delta_n^2 + \frac{1}{2}\Delta_n\right) + x_{n-1} \cdot (1 - \Delta_n^2) + x_{n-2} \cdot \left(\frac{1}{2}\Delta_n^2 - \frac{1}{2}\Delta_n\right),$$

which also is realized using digital delay (i.e., registers 80B&C), addition (i.e., adders 82C-G), and multiplication (i.e., multipliers 84B&C) operations. For the above second-order function, negative interpolant values (e.g., $\Delta_n<0$) advance the sample-time instant (i.e., shift sampling to an earlier point in time) and positive interpolant values (e.g., $\Delta_n>0$) delay the sample-time instant (i.e., shift sampling to a later point in time).

For sufficient bandlimiting (i.e., or equivalently, sufficient oversampling), the relationship between a discrete value at one sample-time instant, and a discrete value at a different sample-time instant (i.e., resulting from a different sampling rate or phase), is well approximated over a sample-time interval by a polynomial function. Specifically, the accuracy of conventional polynomial estimation depends on the extent to which the sample-rate frequency ($f_S$) of a discrete-time signal exceeds the maximum frequency component ($f_N$) of that discrete-time signal. More specifically, the present inventor has determined that the approximate accuracy (i.e., relative error) of a parabolic (i.e., second-order polynomial) estimation improves according to the cube of the ratio $f_S/f_N$, such that for every factor of two increase in the ratio $f_S/f_N$, the accuracy ($\epsilon$) of the estimation improves by a factor of about 8, or $$\varepsilon \approx \frac{k}{(f_S/f_N)^3}.$$

However, the present inventor has discovered that at oversampling ratios of $f_S/f_N<8$, the accuracy of conventional polynomial estimation (interpolation) methods becomes severely degraded. Therefore, improved interpolation methods are required for high-speed conversion and signal processing applications, which preferably are Nyquist-sampled, and which preferably operate with high-accuracy at oversampling ratios as low as $f_S/f_N=2$ (i.e., no oversampling).

The performance of conventional analog-to-digital converters is significantly degraded by sampling jitter, particularly at high sampling rates. In addition, conventional methods for jitter attenuation and sample-rate conversion are only marginally suitable for use in correcting the instantaneous frequency drift (i.e., and resultant jitter) of a sampling clock source. For example, the conventional PLL-based methods for jitter attenuation require controlled oscillators with high stability, and as illustrated by the exemplary jitter transfer function in FIG. 4B, they are useful only for reducing the high-frequency jitter (i.e., short-term jitter) of a noise-corrupted clock source. More specifically, the present inventor has determined that conventional, PLL-based jitter attenuation methods have limited utility in converter applications due to disadvantages that include: (1) a tunable, high-precision oscillator generally cannot accommodate the wide range of conversion rates at which a converter typically needs to operate; (2) overall timing jitter is not reduced significantly because timing jitter tends to be dominated by low-frequency jitter, as illustrated in FIG. 2B (i.e., low-frequency jitter has higher power density than high-frequency jitter); and (3) the cost and complexity may be prohibitive because the high-precision resonators needed to implement the controlled clock source cannot be integrated onto silicon devices using conventional methods. In addition, conventional methods for frequency drift estimation and sample-rate conversion are not accurate or precise enough to support signal processing applications that require both wide bandwidth (e.g., Nyquist sampling) and high-accuracy. For these reasons, improved apparatuses and methods are needed for reducing the performance degradation caused by timing jitter, particularly in converter applications where high-frequency input signals are processed.

SUMMARY OF THE INVENTION

The present inventor has discovered improved apparatuses and approaches for reducing errors caused by sampling uncertainty/jitter in circuits that convert linear (analog) signals into discrete (digital) signals. These apparatuses and methods also have utility in other applications, including Nyquist-sampled signal processing where high-accuracy and wide bandwidths simultaneously are desired. Rather than just reducing sampling jitter at the clock source, apparatuses and methods according to the preferred embodiments of the present invention reduce the level of output noise introduced by sampling jitter, effectively making the converter circuits less sensitive to errors from sampling uncertainty. In particular, compared to conventional means, the jitter-mitigation approaches of the preferred embodiments of the present invention have at least four distinct advantages, namely: (1) the improved approaches are effective on signals with high-frequency content, because parallel processing enables effective operation at rates that are at or near the Nyquist limit; (2) the improved approaches are effective at mitigating performance degradation due to low-frequency jitter (e.g., drift and wander), as well as high-frequency jitter; (3) the improved approaches can detect and mitigate the errors introduced by jitter from both small and large deviations in sample-rate frequency; and (4) the improved approaches do not require high-stability clock sources (e.g., oscillators utilizing high-precision resonators) with outputs that tune over a wide frequency range, which are impractical in many applications, such as those relying on integrated-circuit fabrication.

Thus, one embodiment of the invention is directed to an apparatus for converting a continuous-time, continuously variable signal into a sampled and quantized signal. It includes an input line for accepting an input signal that is continuous in time and continuously variable, multiple processing branches coupled to the input line, and a set of one or more adders coupled to outputs of the plurality of processing branches. Each of the processing branches includes: (a) a sampling/quantization circuit; and (b) a digital bandpass interpolation filter having an input coupled to an output of the sampling/quantization circuit. The digital bandpass interpolation filter in at least one of the processing branches includes: (i) a quadrature downconverter; (ii) a first lowpass filter and a second lowpass filter; (iii) a first interpolator and a second interpolator, each having an input for inputting a variable interpolant value; and (iv) a quadrature upconverter. The digital bandpass interpolation filters in different ones of the processing branches perform a frequency decomposition function and have frequency responses that are centered at different frequencies. Input samples and output samples of such digital bandpass interpolation filter(s) are different discrete-time representations of an underlying continuous-time signal, with the output samples representing an altered sampling period relative to the input samples, and with the sampling period being altered by an amount that depends on the variable interpolant value. In groups of one or more, the bandpass interpolation filters preferably form resampling filter banks that perform both bandlimiting (e.g., bandpass filtering) and sample-rate conversion (e.g., digital resampling) operations.

Another embodiment is directed to an apparatus for converting a continuous-time, continuously variable signal into a sampled and quantized signal. The apparatus includes an input line for accepting an input signal that is continuous in time and continuously variable, a plurality of processing branches coupled to the input line, and a set of one or more adders coupled to outputs of the plurality of processing branches. Each of the processing branches includes: (a) an analog bandpass filter; (b) a sampling/quantization circuit coupled to an output of the analog bandpass filter; and (c) a digital bandlimiting circuit (e.g., a bandpass filter) coupled to an output of the sampling/quantization circuit. The digital bandlimiting circuits in different ones of the plurality of processing branches preferably perform a frequency decomposition function and have frequency response bandwidths that are centered at different frequencies. The analog bandpass filters in different ones of the plurality of processing branches, have frequency responses with bandwidths that are at least 25% greater than the bandwidths of the frequency responses produced by the digital bandlimiting circuits (e.g., bandpass filters) in their respective processing branches.

Another embodiment is directed to an apparatus for converting a continuous-time, continuously variable signal into a sampled and quantized signal. It includes an input line for accepting an input signal that is continuous in time and continuously variable, a plurality of processing branches coupled to the input line, and a set of one or more adders coupled to outputs of the plurality of processing branches. Each of the processing branches includes: (a) an analog bandpass filter; (b) a sampling/quantization circuit coupled to an output of the analog bandpass filter; and (c) a digital bandlimiting circuit coupled to an output of the sampling/quantization circuit. The digital bandlimiting circuits in different ones of the plurality of processing branches: (1) preferably perform a frequency decomposition function; (2) have frequency responses with bandwidths that are centered at different frequencies; and (3) have frequency responses with bandwidths that are at least three times smaller than the sampling rate of the sampling/quantization circuits in their respective processing branches.

Another embodiment is directed to an apparatus for fabricating new discrete-time data samples from existing discrete-time data samples. The apparatus includes: an input line for accepting an input signal; a plurality of processing branches coupled to the input line; and a set of one or more adders coupled to outputs of the processing branches. Each of the processing branches includes: (a) a branch input coupled to the input line and inputting input samples that are discrete in time and value; (b) a downconverter, having an input coupled to the branch input, that uses sine and cosine sequences to convert an intermediate-frequency input into complex-valued data samples represented by quadrature baseband and in-phase baseband outputs, (c) a first lowpass filter coupled to the quadrature baseband output of the downconverter; (d) a second lowpass filter coupled to the in-phase baseband output of the downconverter; (e) a first interpolator coupled to an output of the first lowpass filter, (f) a second interpolator coupled to an output of the second lowpass filter, and (g) a quadrature upconverter that uses sine and cosine sequences to convert complex-valued data samples represented by baseband outputs of the first and second interpolators into an intermediate-frequency output. Different ones of the processing branches operate at different intermediate frequencies, and a phase rotation, in an amount based on a variable interpolant value, is applied to complex-valued data samples originating from the downconverter. The input samples and output samples of at least one of the processing branches are different discrete-time representations of an underlying continuous-time signal, with the output samples representing an altered sampling period, as compared to the input samples, and with the sampling period being altered by an amount that depends on the variable interpolant value.

Another embodiment is directed to an apparatus for digitally processing a discrete-time signal, which includes: an input line for accepting an input signal that is discrete in time and value; a plurality of processing branches coupled to the input line, and a set of one or more adders coupled to outputs of the plurality of processing branches. Each of the processing branches includes: (a) a downconverter that uses sine and cosine sequences to convert a intermediate-frequency input into quadrature baseband and in-phase baseband outputs; (b) a first baseband processor coupled to the quadrature output of the downconverter; (c) a second baseband processor coupled to the in-phase output of the downconverter; and (d) a quadrature upconverter that uses sine and cosine sequences to convert the outputs of the first and second baseband processors into an intermediate-frequency output. Different ones of the plurality of processing branches operate at different intermediate frequencies, and each of the baseband processors includes at least one of: (i) a first moving-average filter coupled to an output of the quadrature downconverter; (ii) a downsampling circuit that subsamples the output of the first moving-average filter; (iii) an upsampling circuit that increases the sampling rate at the output of the downsampling circuit; and (iv) a second moving-average filter coupled to the output of the upsampling circuit. The bandpass responses of the processing branches combine to form an all-pass response that distorts the amplitude and phase of the input signal by less than 5%.

Another embodiment is directed to an apparatus for converting fluctuations in the oscillation period of an input signal to proportional fluctuations in the amplitude of an output signal, which includes: an input line for accepting an input signal having a nominal oscillation period but that exhibits variation in at least one of frequency or phase; a detector with a reference input coupled to the input line, a comparison input coupled to the input line, and an output; and an integrator coupled to the output of the detector. The signal at the output of the detector is proportional, in at least one of pulse width or amplitude, to the time or phase offset between the signal at its reference input and the signal at its comparison input. The signal at the comparison input of the detector is delayed in time from the signal at the reference input of the detector by an amount that is greater than zero and less than twice its nominal oscillation period. The integrator has a time constant of integration that is smaller than twice the delay applied to the signal at the comparison input of the detector.

Another embodiment is directed to an apparatus for accumulating the value of an input signal over time. The apparatus includes: (a) an input line for accepting an input signal that is continuous in time and continuously variable; (b) a signal combiner with a first input coupled to the input signal, a second input, and an output; (c) a signal distributor (splitter) with an input coupled to the output of the signal combiner and two outputs; and (d) a bandlimiting device with an input coupled to one output of the signal distributor (splitter) and an output coupled to the second input of the signal combiner. The bandlimiting device has a transfer function that produces a frequency response having group delay and insertion gain that: (i) are approximately constant over the intended usable frequency range of the apparatus; and (ii) approach zero at frequencies that exceed the intended usable frequency range of the apparatus. In the preferred variations, the apparatus has a time constant of integration that is equal, or at least approximately equal, to a mean value of the group delay of the bandlimiting device over a usable frequency range of the apparatus.

Another embodiment is directed to an apparatus for converting a continuous-time, continuously variable signal into a sampled and quantized signal. The apparatus includes: (a) an input line for accepting an input signal that is continuous in time and continuously variable; (b) a plurality of sampling/quantization circuits coupled to the input line; (c) a plurality of resampling filter banks coupled to the outputs of one or more sampling/quantization circuits; and (d) a set of one or more adders coupled to outputs of the plurality of resampling filter banks. In the preferred embodiments, each of the resampling filter banks includes: (i) a plurality of digital bandlimiting circuits which are coupled to the outputs of the plurality of sampling/quantization circuits; and (ii) a digital resampling circuit which is coupled to the outputs of one or more of the digital bandlimiting circuits via a set of one or more adders. The digital bandlimiting circuits associated with each of the resampling filter banks perform a frequency decomposition function, and different ones of the digital bandlimiting circuits have frequency responses that are centered at different frequencies. A circuit that includes the digital resampling circuits associated with the resampling filter banks (and which may also include, e.g., the digital bandlimiting circuits) performs a sample-rate conversion function that includes: (1) a digital interpolation operation in which new data samples are fabricated from existing data samples using polynomial estimation; and (2) a rate buffering operation which enables data samples to enter and exit the resampling filter bank at different data rates.

According to more specific aspects of any of the foregoing embodiments:

a. the apparatus also includes a sampling error estimator having an output coupled to at least one of the resampling filter banks and/or processing branches, and the output of the sampling error estimator has a value which is based on (e.g., proportional to) fluctuations in a nominal oscillation period of a signal provided to an input of the sampling error estimator, and where the output of the sampling error estimator is used by at least one of the resampling filter banks and/or processing branches to fabricate new data samples from existing data samples;

b. the apparatus also includes a second sampling error estimator coupled to a different one of the resampling filter banks and/or processing branches;

c. the apparatus also includes a lowpass prototype filter that replicates at the output of the sampling error estimator, a baseband equivalent of at least one of a delay or an amplitude response of at least one of the bandpass interpolation filters;

d. the apparatus also includes a means for correcting the gain and DC offsets of the sampling error estimator by minimizing at least one of a mean absolute value or a variance of a residual quantization noise at the output of at least one of the processing branches;

e. the resampling filter banks and/or processing branches include a resampling data buffer coupled to a least one of the bandpass interpolation filters and/or bandlimiting circuits, and the resampling data buffer receives data samples at a first time interval that is different from the second time interval at which the resampling data buffer delivers data samples;

f. rates at which the sampling/quantization circuits operate are greater than an overall output data rate of the apparatus, and the digital bandpass interpolation filters and associated resampling data buffers, and/or digital resampling circuits, reduce the rates to the overall output data rate of the apparatus;

g. the apparatus has at least 4 times as many processing branches as resampling data buffers and/or digital resampling circuits;

h. the apparatus also includes a rotation matrix multiplier coupled to an output of one of: (i) the quadrature downconverter, (ii) the first and second lowpass filter, or (iii) the first and second interpolator, and the rotation matrix multiplier applies a phase rotation to complex-valued data samples that is based on (e.g., proportional to) the variable interpolant value;

i. the apparatus generates a variable interpolant value using an accumulator;

j. the apparatus generates a variable interpolant value using an integrator;

k. the apparatus has a total of M processing branches, where M is at least 8;

l. each of the processing branches also includes an analog bandpass filter;

m. at least one of the resampling filter banks and/or processing branches perform an interpolation operation that is based on a second-order function;

n. at least one of the resampling filter banks and/or processing branches perform an interpolation operation that is based on a first-order function;

o. the digital bandpass interpolation filter in each of a plurality of the processing branches introduces total distortion power which is at least 40 dB below a level of a signal at the output of the digital bandpass interpolation filter;

p. the apparatus utilizes sine and cosine sequences for quadrature downconversion and quadrature upconversion in at least one of the processing branches that are generated using a direct digital synthesis method that comprises digital accumulators and phase lookup tables;

q. the apparatus utilizes sine and cosine sequences for quadrature downconversion and quadrature upconversion in at least one of the processing branches that are generated using recursive operations;

r. at least one of the sine and cosine sequences utilized for quadrature downconversion and quadrature upconversion is adjustable in at least one of amplitude or phase;

s. the variable interpolant value determines adjustment of the phase of the sine and cosine sequences utilized for at least one of quadrature downconversion or quadrature upconversion;

t. the digital bandlimiting circuit and/or bandpass interpolation filter in at least one of the processing branches incorporates an equalizer, disposed between the input of the quadrature downconverter and the output of the quadrature upconverter, having at least one complex tap;

u. the equalizer has plural complex taps;

v. the plurality of processing branches operate on frequency bands that are spaced at equal frequency intervals as determined by the frequency responses of the digital bandlimiting circuits and/or bandpass interpolation filters;

w. the plurality of processing branches operate on frequency bands that are spaced at non-equal frequency intervals as determined by the frequency responses of the digital bandlimiting circuits and/or bandpass interpolation filters;

x. the apparatus also includes a digital interpolator coupled to the output of the downsampling circuit in each of the baseband processors of the plurality of processing branches, such that the input samples and the output samples of at least one of the digital interpolators are different discrete-time representations of an underlying continuous-time signal according to the value of a variable interpolant, and the apparatus includes a means for applying a phase rotation to complex-valued data samples that depends on the value of the variable interpolant;

y. the analog bandpass filters in different ones of the plurality of processing branches have bandwidths that are at least 25% greater than the bandwidths of the frequency responses produced by the digital bandlimiting circuits and/or bandpass interpolation filters in their respective processing branches;

z. the analog bandpass filters are grouped into at least one of: (i) a diplexer, (ii) a triplexer, or (iii) a quadraplexer;

aa. the digital bandlimiting circuit in at least one of the processing branches incorporates: (i) a quadrature downconverter, (ii) a first and second lowpass filter, and (iii) a quadrature upconverter;

bb. the digital bandlimiting circuits and/or bandpass interpolation filters include at least one lowpass filter that incorporates a recursive moving-average operation;

cc. the downsampling and upsampling factors of the baseband processors are equal to one and the transfer function of the second moving-average filter is equal to unity;

dd. the apparatus incorporates a detector, with a reference input and comparison input, that quantifies the difference in duration between two adjacent clock periods of an input signal by producing an output, which in a least one of pulse width or amplitude, is proportional to that difference;

ee. the input signal is coupled to the reference input, the comparison input, or both inputs of the detector using a frequency counter/divider;

ff. the apparatus converts fluctuations in the oscillation period of an input signal to proportional fluctuations in the amplitude of an output signal using processing which incorporates at least one of discrete-time integration and/or continuous-time integration;

gg. the bandlimiting device associated with the continuous-time integrator includes at least one of a lowpass filter and/or a delay element;

hh. at least one of the first lowpass filter and the second low pass filter in at least one of the processing branches incorporates a recursive moving-average operation;

ii. the input signal is continuous in time and value, and the processing branches are coupled to the input line via at least one sampling/quantization circuit;

jj. the input signal is continuous in time and value, and the processing branches are coupled to the input line via at least one sampling/quantization circuit and at least one analog bandpass filter.

In certain variations of the foregoing embodiments, the digital bandlimiting circuits are digital bandpass filters that perform only a frequency decomposition function, and the digital resampling circuit is implemented as a standalone resampling interpolator that performs both polynomial estimation and rate buffering. In an alternate variation, the digital bandlimiting circuits are bandpass interpolation filters that perform both frequency decomposition and polynomial estimation, and the digital resampling circuit performs rate buffering. In different variations of the embodiments, therefore, the sample-rate conversion operation is implemented as a distinct element (i.e., a standalone resampling interpolator), or as a distributed element (i.e., the combination of a bandpass interpolation filter and a rate buffer). In both variations, however, one or more bandpass filter responses are combined with a resampling circuit to form resampling filter banks that preferably perform both bandlimiting and sample-rate conversion, such that the rate at which at least one of the sampling/quantization circuits operates is different than an overall output data rate (i.e., conversion rate) of the apparatus.

Preferably, the digital bandlimiting circuit performs a frequency decomposition function, such that: (1) the bandwidth of a digital filter response determines the portion (i.e., sub-band) of the input signal spectrum that is converted by the associated processing branch; and (2) the bandwidth of each digital filter response is selected to produce minimal spectral overlap with the digital filter responses of the other processing branches. Unlike conventional HFB frequency-interleaving converters, the bandwidth of each analog bandpass filter preferably spans multiple converter sub-bands (or at least significantly more than one sub-band), with the bandwidth of each analog filter preferably being intentionally selected to produce appreciable spectral overlap with the analog bandpass filters of the processing branches for adjacent frequency bands. As such, the analog bandpass filters do not perform a conventional frequency decomposition function. Compared to conventional converters, the foregoing converter generally can use standard analog filter responses to reduce the amount of output noise that is introduced by sample-time uncertainty (jitter), particularly for narrowband input signals having high-frequency content.

Various embodiments of the foregoing structures can permit decoupling of the sample-rate clock source from the conversion-rate clock source. Decoupling the sample-rate and conversion-rate clock sources enables a wide range of conversion rates to be supported using: (1) a high-precision, fixed-frequency clock source for sampling; or (2) a sample-rate clock source with an output frequency that is tunable over a limited range. A sample-rate conversion operation in the digital domain (i.e., a digital resampling operation) converts an input signal, which has been sampled at a rate preferably determined by a precision clock source (i.e., the sample-rate frequency of the converter), to an output signal that has been sampled at a rate preferably determined by an independent data clock source (i.e., the conversion-rate frequency of the converter). Resampling in the digital domain allows the conversion-rate frequency of the converter to be different than the sample-rate frequency of the converter.

Additional variations on the foregoing embodiment include a means for correcting errors caused by sampling uncertainty/jitter. The preferred apparatus includes a sampling error estimator having an output coupled to at least one of the resampling filter banks. The sampling error estimator preferably outputs a control signal that: (1) tracks the time-period fluctuations at the output of a sample-rate clock source, and (2) provides the resampling filter bank with information needed to resample the output of the sampling/quantization circuit in a manner that corrects for errors due to unintended variation in the sample-rate frequency (i.e., sampling uncertainty). More preferably, the output of the sampling error estimator is a function of (e.g., proportional to) a difference between the sampling intervals at which at least one of the sampling/quantization circuits operates and the desired sampling intervals.

The foregoing embodiments preferably incorporate unique and novel apparatuses for bandlimiting, sample-rate conversion, and sampling jitter estimation which have utility as standalone circuits, or as companion circuits in applications other than jitter-tolerant data conversion. These apparatuses include: (1) low-complexity filter banks which perform signal analysis (i.e., bandlimiting) at baseband using lowpass filter structures that have a reduced multiplier count compared to conventional approaches; (2) Nyquist-sampled interpolators which use parallel processing, instead of conventional oversampling, to increase the accuracy of polynomial estimations; and (3) time-interval discriminators which convert time-period fluctuations (i.e., those produced by frequency drift/modulation) to magnitude fluctuations (i.e., amplitude modulation) with improved sensitivity compared to conventional schemes. In addition to low jitter conversion, these improved apparatuses can benefit a wide range of other applications, including: (1) echo cancellation in voice transmission; (2) adaptive equalization in data transmission; (3) companding and decompanding in audio processing; and (4) spectral channelization in multi-user systems.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

FIG. 16 is a simplified block diagram of a representative embodiment of the present invention that incorporates both analog bandpass filtering and sample-rate conversion to mitigate errors due to sampling uncertainty.

DESCRIPTION OF THE PREFERRED EMBODIMENT(S)

Figure 1:
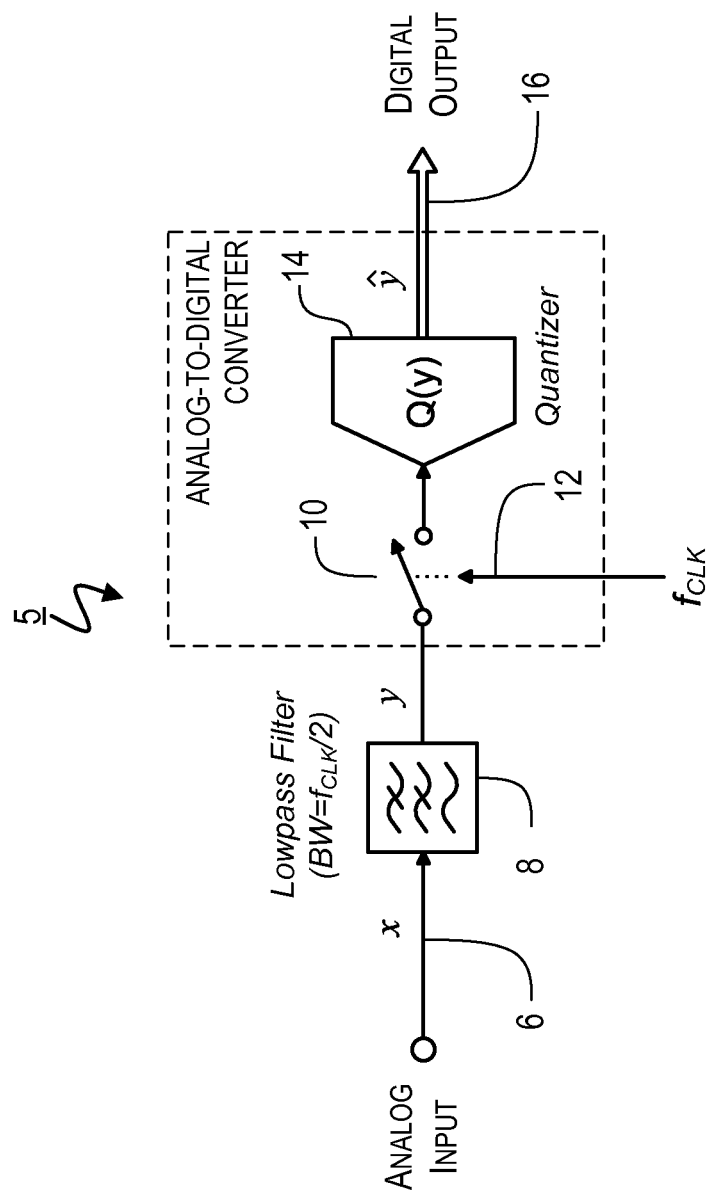
FIG. 1 is a block diagram of a conventional circuit that converts a continuous-time, continuously variable input signal into a discrete-time, discretely variable signal using a lowpass (anti-aliasing) filter, a sampler, and a quantizer.
Figure 2A:
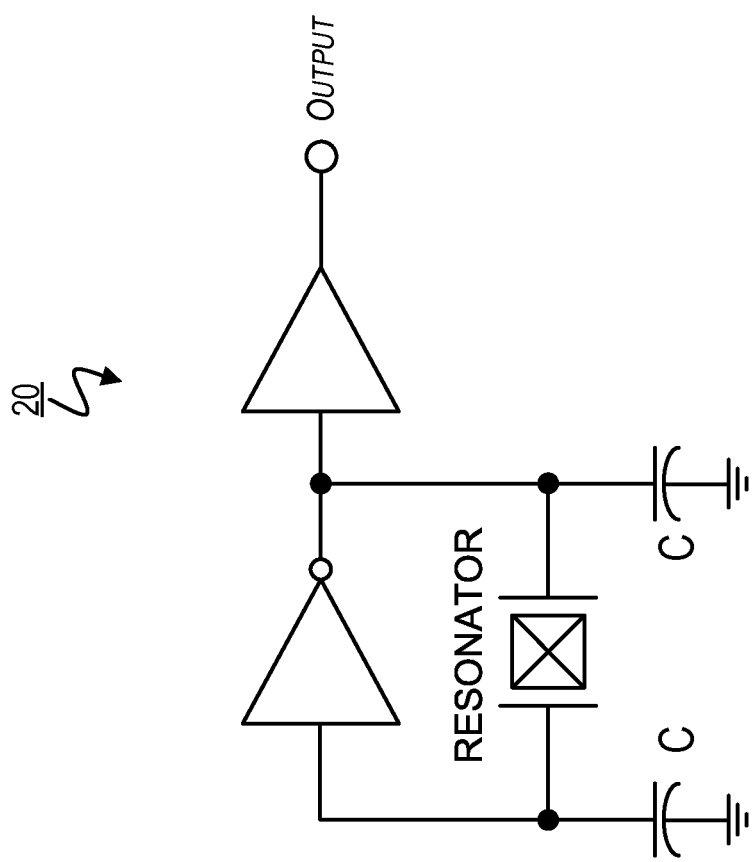
FIG. 2A is a block diagram of an exemplary, conventional oscillator that incorporates a network which resonates at a particular frequency.
Figure 2B:
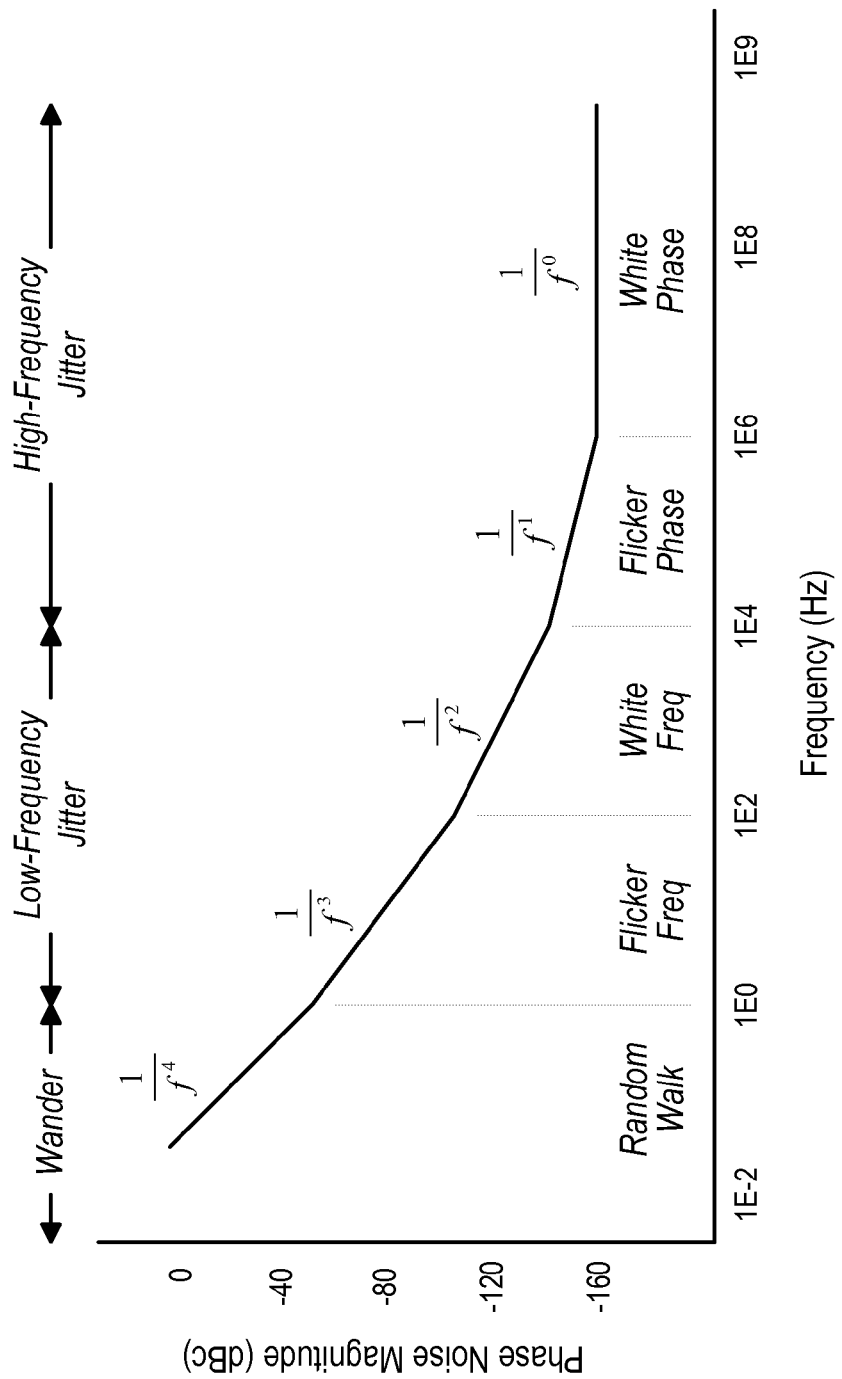
FIG. 2B is a diagram illustrating the output jitter profile of a conventional oscillator with respect to jitter magnitude in dBc (y-axis) versus jitter fluctuation rate in hertz (x-axis).
Figure 3A:
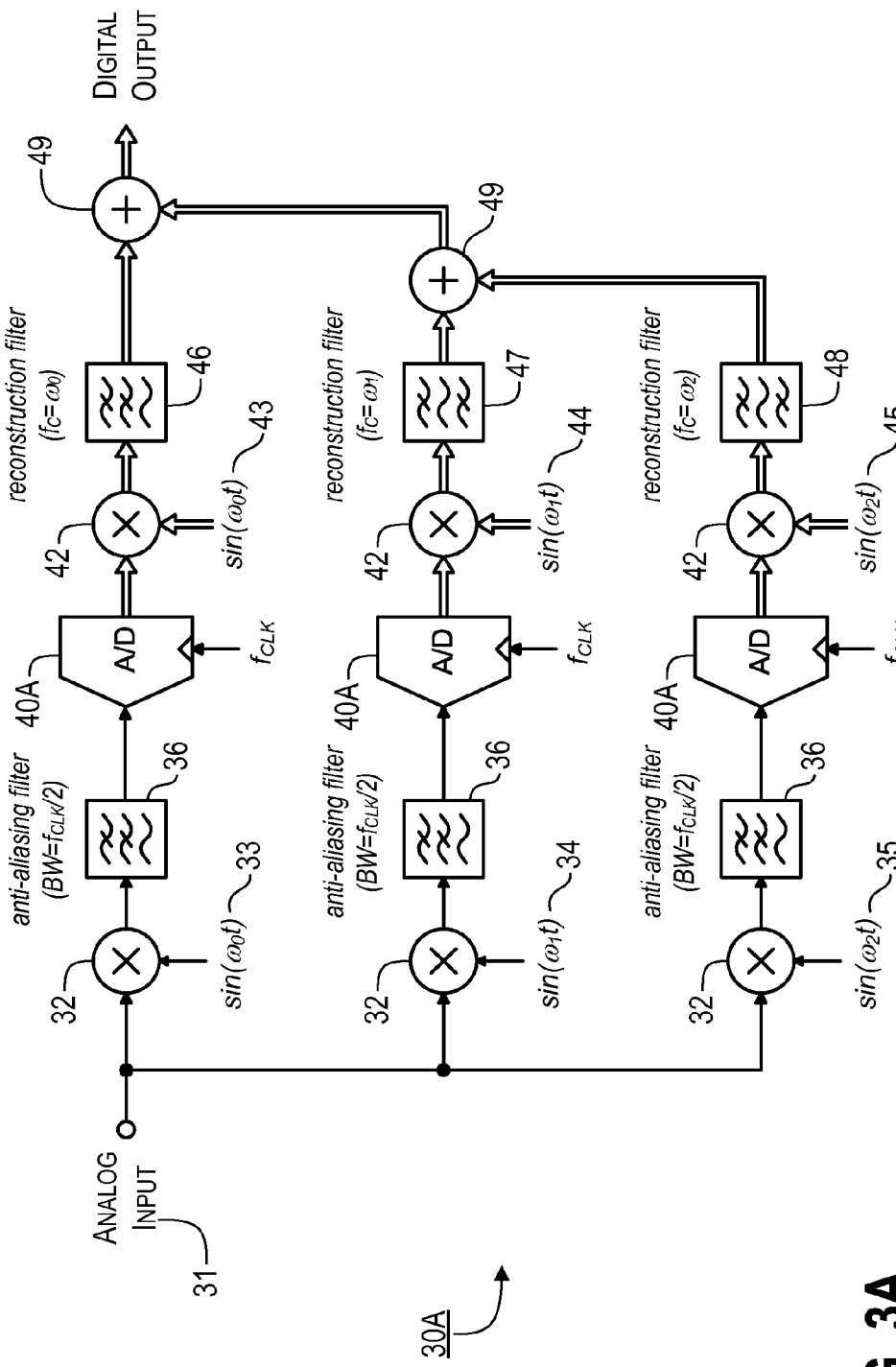
FIG. 3A is a block diagram of a conventional frequency-interleaving converter that is sometimes referred to as a frequency-translating hybrid (FTH) converter.
Figure 3B:
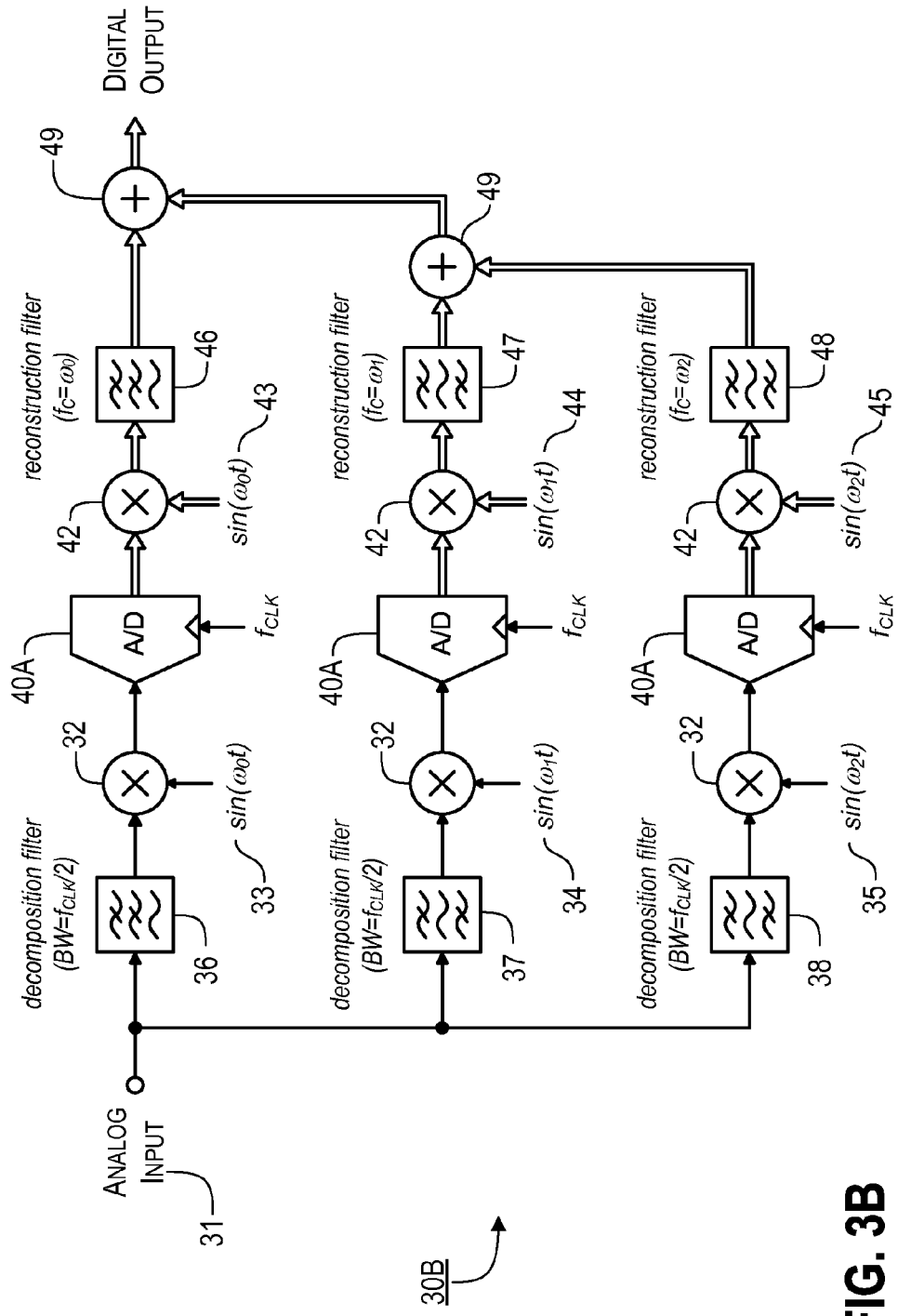
FIG. 3B is a block diagram of a conventional frequency-interleaving converter that is sometimes referred to as a hybrid filter bank (HFB) converter.
Figure 3C:
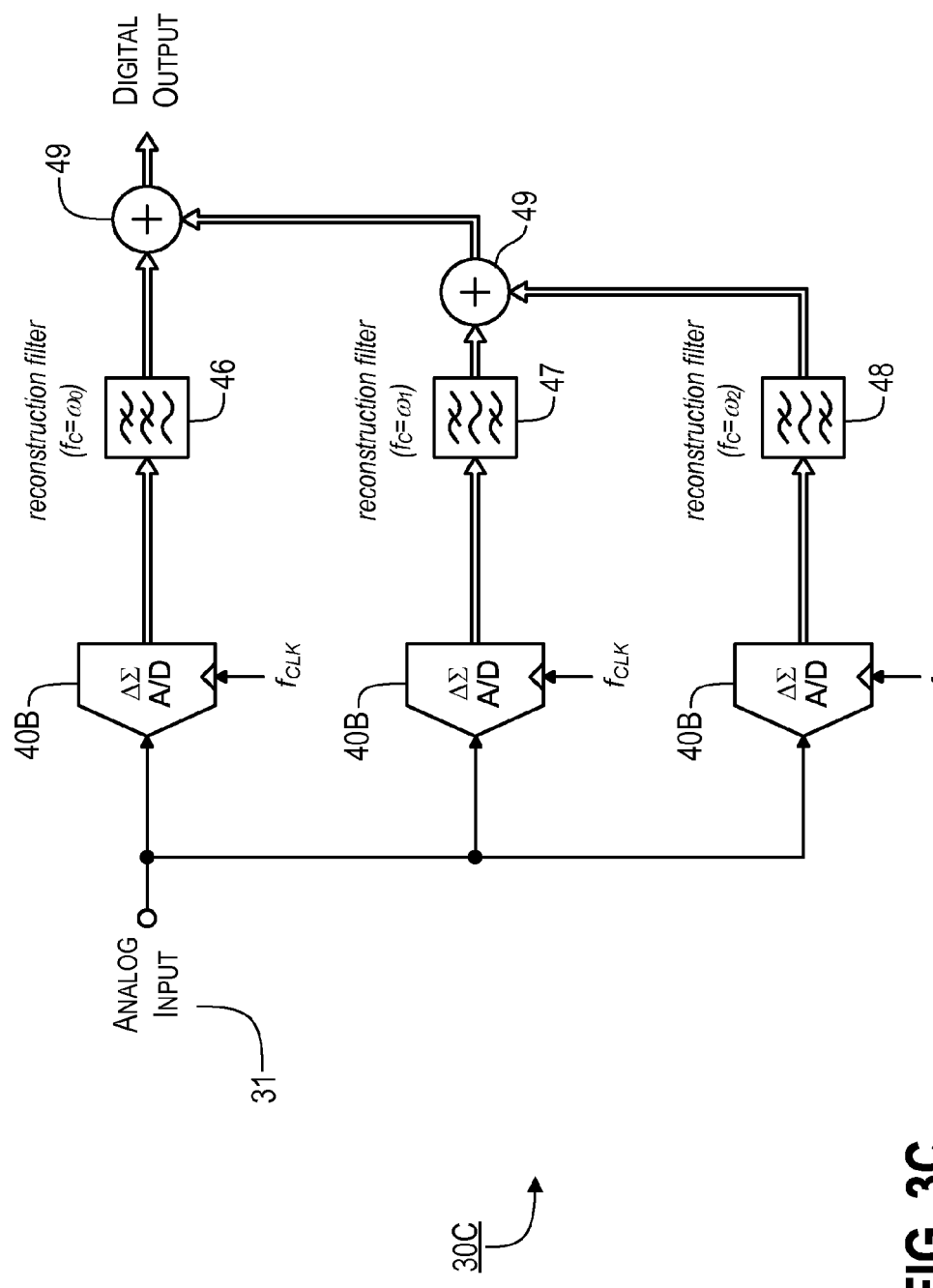
FIG. 3C is a block diagram of a conventional frequency-interleaving converter that is sometimes referred to as a multiband delta-sigma (MBΔΣ) converter.
Figure 4A:
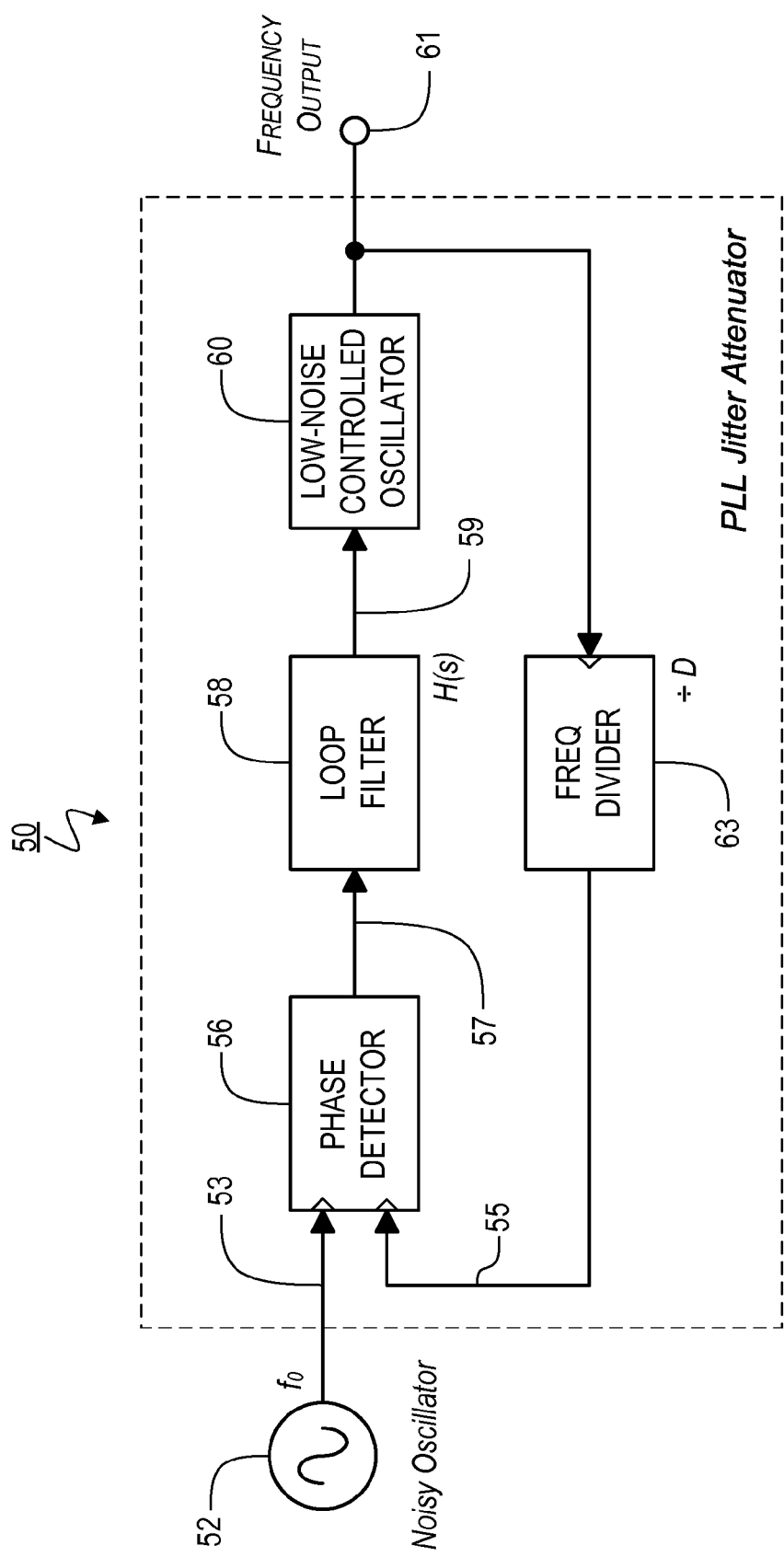
FIG. 4A is a block diagram of a conventional jitter attenuator circuit that incorporates a phase-lock loop having a phase detector, a loop filter, a controlled oscillator, and a frequency divider.
Figure 4B:
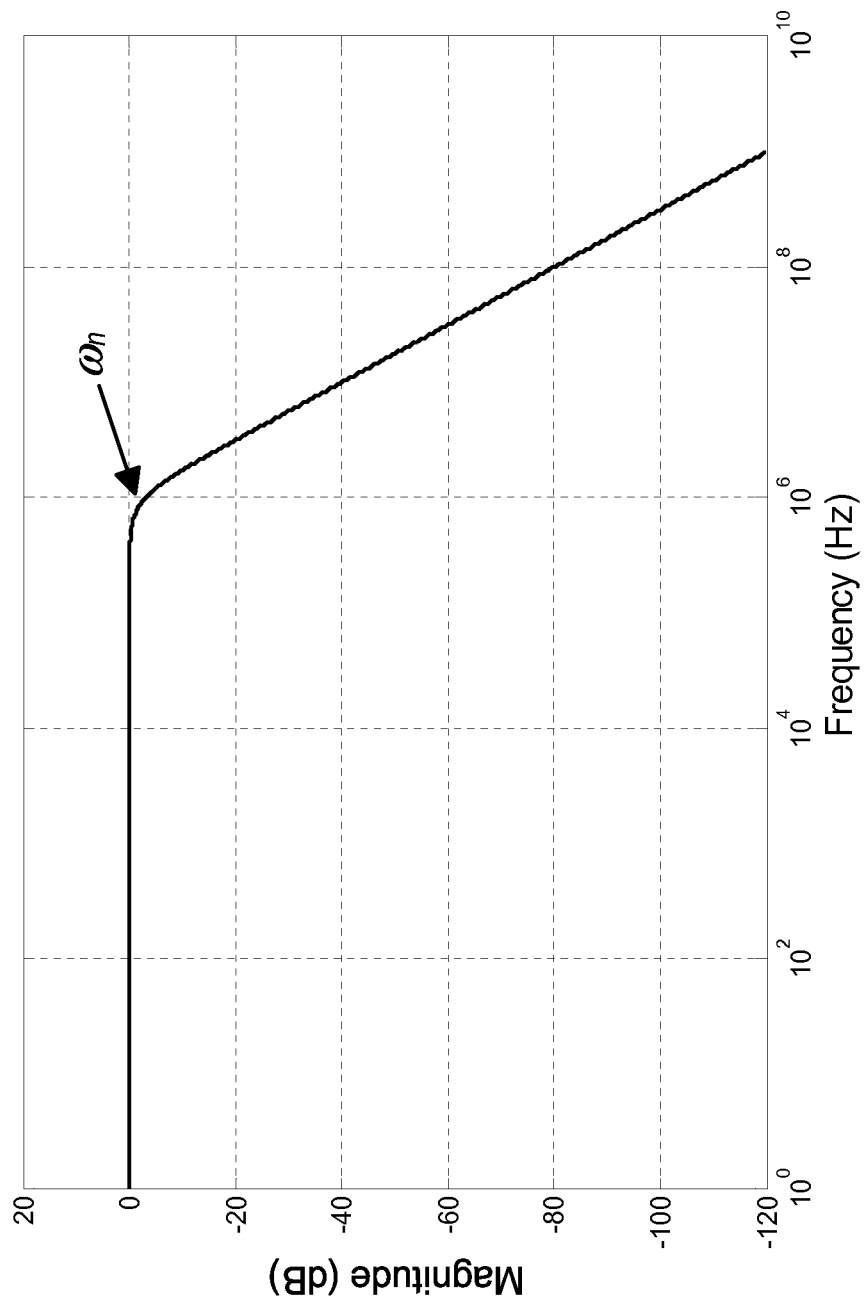
FIG. 4B is a plot of the jitter transfer function of a conventional jitter attenuator circuit with respect to jitter attenuation in dB (y-axis) versus jitter fluctuation rate in hertz (x-axis).

The present disclosure is related in part to the disclosures set forth in U.S. Provisional Patent Application Ser. No. 61/501,284 (the '284 Application), filed on Jun. 27, 2011; U.S. Provisional Patent Application Ser. No. 61/439,733, filed on Feb. 4, 2011; U.S. patent application Ser. No. 12/985,238, filed on May 1, 2011; and U.S. patent application Ser. No. 12/824,171, filed on Jun. 26, 2010, all by the present inventor, and all titled "Sampling/Quantization Converters". The foregoing applications are incorporated by reference herein as though set forth herein in full.

A preferred converter, which according to the present invention incorporates methods for reducing conversion errors caused by sampling uncertainty/jitter, sometimes is referred to herein as being jitter-tolerant. A jitter-tolerant converter, according the preferred embodiments of the present invention, employs parallel processing with frequency-decomposition (i.e., slicing), and therefore shares some structural similarities with conventional frequency-interleaving converters, such as the FTH, HFB, and MBΔΣ converters described above. However, a jitter-tolerant converter according to the preferred embodiments of the present invention incorporates one or more distinct technological innovations to provide implementation and/or performance advantages compared to conventional approaches, such as: (1) conversion errors due to sampling uncertainty are reduced because the converter input signal is bandlimited by analog (i.e., continuous-time) filters prior to sampling and quantization (e.g., as compared to MBΔΣ); (2) the complexity of the analog input filters is reduced because the bandwidth of the filters is appreciably wider than the portion of the input signal spectrum that is converted by the associated processing branch (e.g., as compared to FTH and HFB); (3) conversion accuracy is relatively insensitive to the analog input filter responses because the passbands associated with the analog input filters of the various processing branches can be set to overlap significantly and arbitrarily (e.g., as compared to FTH and HFB), allowing use of analog filters with standard frequency responses (e.g., Butterworth, Chebychev, Bessel or elliptic); (4) high-precision, fixed-frequency sample clock sources can be employed because resampling in the digital domain (i.e., sample-rate conversion) allows the conversion-rate frequency (i.e., the output data rate) of the converter to be independent of the sample-rate frequency of the converter (e.g., as compared to FTH, HFB, and MBΔΣ); and (5) higher levels of sampling uncertainty can be tolerated because errors introduced by sampling uncertainty are corrected by resampling in the digital domain (e.g., as compared to FTH, HFB, and MBΔΣ). At least some of such approaches can in some respects be thought of as using a unique and novel combination of several improvements over conventional techniques—frequency-interleaving, digital resampling (i.e., sample-rate conversion), and bandpass filtering. As discussed in more detail below, the use of such approaches often can overcome the problems associated with sampling uncertainty in converters that process high-frequency input signals.

Figure 7:
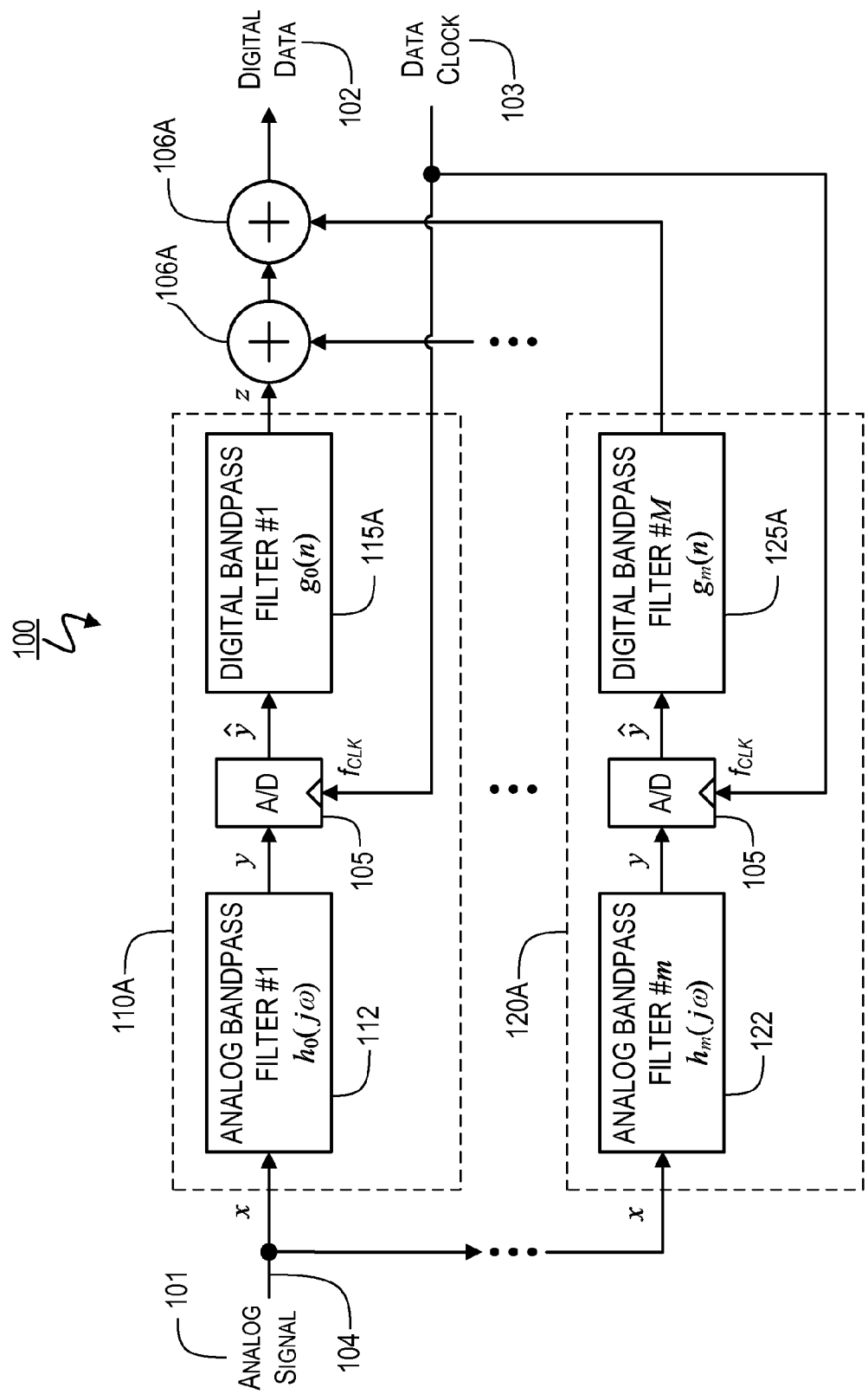
FIG. 7 is a simplified block diagram of a converter according to one representative embodiment of the present invention that incorporates analog bandpass filters to reduce the amount of output noise introduced by sampling uncertainty (jitter).
Figure 8A:
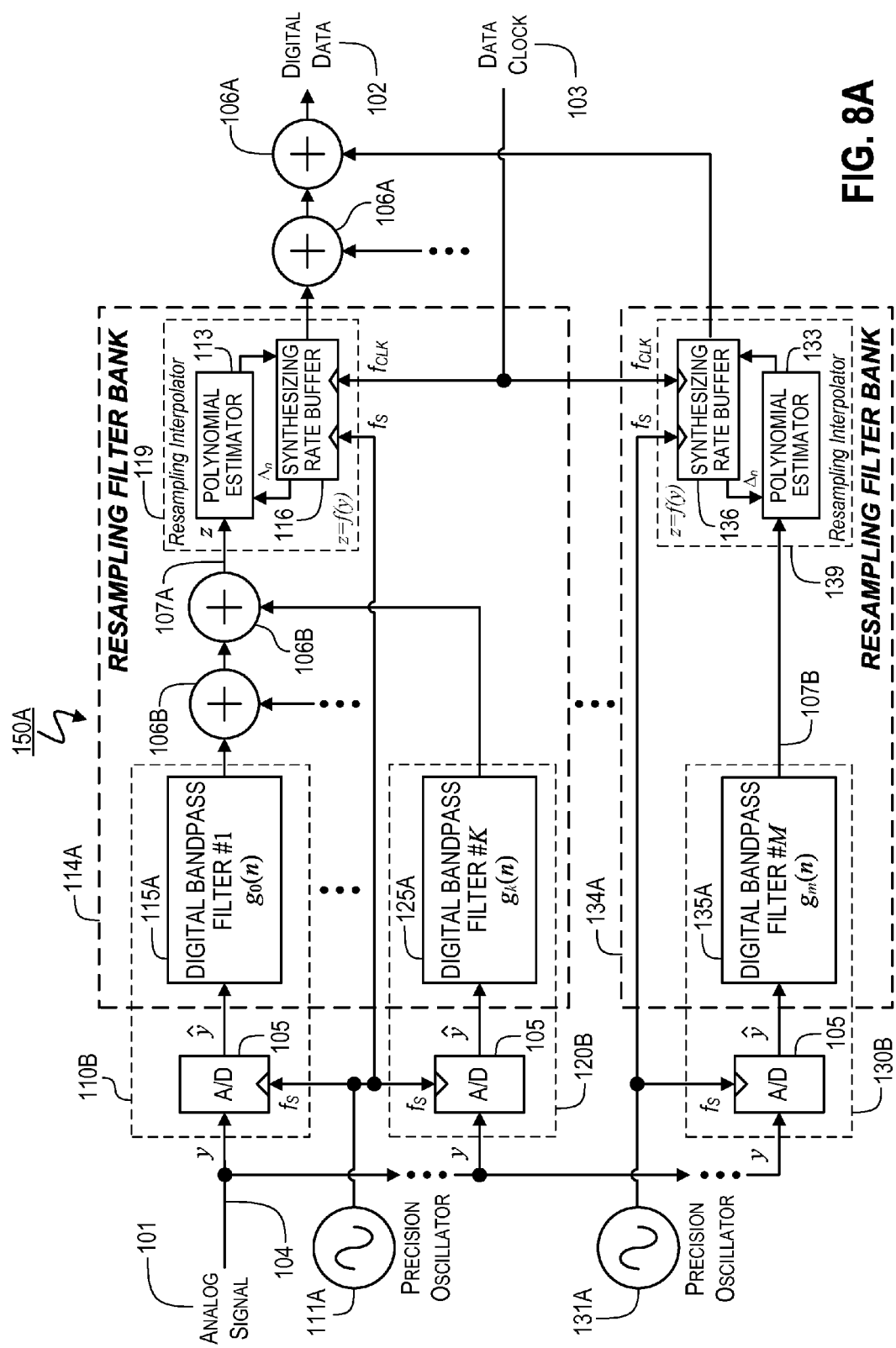
FIG. 8A is a simplified block diagram of a converter according to a second representative embodiment of the present invention that operates over a wide range of conversion rates using: (a) high-precision, fixed-frequency sampling clocks; and (b) resampling filter banks that perform sample-rate conversion with polynomial estimators and synthesizing rate buffers.
Figure 8B:
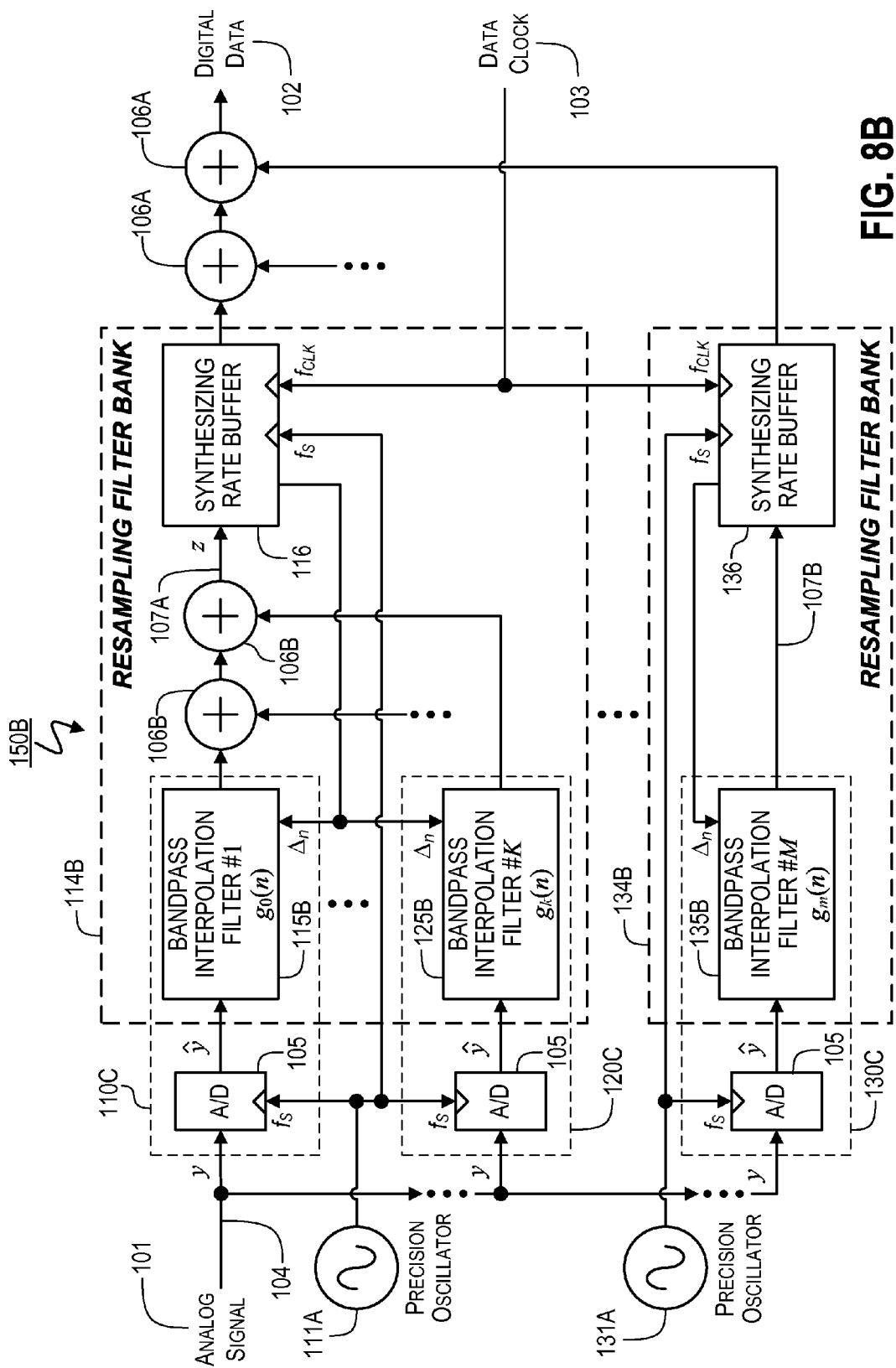
FIG. 8B is a simplified block diagram of a converter according to an alternate embodiment of the present invention that operates over a wide range of conversion rates using: (a) high-precision, fixed-frequency sampling clocks; and (b) resampling filter banks that perform sample-rate conversion with bandpass interpolation filters and synthesizing rate buffers.
Figure 9A:
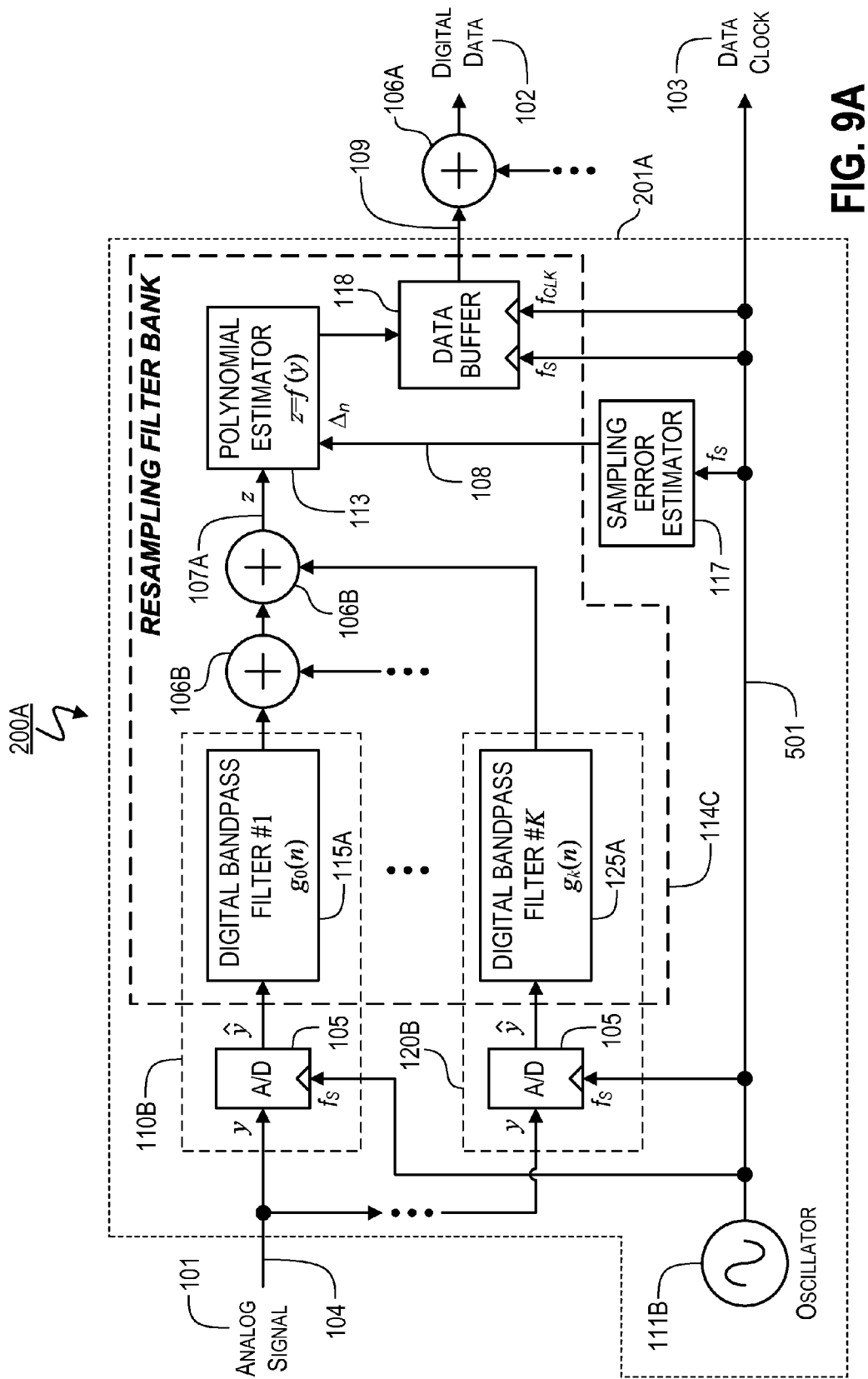
FIG. 9A is a simplified block diagram of a converter according to a third representative embodiment of the present invention that corrects for sampling errors using: (a) a sampling error estimator; and (b) sample-rate conversion by means of polynomial estimators and data buffers.
Figure 9B:
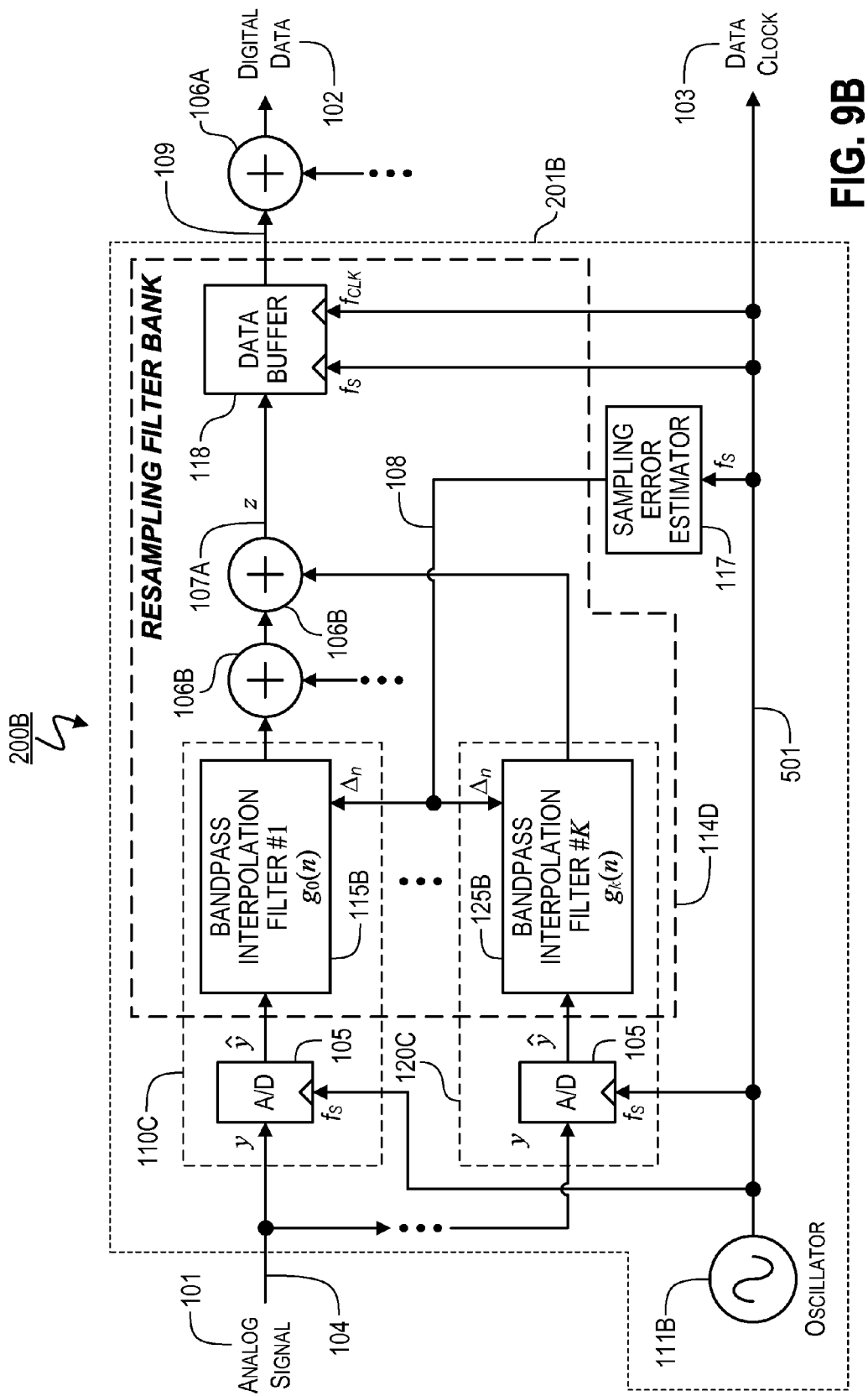
FIG. 9B is a simplified block diagram of a converter according to a fourth representative embodiment of the present invention that corrects for sampling errors using: (a) a sampling error estimator; and (b) sample-rate conversion by means of bandpass interpolation filters and data buffers.

Simplified block diagrams of converters 100, 150A&B, and 200A&B according to certain preferred embodiments of the present invention are illustrated in FIGS. 7-9, respectively. In the preferred embodiments, converters 100, 150A&B, and 200A&B separately process M different frequency bands for continuous-time, continuously variable signal 101, using a separate branch (e.g., branches 110A-C, 120A-C, or 130A-C) to process each such band, and then combine some or all of the branch outputs within a set of adders (e.g., first-stage adders 106B or second-stage adders 106A) and/or a set of resampling circuits (e.g., polynomial estimator 113, synthesizing rate buffer 116, data buffer 118, or resampling interpolator 119), in the course of providing the output digital signal 102. More specifically, the signal 101 is input on a line 104 that could be implemented, e.g., as a physical port for accepting an external signal or as an internal wire, conductive trace or a similar conductive path for receiving a signal from another circuit within the same device. In the present embodiment, the input signal 101 is provided directly to each of the branches (e.g., branches 110A-C, 120A-C and 130A-C). However, in alternate embodiments the input line 104 can be coupled to such branches in any other manner. As used herein, the term "coupled", or any other form of the word, is intended to mean either directly connected or connected through one or more other processing blocks, e.g., for the purpose of preprocessing. It should also be noted that any number of branches may be used.

In any event, in the present embodiments each such branch (e.g., branch 110A-C, 120A-C, or 130A-C) primarily processes a different frequency band, and includes: (1) a sampling/quantization circuit (e.g., circuit 105); and (2) a digital bandlimiting circuit as a distinct filtering element (e.g., digital bandpass filter 115A, 125A and 135A) or as a composite filtering element (e.g., bandpass interpolation filter 115B, 125B and 135B). In addition, each of converters 100, 150A&B, and 200A&B also includes at least one of: (a) an analog input (bandpass) filter; (b) a digital resampling circuit; and (c) a sampling error estimator. In embodiments that include analog input filters, each of the sampling/quantization circuits preferably samples its input signal at a rate which is 4 to 5 times greater than the bandwidth of the analog bandpass filter in the respective processing branch (i.e., the input signal is oversampled relative to the Nyquist limit for the bandwidth of the analog filter). In embodiments that group digital resampling circuits with processing branches that contain a digital bandpass filter as a distinct element (e.g., exemplary converter 150A or 200A), the resampling circuit preferably performs a sample-rate conversion operation which includes: (i) polynomial estimation (e.g., within polynomial estimator 113 and 133), where new data samples are fabricated from existing data samples via interpolation; and (ii) rate buffering (e.g., within synthesizing rate buffer 116 and 136, or within data buffer 118), where data samples are received at one (clock) rate and delivered at a potentially different (clock) rate. Such a digital resampling circuit, that incorporates both interpolation and rate buffering functions, sometimes is referred to herein as a resampling interpolator (e.g., circuits 119 or 139). A rate buffer that generates (i.e., synthesizes) a curve-fit interpolant for polynomial estimation (interpolation) sometimes is referred to herein as a synthesizing rate buffer, while a rate buffer that does not synthesize a curve-fit interpolant sometimes is referred to herein as simply a data buffer or latch. In embodiments that combine digital resampling circuits with processing branches that contain a bandpass interpolation filter (e.g., exemplary converter 150B or 200B), the bandpass interpolation filter provides a composite bandlimiting and polynomial estimation (i.e., interpolation) function, while the resampling circuit preferably performs the rate buffering operation. Accordingly, in certain preferred embodiments (e.g., exemplary converters 150A or 200A), sample-rate conversion is performed within a standalone resampling circuit that integrates polynomial estimation (interpolation) and rate buffering functions; while in alternate preferred embodiments (e.g., exemplary converters 150B or 200B), sample-rate conversion is performed by distributing polynomial estimation (interpolation) and rate buffering functions between a plurality of bandpass interpolation filters and a resampling circuit.

In the preferred embodiments, a digital bandlimiting circuit, as a distinct filtering element (e.g., digital bandpass filter 115A or 125A) or as a composite filtering element (e.g., bandpass interpolator filter 115B, 125B or 135B), performs a frequency decomposition function, such that the center frequency and bandwidth of each digital filtering element determines the portion of the input signal spectrum (i.e., sub-band) which is converted by its associated processing branch (e.g., branch 110A-C, 120A-C or 130A-C). Preferably, the frequency decomposition function (i.e., conventionally referred to as signal analysis) does not occur within analog input filters because the transfer functions required for signal analysis are difficult or impractical to realize in the analog domain, especially at high frequencies. Therefore, the center frequency of the digital filtering element preferably is aligned with the center of the sub-band to be captured by the respective processing branch. Preferably, the passband of each digital filtering element does not significantly overlap with the passband of any of the other digital filtering elements. More preferably: (1) the center frequency of each digital filtering element is equal to the center frequency of the desired sub-band; and (2) the passbands of the various digital filtering elements overlap in a precisely minimal manner to form, what is referred to in the prior art as, a near-perfect, signal-reconstruction filter bank.

In the preferred embodiments of the present invention, the digital bandlimiting circuits (i.e., as distinct filtering elements or composite filtering elements) form a near-perfect, signal-reconstruction filter bank so that, in addition to performing a frequency decomposition (i.e., signal analysis) function, the digital filtering elements perform a signal reconstruction (i.e., signal synthesis) function that introduces negligible amplitude and group delay distortion at the converter output. Specifically, minimum amplitude and group delay distortion occurs when the overall digital filter bank response is all-pass. The overall response of the digital filter bank is all-pass when, for $g_k(n)$ being the impulse response of the digital filtering element in the $k^{th}$ processing branch, $$\sum_{k=0}^{M-1} g_k(n) = a \cdot z^{-b},$$

where a and b are constants, such that $$\sum_{k=0}^{M-1} |g_k(n)|^2 = \sum_{k=0}^{M-1} |g_k(e^{j\omega})|^2 \approx a^2$$

over the converter passband. Furthermore, the bandwidths of the digital filtering elements (i.e., digital reconstruction filters) in all of the processing branches are equal in the preferred embodiments, such that the converter sub-bands are uniformly spaced across the Nyquist bandwidth $\Omega_B$ of the whole converter (i.e., $$\Omega_B = \frac{1}{2} \cdot f_S,$$

where $f_s$ is the converter sample frequency). Therefore, for a signal-reconstruction filter bank comprised of M filters, each digital filtering element preferably has a noise bandwidth of $$B_N = \frac{1}{2\pi} \int_{-\infty}^{+\infty} |g_k(e^{j\omega})|^2 d\omega \approx \frac{\Omega_B}{N \cdot M},$$

where N is the excess-rate oversampling ratio of the converter given by $$N = \frac{1}{2} \cdot f_S / \Omega_B.$$

However, in alternate embodiments the converter sub-bands are non-uniformly spaced, and the noise bandwidths of the digital reconstruction filters in each of the processing branches are not equal.

Embodiments Employing an Analog Input (Bandpass) Filter

A first representative embodiment of the present invention is the jitter-tolerant converter circuit 100, illustrated in FIG. 7. Converter circuit 100 is comprised of M processing branches (e.g., branches 110A and 120A), each of which includes an analog input filter (e.g., bandpass filter 112 or 122), in addition to: (a) a sampling/quantization circuit (e.g., circuit 105); and (b) a digital filtering element as a distinct bandpass filter (e.g., bandpass filter 115A or 125A). In the preferred embodiments, the center frequency of the analog input filter is aligned with the center frequency of the digital bandpass filter within the same processing branch. However, the bandwidth of the analog input filter is preferably wider than the bandwidth of the digital bandpass filter (when using a consistent criterion for determining such bandwidths, such as the −3 dB points) by an appreciable amount, such as by a factor of at least 1.25, 1.5, 2, 2.5 or more. When the passbands of the digital bandpass filters are minimally overlapped (as in the preferred embodiments), the passbands of the analog input filters necessarily overlap (e.g., by as much as 50% or more) due to their appreciably wider bandwidth.

It should be noted that since the bandwidth of the analog filter exceeds the bandwidth of the digital filter that performs the frequency-decomposition (i.e., signal analysis) function, the sample-rate frequency of the sampling/quantization circuits (e.g., circuits 105) in the preferred embodiments is greater than twice the bandwidth of the sub-band intended to be converted by a given processing branch; and is preferably 4 to 5 times greater than the bandwidth of the analog bandpass filter associated with that branch (i.e., the sampling/quantization circuits oversample the input signal relative to the Nyquist limit for the bandwidth of the analog filter). Therefore, the analog bandpass filters do not perform a conventional anti-aliasing function (i.e., the analog filters do not perform the same anti-aliasing function as in FTH converters, where processing branch inputs are bandlimited to the bandwidth of the associated sub-band). It should be noted further that, due to overlapping bandwidths, the analog bandpass filters in the preferred embodiments do not perform a conventional frequency-decomposition (i.e., signal analysis) function in the sense that the bandwidths of the analog filters (e.g., filters 112 and 122) do not define the converter sub-bands, as in FTH and HFB converters. Instead an appreciably wider (preferably by a factor of 1.25, 1.5, 2, 2.5 or more) analog filter bandwidth, relative to the bandwidth of the digital filters (e.g., filters 115A and 125A), ensures that: (1) the interaction between the analog bandpass filters and the digital bandpass filters is weak; and (2) the near-perfect signal reconstruction (i.e., signal synthesis) and frequency-decomposition (i.e., signal analysis) properties of the digital filter bank are not significantly affected by the presence of the analog input filters. Therefore, since the analog input filters are not integral to the frequency-decomposition and/or signal reconstruction operations, the analog filters preferably have standard responses, such as Butterworth, Chebychev, Bessel or elliptic responses, that can be realized via passive means (e.g., LC lattice, coupled resonator, distributed element, etc.) or active means (e.g., Sallen-Key, state-variable, etc.). To minimize potential degradation to the signal reconstruction process performed by the digital filters, the analog bandpass filters in each of the processing branches preferably have matched insertion loss and matched propagation delay over the portion of the analog filter passband that coincides with the total passband of each converter sub-band. Insertion loss and propagation delay matching can be realized using conventional attenuators and delay elements, respectively, or via equalization within the digital filters.

Although as described above, the analog input filters do not perform conventional anti-aliasing or frequency-decomposition functions in the preferred embodiments of the present invention, the analog input filters (e.g., filters 112 and 122) enable representative converter circuit 100, shown in FIG. 7, to be more tolerant of sampling jitter than conventional converters that do not employ frequency-interleaving with analog bandpass filtering. Specifically, the analog input filters reduce the amount of output noise caused by sampling uncertainty for the case where the input signal does not completely occupy the Nyquist (instantaneous) bandwidth $\Omega_B$ of the entire converter. To demonstrate the improved jitter tolerance of circuit 100, shown in FIG. 7, it is convenient to consider a bank of K analog input filters (e.g., filters 112 and 122) with frequency response $$H_k(j\omega) = \begin{cases} 1, & \omega_{k-1} < \omega_k < \omega_{k+1} \\ 0, & \text{otherwise} \end{cases},$$

where $H_k(j\omega)$ corresponds to the frequency response of the analog input filter with impulse response $h_k(t)$, and $\omega_k$ is the center frequency of the $k^{th}$ processing branch such that $\omega_{k+1} - \omega_{k-1} \gg B_N$ (i.e., $B_N$ is the noise bandwidth of the digital filter in the same processing branch). Although "brick wall" filters of this type are not physically realizable, a description of the circuit in this context is sufficient to allow those skilled in the art to comprehend the operation of circuit 100 with standard filter responses. Assuming infinite converter resolution (i.e., number of rounding levels $Q \to \infty$) and a sinusoidal input signal $x(t) = A_m \cdot \sin(\omega_m t + \phi_m)$, with arbitrary amplitude $A_m$, arbitrary phase $\phi_m$, and arbitrary angular frequency $\omega_m$, the output of each analog input filter $y_k$ is $$y_k(t) = \begin{cases} A_k \cdot \sin(\omega_k t + \phi_k), & k = m \\ 0, & \text{otherwise} \end{cases},$$

The sampled sequence at the output of each converter $\hat{y}_k$ is given by $$\hat{y}_k(n) = \begin{cases} A_k \cdot \sin(\omega_k T \cdot n + \phi_k + \omega_k \cdot \varphi), & k = m \\ 0, & \text{otherwise} \end{cases},$$

where the sampling interval $T = 1/f_S$ and $\varphi$ is a white, Gaussian noise sequence produced by sampling jitter (uncertainty) having power $\sigma_\varphi^2$ and power spectral density $N_0$ (i.e., $N_0 = \sigma_\varphi^2 / \Omega_B$). The output samples z of the converter are $$z(n) = \sum_{k=0}^{M-1} \hat{y}_k(n) * g_k(n)$$
$$= [A_m \cdot \sin(\omega_m T \cdot n + \phi_m + \omega_m \cdot \varphi)] * g_m(n),$$

where the "*" operator represents discrete-time linear convolution according to $$u(n) * v(n) = \sum_m u(n-m) \cdot v(m).$$

For the case where $|\phi|\ll 1$, $$z(n)=A_m\cdot\sin(\omega_m T\cdot n+\phi_m)+[A_m\cdot\cos(\omega_m T\cdot n+\phi_m)\cdot(\omega_m\cdot\phi)]$$
$$*g_m(n),$$

resulting in an overall noise power at the converter output equal to $$P_{Noise}=\frac{1}{2}\cdot B_N\cdot N_0\cdot A_m^2\cdot\omega_m^2=\frac{1}{M}\cdot\left(\frac{1}{2}\cdot\sigma_\varphi^2\cdot A_m^2\cdot\omega_m^2\right),$$

which is a factor of 1/M times lower than the noise level at the output of a conventional converter that does not employ interleaving in frequency with analog bandpass filtering. In general, the lower output noise level improves converter resolution by $10\cdot\log_{10}(1/M)/6$ bits for a sinusoidal (narrowband) input.

For a jitter-tolerant converter according to the representative embodiment of circuit 100, sampling time uncertainty generally introduces less noise into the converter output by an amount that depends on both the bandwidth ($\Omega_S$) of the input signal and the noise bandwidth $B'_N$ of the analog input filters, where $B'_N$ is appreciably greater than the noise bandwidth $B_N$ of the digital filter in the same processing branch. It can be shown that for $\Omega_S<B'_N$, the noise power caused by timing jitter is reduced by a factor of $\Omega_B/B'_N$ at the converter output, compared to a conventional converter that does not combine interleaving in frequency with analog bandpass filtering. Conversely, for $\Omega_S\approx\Omega_B$ (i.e., the input signal occupies nearly the entire Nyquist bandwidth of the converter), the converter output noise caused by sampling jitter is reduced by a negligible amount. For example, representing a broadband input signal as the sum of M sinusoids, such that $$x(t)=\sum_{k=0}^{M-1}A_k\cdot\sin(\omega_k t+\phi_k),$$

results in analog input filter outputs of $$y_k(t)=h_k(t)*A_k\cdot\sin(\omega_k t+\phi_k)$$
$$=A_k\cdot\sin(\omega_k t+\phi_k)$$

and sampled output sequences $\hat{y}_k$ given by $$\hat{y}_k(n)=A_k\sin(\omega_k T\cdot n+\phi_n+\omega_k\cdot\phi).$$

For $|\phi|\ll 1$, the output samples z of the converter are $$z(n)=\sum_{k=0}^{M-1}\hat{y}_k(n)*g_k(n)$$
$$=\sum_{k=0}^{M-1}[A_k\cdot\sin(\omega_k T\cdot n+\phi_k+\omega_k\cdot\varphi)]*g_k(n)$$
$$=\sum_{k=0}^{M-1}A_k\cdot\sin(\omega_k T\cdot n+\phi_k)+$$
$$\sum_{k=0}^{M-1}[A_k\cdot\cos(\omega_k T\cdot n+\phi_k)\cdot(\omega_k\cdot\varphi)]*g_k(n)$$

and the output noise power is $$P_{Noise}=\frac{1}{2}\cdot E\{A_k^2\}\cdot\sigma_\varphi^2\cdot\sum_{k=0}^{M-1}\omega_k^2,$$

which is the same as that for a conventional converter. Compared to a conventional converter without frequency-interleaving and analog bandpass filtering, therefore, circuit 100 exhibits better jitter tolerance for narrowband input signals, and comparable jitter tolerance for wideband input signals.

As shown in FIG. 7, in the present embodiment each of the sampling/quantization circuits (e.g., circuits 105) samples at the same rate, i.e., the rate established by the overall converter data clock 103. However, as discussed in greater detail below, in alternate embodiments different sampling/quantization circuits can sample at different rates.

Embodiments Employing at Least One Sample-Rate Conversion Operation

Two variations of a second representative embodiment of a jitter-tolerant converter, according to the present invention, are converter circuits 150A&B illustrated in FIGS. 8A&B. Each of the M processing branches (e.g., branch 110B&C, 120B&C or 130B&C) of converter circuits 150A&B include: (1) a sampling/quantization circuit (e.g., circuit 105); and (2) a digital bandlimiting circuit as a distinct filtering element (e.g., digital bandpass filter 115A, 125A or 135A) or as a composite filtering element (e.g., bandpass interpolation filter 115B, 125B or 135B). It is noted that in the specific embodiments depicted in FIGS. 8A&B (as well as in other embodiments discussed herein), the input signal 101 is provided to multiple identical sampling/quantization circuits 105, all sampling at the same rate $f_S$ and therefore producing identical (or substantially identical) output signals $\hat{y}$. In such embodiments, signal 101 instead can be provided to a single sampling/quantization circuit 105, and the resulting output signal $\hat{y}$ distributed to all of the processing branches (e.g., branches 110B, 120B and 130B), or a combination of these approaches can be used (e.g., with multiple sampling/quantization circuits 105, and with the output of each such circuit 105 supplying one or more branches). In alternate embodiments, the individual sampling/quantization circuits 105 are optimized for operation on a particular sub-band (i.e., the portion of the input signal intended to be converted by a particular processing branch), e.g., using conventional noise shaping to reduce quantization noise in the sub-band region of the output signal spectrum. In variations of the present embodiment, the sampling/quantization circuits and the digital filtering elements form parallel processing branches 110B&C, 120B&C and 130B&C, whose outputs are combined in adders 106A&B. In addition, circuits 150A&B include: (1) precision, sample-rate clock sources (e.g., oscillators 111A and 131A) that are independent of (potentially providing different sampling rates than) the conversion-rate (data) clock source 103; and (2) preferably plural digital resampling circuits in the form of: (a) standalone resampling interpolators (e.g., resampling interpolators 119 and 139), where both synthesizing rate buffers and companion polynomial estimators are included as distinct elements (e.g., buffers 116 combined with polynomial estimators 113 in circuit 150A); or (b) discrete synthesizing rate buffers, where polynomial estimation is included as an embedded function within bandpass interpolation filters (e.g., buffer 116 combined with filters 115B and 125B in circuit 150B). As shown in both variations of the current embodiment, processing branches 110B&C and 120B&C (i.e., including associated sampling/quantization circuits 105) operate at a sampling rate that is determined by sample-rate clock source 111A. The outputs of these processing branches are summed (e.g., in first-stage adders 106B, potentially with outputs from other branches) and provided to a digital resampling circuit (e.g., resampling interpolator 119 in circuit 150A, or synthesizing rate buffer 116 in circuit 150B). Generally speaking, the outputs from any number $K_j$ of processing branches may be processed by a single resampling circuit (e.g., including all of the M total processing branches), where subscript j corresponds to the $j^{th}$ resampling circuit, such that $K_j \leq M$ and $$K_j \leq M \text{ and } \sum_j K_j = M.$$

As shown further, the sampling rate of processing branch 130B&C (i.e., including associated sampling/quantization circuit 105) is determined by sample-rate clock source 131A, and the output of this single processing branch is provided to a different resampling circuit (e.g., resampling interpolator 139 in circuit 150A, or synthesizing rate buffer 136 in circuit 150B). In general, the sampling rate of a particular processing branch (e.g., processing branch 130B&C) can be the same as or can be different from branches that use different resampling circuits (e.g., processing branches 110B&C and 120B&C). In the preferred embodiments, the outputs of processing branches that share a common resampling circuit are first combined (e.g., via first-stage adders 106B), then provided to the common resampling circuit, and finally combined with the output(s) of other resampling circuits via output adders (e.g., second-stage adders 106A).

In unison, the $K_j$ digital bandlimiting circuits with their corresponding adders and digital resampling circuit (e.g., standalone resampling interpolator or synthesizing rate buffer), form a resampling filter bank (e.g., filter banks 114A&B or 134A&B) which performs both bandlimiting and sample-rate conversion. More specifically, in addition to bandlimiting, the resampling filter bank converts the sample-rate frequency used by its associated processing branches to a potentially different conversion-rate frequency at the output of the converter, such that the digital input and the digital output of the resampling filter bank are different representations of the same underlying continuous-time signal. In the preferred embodiments, the sample-rate conversion operation performed by each resampling filter bank includes: (1) a polynomial estimation (interpolation) process whereby new (unknown) data samples are fabricated from known (existing) data samples; and (2) a rate buffering process whereby new samples enter a data buffer (memory or register) at one rate (i.e., an initial rate) and exit the data buffer at a different rate (i.e., a final rate). The sample-rate clock sources (e.g., 111A or 131A) are preferably precision, fixed-frequency oscillators, having a design that emphasizes stable, low-jitter operation over the capability for tuning across a wide range of output frequencies. More preferably, each such sample-rate clock source is the low-jitter oscillator circuit described in the '003 Application. In each processing branch, the bandlimiting circuit (e.g., digital bandpass filter 115A or 125A in circuit 150A, or bandpass interpolation filter 115B or 125B in circuit 150B) and associated sampling/quantization circuit preferably operate at a sample-rate frequency which is greater than or equal to the conversion-rate frequency (i.e., the frequency of data clock input 103) of the converter. In the representative embodiment of circuit 150A, resampling interpolators 119 and 139 preferably use polynomial estimation and rate buffering to effectively "resample" their corresponding input signals (i.e., input signals 107A&B respectively), in a manner that compensates for the difference between the corresponding sample-rate frequency, or frequencies ($f_S$), and the desired conversion-rate frequency ($f_{CLK}$). In other representative embodiments, however, the polynomial estimation and rate buffering operations also compensate for the effects of sampling errors, approximating a condition of perfect sampling (as discussed in more detail in the Embodiments Also Employing At Least One Sampling Error Estimator section below). Similar processing occurs in the representative embodiment of circuit 150B, except that the rate buffering operations for input signals 107A&B occur within synthesizing rate buffer circuits 116 and 136, respectively, and polynomial estimation occurs within bandpass interpolation filters 115B, 125B, and 135B.

Figure 10A:
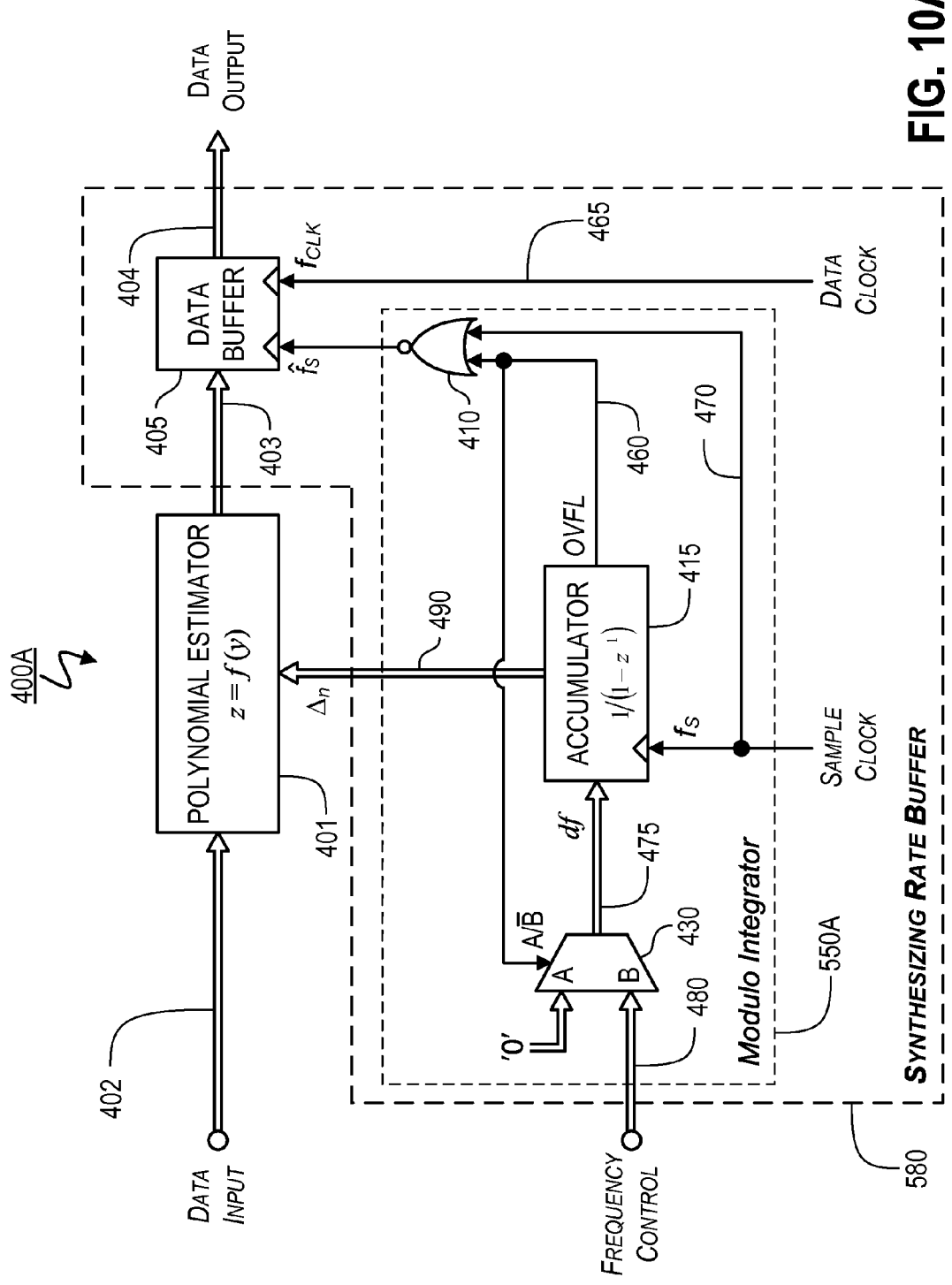
FIG. 10A is a block diagram illustrating an exemplary implementation of a resampling interpolator circuit that uses a polynomial estimator and a synthesizing rate buffer to compensate for the difference between a higher sample-rate frequency and a lower conversion-rate frequency, where the ratio of the sample-rate frequency to conversion-rate frequency is a rational number greater than one.

An exemplary resampling interpolator (e.g., standalone circuit 119 or 139), according to the preferred embodiments of the present invention, is circuit 400A shown in FIG. 10A. Circuit 400A is comprised of: (1) a conventional interpolator (e.g., polynomial estimator 401); and (2) a synthesizing rate buffer (e.g., circuit 580). Resampling interpolator circuit 400A performs a sample-rate conversion (digital resampling) operation wherein data at input 402, which has been sampled originally at the sample-rate frequency $f_S$, is resampled at the conversion-rate frequency $f_{CLK}$ according to data clock 465. Polynomial estimator 401 operates at the sample-rate frequency $f_S$ of the associated processing branch, which preferably is greater than or equal to the conversion-rate frequency $f_{CLK}$ (i.e., $f_S \geq f_{CLK}$) of the converter. Synthesizing rate buffer 580 includes functions for data buffering (e.g., buffer 405) and modulo integration (e.g., integrator 550A). The operation of data buffer 405 is comparable to that of conventional memory devices which store (receive) data samples at one rate (e.g., the higher sampling rate $f_S$) and read (deliver) data samples at a different rate (e.g., the lower conversion rate $f_{CLK}$). Storing and reading data at different rates is a process that is referred to in the prior art as data buffering, and data buffer 405 may be implemented using first-in-first-out (FIFO) memories, register files, or other conventional means. In addition to rate buffering, synthesizing rate buffer 580 preferably incorporates modulo integration (e.g., modulo integrator 550A) to generate (i.e., synthesize) the curve-fit interpolant $\Delta_n$, which is used to fabricate new data samples from existing data samples via polynomial estimation (e.g., within polynomial estimator 401). More specifically, modulo integrator 550A tracks the unit-interval (i.e., fractional clock period) offset $\Delta_n$ that accumulates between the transitions (logic edges) in sample-rate clock 470 (i.e., with frequency $f_S$) and the transitions in conversion-rate clock 465 (i.e., with frequency $f_{CLK}$). When the accumulated offset $\Delta_n$ exceeds a value (i.e., a terminal value) corresponding to a full period of the sample-rate frequency $f_S$, the output of modulo integrator 550A overflows (i.e., wraps) to a remainder value which corresponds to the difference between the accumulated offset and one full period of the sample-rate frequency (i.e., the output wraps to the remainder of the accumulated offset value divided by the terminal value). An operation that wraps on overflow to a remainder value is conventionally referred to as a modulo operation, and therefore, circuit 550A is sometimes referred to herein as a modulo integrator (or a modulo accumulator).

Referring to FIG. 10A and exemplary resampling interpolator 400A, modulo integrator 550A tracks the unit-interval offset, between sample-rate clock 470 and conversion-rate clock 465, according to $$\Delta_n = \int df(t) \approx \sum_{n=1/f_S} df_n,$$

where df is equal to the value at the input of the modulo integrator (e.g., the value of frequency control input 480) and $\Delta_n$ is the value of the curve-fit interpolant at the output of the modulo integrator (e.g., primary output 490 of accumulator 415). The primary output 490 of accumulator 415 (i.e., interpolant $\Delta_n$) increments (or decrements) by an amount equal to the value (df) of input 475, and determines the amount by which the value (i.e., magnitude) of data inputs 402 are interpolated (adjusted) to reflect a different sample time at the output of the resampling interpolator (e.g., data output 404). Preferably, the value df at accumulator input 475, is determined by the ratio of sample-rate frequency $f_S$, to desired conversion-rate frequency $f_{CLK}$, according to the equation $$df = \frac{f_S}{f_{CLK}} - 1.$$

Accumulator output 490 (i.e., interpolant $\Delta_n$) is the modulo-sum of accumulator input 475, such that in the preferred embodiments where $f_S > f_{CLK}$ (i.e., df>0), the accumulator output increases in increments of df until a terminal value is reached, causing the digital resampling operation to delay the sample-time instant with each cycle of the sample-rate clock. Preferably, accumulator 415 reaches a terminal value of unity (i.e., terminal value equals±1) when the accumulated time difference between sample-rate clock 470 and conversion-rate clock 465 equals one full period (i.e., one unit interval) of the sample-rate clock. Such operation ensures that the polynomial estimator does not have to extrapolate beyond a full sample period. In the preferred embodiments, the ratio $f_S/f_{CLK}$ is rational, a condition that occurs when $f_S$ and $f_{CLK}$ are multiples of a common reference frequency $f_{REF}$, such that for integers a, b, c, and d:

$$f_S = \frac{b}{a} \cdot f_{REF}, f_{CLK} = \frac{d}{c} \cdot f_{REF}, \text{ and } \frac{f_S}{f_{CLK}} = \frac{b \cdot c}{a \cdot d} \geq 1.$$

In general, the above condition is not difficult to achieve using conventional frequency synthesis methods (e.g., direct-digital synthesis or factional-N PLL synthesis) and ensures that there is a finite-precision value df for which data buffer 405 does not overflow (or underflow).

Referring again to exemplary resampling interpolator 400A in FIG. 10A, overflow output 460 of accumulator 415, in conjunction with logical NOR gate 410 and multiplexer 430, prevents the condition where more data samples enter data buffer 405 than exit data buffer 405 (i.e., prevent the data buffer from becoming overloaded). When accumulator overflow output 460 is in an inactive state (i.e., a low logic level), the operation of circuit 400A is as follows: (1) accumulator input 475 is equal to manual frequency control input 480, based on the configuration of multiplexer 430; (2) the value of interpolant 490 ($\Delta_n$) is updated on the rising edge of sample-rate clock 470 ($f_S$); and (3) interpolated data 403 are clocked into data buffer 405 on the falling edge of sample-rate clock 470, due to inversion in logical NOR gate 410. Conversely, when accumulator overflow output 460 is in an active state (i.e., a high logic level), the operation of circuit 400A is as follows: (1) accumulator input 475 is equal to zero, based on the configuration of multiplexer 430; (2) interpolant 490 ($\Delta_n$) is not updated on the rising edge of sample-rate clock 470 ($f_S$), due to a value of zero at accumulator input 475 from multiplexer 430; and (3) interpolated data 403 are not clocked into data buffer 405 on the falling edge of sample-rate clock 470, because of logical NOR gate 410. For the exemplary case where $f_S/f_{CLK}=5/4$ and accumulator input $df=f_S/f_{CLK}-1=\frac{1}{4}$, the first seven values of interpolant 490 are: 0, ¼, ½, ¾, 0, 0, and ¼. As such, resampling interpolator 400A uses polynomial estimation and rate buffering to effectively delay the sampling instant by ¼ period (i.e., ¼ unit interval) on each cycle of the sample-rate clock. Interpolant 490 transitions from a value of ¾ to a value of 0 (i.e., accumulator 415 overflows) when the accumulated result would have reached the terminal value of ±1, and the duplicate value of 0 results from accumulator overflow signal 460 disabling accumulation for a single cycle (i.e., via multiplexer 430). An overflow condition (e.g., a transition from a value of ¾ to a value of 0) disables the input clock of data buffer 405, via logical NOR gate 410, such that the data sample at the output of polynomial estimator 401 is not loaded into data buffer 405 (i.e., only 6 of the 7 available values at the output of polynomial estimator 401 are loaded into data buffer 405). How often overflow output 460 becomes active to disable the input of data buffer 405, is directly proportional to the value of accumulator input 475. In the preferred embodiments, the value df of accumulator input 475, is such that the amount of data clocked into data buffer 405 is the same, on average, as the amount of data clocked out of data buffer 405 (i.e., there is no memory underflow or overflow).

Figure 10B:
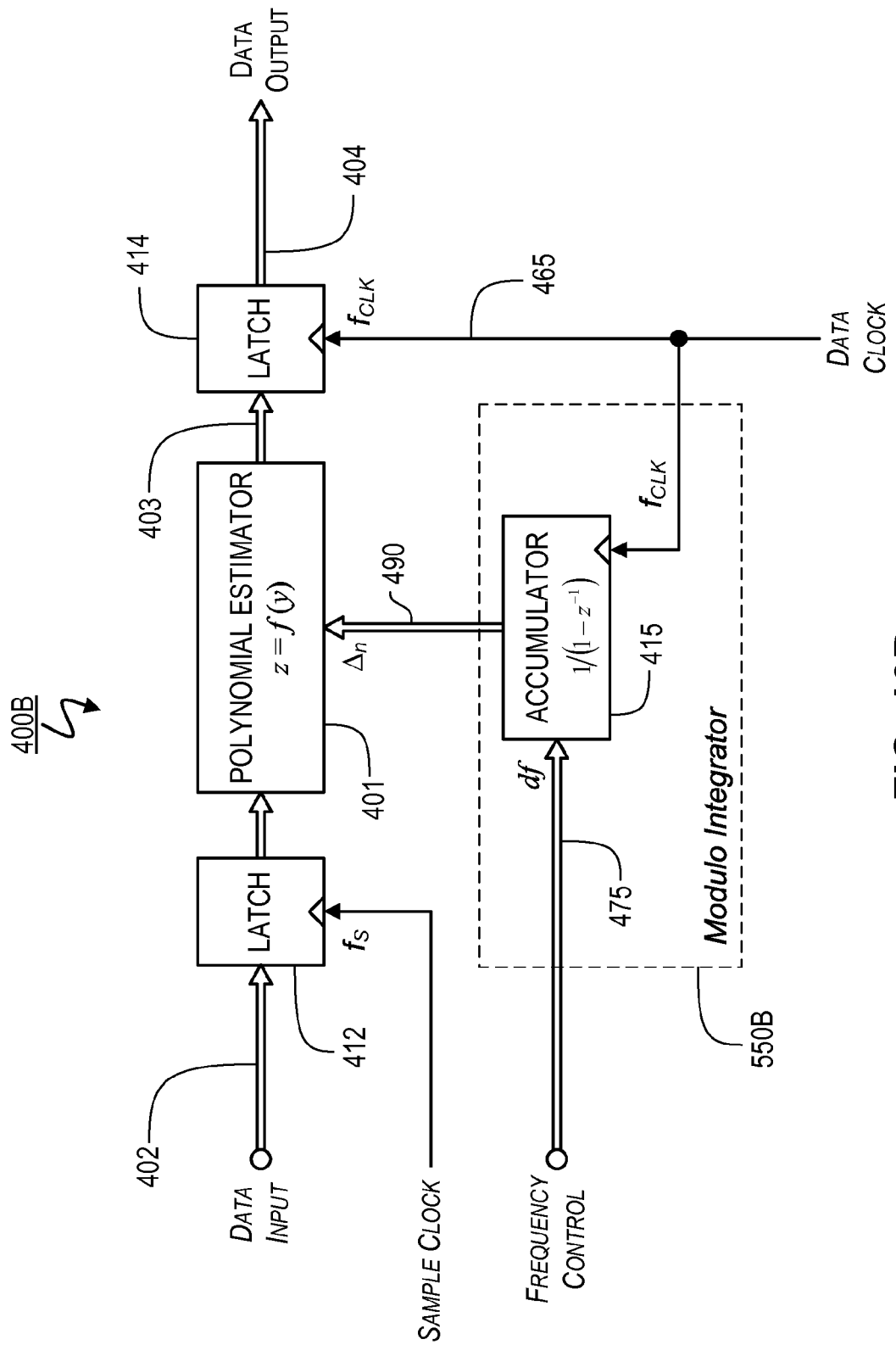
FIG. 10B is a block diagram illustrating an exemplary implementation of a resampling interpolator circuit that uses a polynomial estimator, a modulo integrator, and metastability latches to compensate for the difference between a sample-rate frequency and a conversion-rate frequency, where the ratio of the sample-rate frequency to conversion-rate frequency is a number less than one.

Although in the preferred embodiments, the ratio of sample-rate frequency to conversion-rate frequency (i.e., the ratio $f_S/f_{CLK}$) is rational and greater than one, in alternate embodiments the ratio $f_S/f_{CLK}$ can be irrational or less than one. In alternate embodiments where the ratio $f_S/f_{CLK}$ is irrational, or less than one, resampling interpolator circuit 400B (i.e., illustrated in FIG. 10B) preferably is used. The operation of circuit 400B is similar to that of circuit 400A, except that the interpolant value ($\Delta_n$) at output 490 of accumulator 415, updates on the rising edge of conversion-rate clock 465, instead of on the rising edge of sample-rate clock 470. As before, the value (df) at accumulator input 475 is determined by the ratio of sample-rate frequency $f_S$ to desired conversion-rate frequency $f_{CLK}$, according to the equation:

$$df = \frac{f_S}{f_{CLK}} - 1.$$

Accumulator output 490 (i.e., interpolant $\Delta_n$) is the modulo-sum of accumulator input 475, such that in alternate embodiments where $f_S < f_{CLK}$ (i.e., df<0), the accumulator output decreases in increments of df until a terminal value of −1 is reached, causing the digital resampling operation to advance the sample-time instant with each cycle of the conversion-rate clock. Since data samples (i.e., input signal 402) are clocked into polynomial estimator 401 at a rate $f_S$ (i.e., via optional latch 412 in FIG. 10B) and interpolated at a different rate $f_{CLK}$, circuit 400B operates in an asynchronous manner, creating the potential for logic metastability conditions at output 403 of polynomial estimator 401. Therefore, data samples at output 403 are reclocked in latch 414, using conversion-rate clock 465. Latch 414 acts as a conventional metastability buffer to allow logic levels to reach a stable equilibrium state, before being coupled onto data output line 404.

For embodiments where sample-rate conversion occurs in a standalone resampling interpolator (i.e., the interpolation operation occurs subsequent to bandpass filtering), such as the exemplary circuits 400A&B, the accuracy of the sample-rate conversion (digital resampling) operation depends on the extent to which the input rate of the resampling interpolator (i.e., sample-rate frequency $f_S$ in the preferred embodiments) exceeds the maximum frequency component ($f_N$) of the discrete-time input signal. The ratio $f_S/f_N$, which determines the accuracy of the standalone resampling interpolator, is not uniform across the M processing branches (e.g., branches 110B, 120B or 130B) of exemplary converter 150A. Instead, processing branches that operate on sub-bands centered at lower frequencies have a higher $f_S/f_N$ ratio (i.e., resulting in increased interpolation accuracy), and processing branches that operate on sub-bands centered at higher frequencies have a lower $f_S/f_N$ ratio (i.e., resulting in decreased interpolation accuracy). This non-uniformity in interpolation accuracy occurs because the maximum frequency component of the input signal to the resampling interpolator depends on both the bandwidth and center frequency of the sub-band intended to be captured by the corresponding processing branch. Therefore, digital resampling preferably is based on a parabolic interpolation with a ratio $f_S/f_N \geq 10$ to ensure a resampling accuracy of better than 1% (i.e., ~7.5 effective bits). More preferably, sample-rate conversion (digital resampling) is based on a parabolic interpolation with a ratio $f_S/f_N \geq 16$ to ensure a resampling accuracy of better than 0.25% (i.e., ~10 effective bits). In alternate embodiments, however, sample-rate conversion can be based on linear or other nonlinear (e.g., sinusoidal or cubic spline) interpolation between sampled output values, and a different $f_S/f_N$ ratio.

Figure 10C:
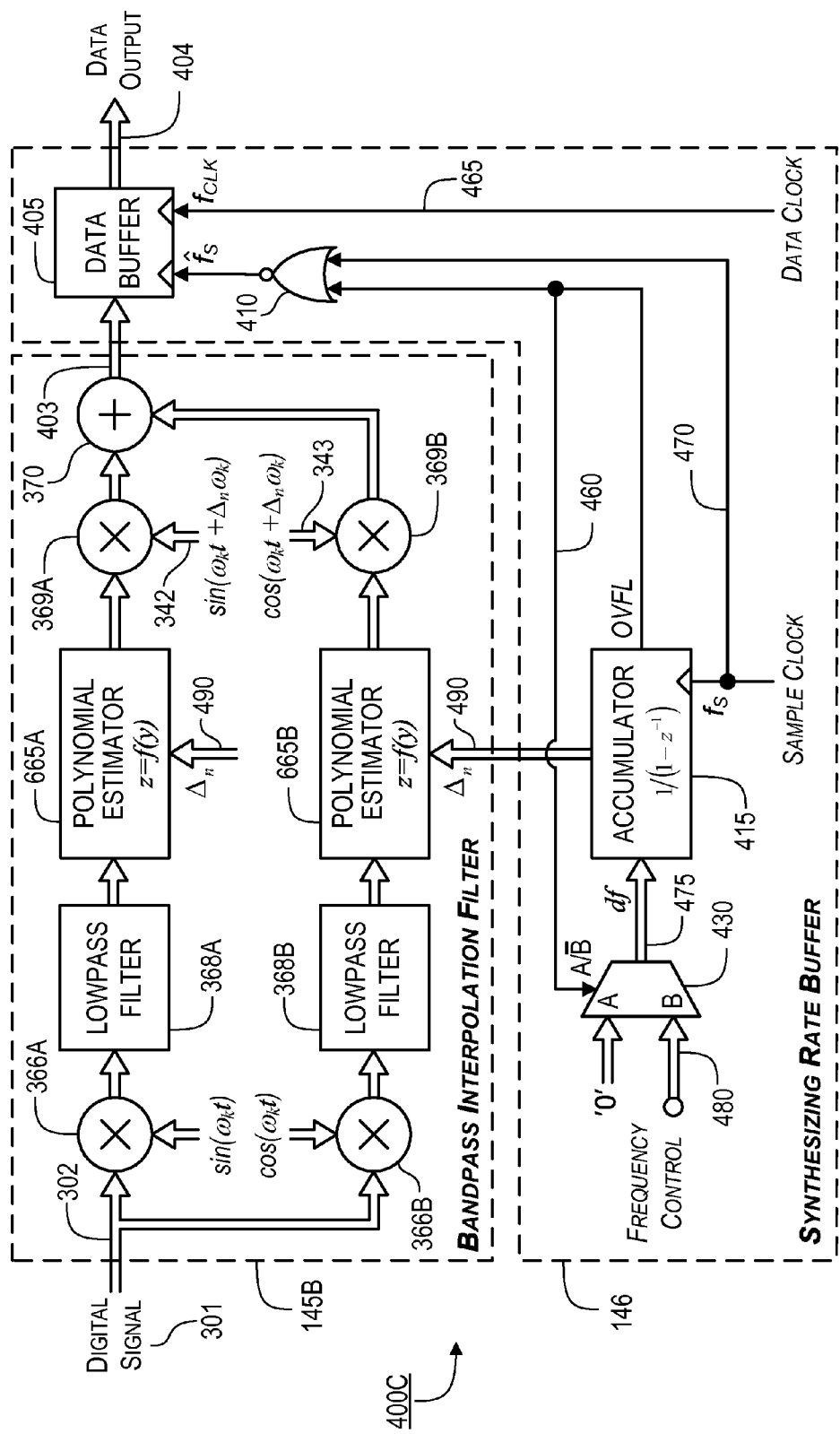
FIG. 10C is a block diagram of a bandpass interpolation filter and synthesizing rate buffer according to a representative embodiment of the invention that includes quadrature frequency conversion, lowpass filtering, and quadrature polynomial estimation (interpolation).

A more preferred embodiment of the invention utilizes exemplary rate-converting (digital resampling) circuit 400C, illustrated in FIG. 10C, which distributes the sample-rate conversion operation between a bandpass interpolation filter (e.g., circuit 145B) and a synthesizing rate buffer (e.g., circuit 146). The operations of accumulator 415 and data buffer 405 in circuit 400C, are similar to those of exemplary circuit 400A given in FIG. 10A. However, the unique architecture of bandpass interpolation filter 145B is advantageous with respect to sample-rate conversion accuracy. Unlike conventional bandpass filters (e.g., FIR window filters) where bandlimiting occurs directly at an intermediate frequency ($\omega_k$) using a bandpass response, bandpass interpolation filter 145B performs indirect bandlimiting at baseband (i.e., zero hertz intermediate frequency) using: (1) a quadrature downconverter (i.e., multipliers 366A&B) that utilizes sine and cosine sequences to produce a quadrature (baseband) output and an in-phase (baseband) output, respectively; (2) a pair of lowpass filters (e.g., filters 368A&B) that are coupled to the outputs of the quadrature downconverter; and (3) a quadrature upconverter (i.e., combination of multipliers 369A&B and adder 370) that is coupled to the lowpass filters and utilizes sine and cosine sequences to produce a single, intermediate-frequency output. In exemplary rate-converting circuit 400C, the quadrature upconverter is coupled to lowpass filter 368A&B via digital interpolators (e.g., polynomial estimators 665A&B). In combination, the two digital interpolators use a polynomial function to fabricate new complex-valued data samples (i.e., formatted as quadrature and in-phase components) from existing complex-valued data samples (i.e., formatted as quadrature and in-phase components). Because polynomial estimators 665A&B operate jointly on quadrature and in-phase data samples, their function is sometimes referred to herein as quadrature interpolation. For equivalent bandwidths, the maximum frequency component $f_N$ at the input of the polynomial estimators is lower, and consequently the interpolation accuracy is higher, since the interpolation operations follow lowpass responses as opposed to a conventional bandpass response.

Figure 6A:
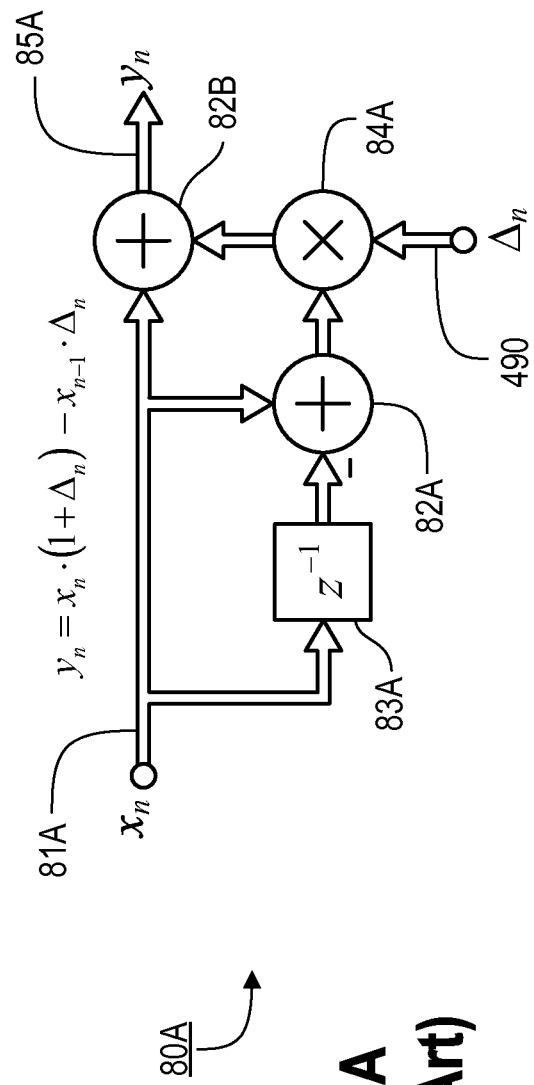
FIG. 6A is a block diagram of a conventional polynomial estimator (interpolator) that operates on real-valued signals and fabricates new data samples from existing data samples according to a linear (i.e., first-order) function.
Figure 6B:
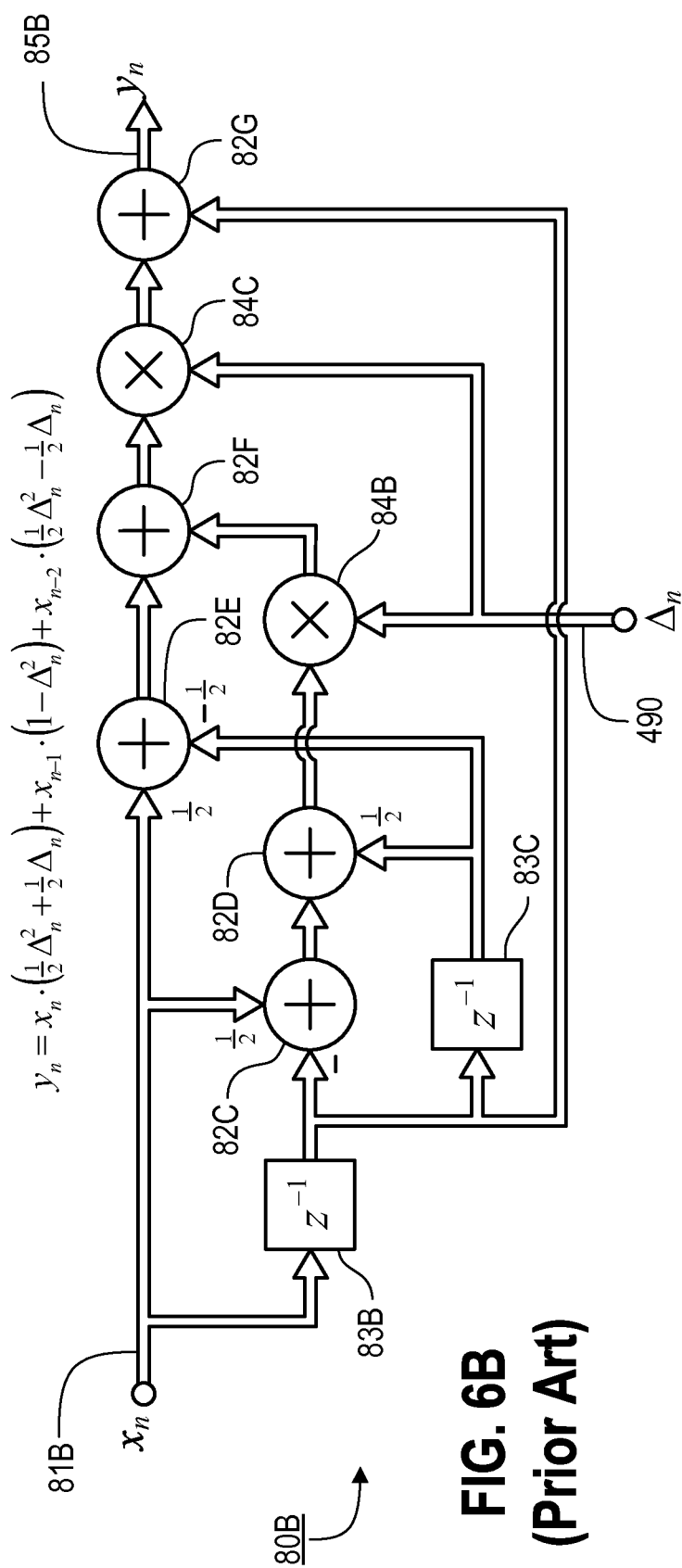
FIG. 6B is a block diagram of a conventional polynomial estimator (interpolator) that operates on real-valued signals and fabricates new data samples from existing data samples according to a parabolic (i.e., second-order) function.
Figure 11:
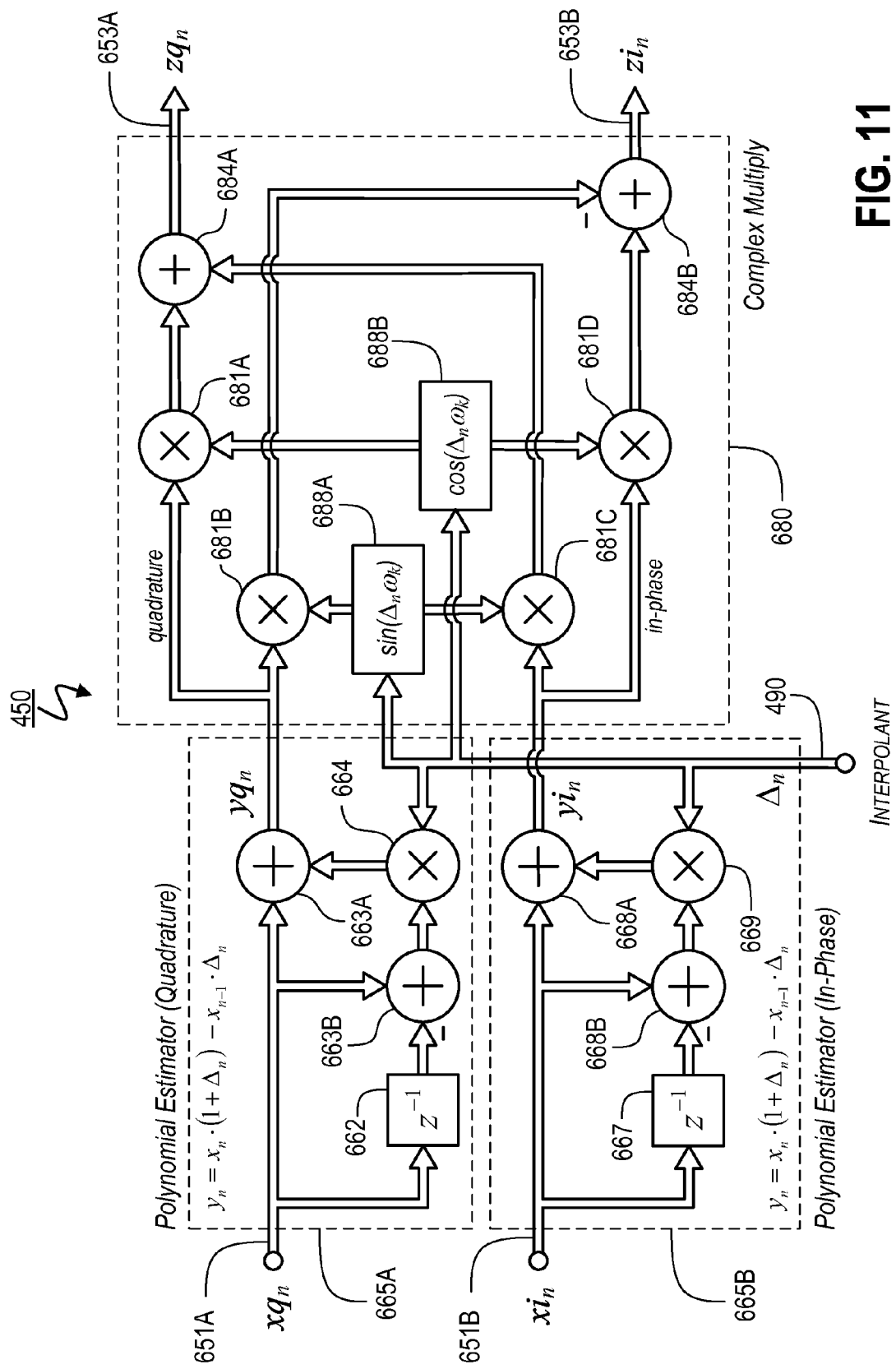
FIG. 11 is a block diagram of a polynomial estimator (interpolator) according to a representative embodiment of the invention that operates on complex-valued signals (i.e., signals with in-phase/real and quadrature/imaginary components) and fabricates new data samples from existing data samples according to a linear (i.e., first-order) function.

A means for quadrature interpolation according to the preferred embodiments of the present invention is circuit 450, illustrated in FIG. 11. The present inventor has discovered that, unlike conventional interpolators 80A&B (i.e., shown in FIGS. 6A&B) that operate on real-valued inputs, quadrature interpolation requires the additional processing of a rotation matrix multiplier (e.g., complex multiplier 680 in FIG. 11) in order to make accurate estimates of new data samples using polynomial functions. Rotation matrix multiplier 680 applies a phase shift to the complex-valued data samples at the output of the polynomial estimators using multiplication (i.e., multipliers 681A-D), addition (i.e., adders 684A&B), and sine/cosine functions (i.e., functions 688A&B). More specifically, these operations perform a phase rotation by $\Delta_n \cdot \omega_k$, such that the complex-valued outputs ($zi_n$, $zq_n$) of complex multiplier 680 are a phase-rotated version of the complex-valued outputs ($yi_n$, $yq_n$) of polynomial estimators 665A&B, according to:

$$zi_n = yi_n \cdot \cos(\Delta_n \cdot \omega_k) + yq_n \cdot \sin(\Delta_n \cdot \omega_k)$$

$$zq_n = yq_n \cdot \cos(\Delta_n \cdot \omega_k) - yi_n \cdot \sin(\Delta_n \cdot \omega_k),$$

where $\omega_k$ is the frequency of the sinusoidal sequences utilized for quadrature up/downconversion (i.e., the intermediate frequency of the associated processing branch). The present inventor has discovered that the function of complex multiplier 680, shown in FIG. 11 (i.e., circuit 450), can be combined with the function of the quadrature upconverter (i.e., dual multipliers 369A&B) shown in FIG. 10C (i.e., circuit 400C), such that the quadrature upconverter simultaneously provides phase rotation and upconversion. Combining the functions of the complex multiplier and quadrature upconverter is realized by appropriately selecting the phases of sine sequence 342 and cosine sequence 343 which shift the output of lowpass filters 368A&B from a center frequency of zero back to a center frequency of $\omega_k$, where $\omega_k$ is the center frequency of the sub-band intended to be processed by the $k^{th}$ processing branch. To reduce hardware complexity (i.e., via the elimination of multipliers 681A-D, adders 684A&B, and sine/cosine functions 688A&B), therefore, the preferred bandpass interpolation filter 145B, shown in FIG. 10C, performs an upconversion operation utilizing sine and cosine sequences with non-zero phase, rather than utilizing an explicit complex multiplier as shown in exemplary quadrature interpolator 450 (i.e., illustrated in FIG. 11). In other words, in this embodiment circuits 665A, 665B, 369A, 369B and 370 (shown in FIG. 10C) perform the polynomial estimation and phase rotation operations that are implemented more explicitly in circuit 450 (shown in FIG. 11). The appropriate phases for sine sequence 342 and cosine sequence 343, shown in FIG. 10C, are derived by observing the result $z'_n$ of performing a quadrature upconversion operation on the outputs ($zi_n$, $zq_n$) of complex multiplier 680, shown in FIG. 11. Accordingly $$\begin{aligned}z'_n &= [zi_n \cdot \cos(\Delta_n \cdot \omega_k) + zq_n \cdot \sin(\Delta_n \cdot \omega_k)] \cdot \cos(\omega_k t) + \\&\quad [zq_n \cdot \cos(\Delta_n \cdot \omega_k) - zi_n \cdot \sin(\Delta_n \cdot \omega_k)] \cdot \sin(\omega_k t) \\&= zi_n \cdot \cos(\omega_k t + \Delta_n \cdot \omega_k) + zq_n \cdot \sin(\omega_k t + \Delta_n \cdot \omega_k),\end{aligned}$$

where $t=n/f_S$ (i.e., the sample time increment), and the result (i.e., second equation above) is quadrature upconversion by sine and cosine sequences that have been phase shifted by an amount equal to $\Delta_n \cdot \omega_k$. By similar analysis, it can be shown that it is also possible to combine the function of complex multiplier 680 with the function of the quadrature downconverter (i.e., dual multipliers 366A&B) shown in FIG. 10C (i.e., circuit 400C), such that the quadrature downconverter simultaneously provides phase rotation and downconversion. Combining the functions of the complex multiplier and the quadrature downconverter, therefore, should be considered within the scope of the present invention.

In addition to providing a frequency-decomposition function, the bandlimiting circuits within each resampling filter bank (e.g., bandpass interpolation filter 115B or 125B in circuit 150B) preferably limit the high-frequency content of the signals at the output of the sampling/quantization circuits, such that accurate sample-rate conversion can take place using interpolation methods which are based on polynomial functions (i.e., polynomial estimation). The exemplary interpolators shown in FIG. 11 (i.e., polynomial estimators 665A&B of circuit 450), implement the first-order (i.e., linear) polynomial function given by $$y_n = x_n \cdot (1+\Delta_n) - x_{n-1} \cdot \Delta_n,$$

where $\Delta_n$ is the curve-fit interpolant (i.e., an independent, control variable that specifies the unit-interval offset between a given sample-time instant and a desired sample-time instant). With respect to the above equation, more negative interpolant values (e.g., $\Delta_n \rightarrow -1$) advance the sample-time instant (i.e., shift sampling to an earlier point in time) and less negative interpolant values (e.g., $\Delta_n \rightarrow 0$) delay the sample-time instant (i.e., shift sampling to a later point in time). In alternate embodiments, however, the relationship between interpolant polarity and sample-time shift could be the opposite. It should be noted that since $$y_n = \begin{cases} x_n, & \Delta_n = 0 \\ x_{n-1}, & \Delta_n = -1 \end{cases},$$

the curve-fit error is zero (i.e., $y_i = x_i$) for an interpolant specifying a unit-interval offset that coincides with an actual sample-time instant (e.g., $\Delta_n = 0$ and $\Delta_n = -1$). Those skilled in the art will readily appreciate that alternate embodiments could employ other interpolation functions, including parabolic (i.e., second-order), cubic (i.e., third-order), and trigonometric functions. In the preferred embodiments of the invention (e.g., circuit 400C illustrated in FIG. 10C), the sample-rate conversion operation follows a lowpass response and the accuracy of the interpolation function is independent of intermediate frequency $\omega_k$ (i.e., the center of the sub-band that is intended to be converted by the $k^{th}$ processing branch). As a result, sample-rate conversion is uniformly accurate across the various processing branches, such that polynomial estimation (i.e., interpolation) in branches that operate on sub-bands centered at higher frequencies is as accurate as polynomial estimation in branches that operate on sub-bands centered at lower frequencies. The accuracy of the quadrature interpolation function depends on: (1) the total number of processing branches M; and (2) the excess-rate oversampling ratio N (defined above). More specifically, the approximate accuracy (i.e., relative error) of a linear, quadrature interpolation operation improves according to the square of the product M·N, such that for every factor of two increase in the product M·N, the accuracy ($\epsilon$) of the interpolation operation improves by a factor of about 4, or $$\varepsilon \approx \frac{k}{(M \cdot N)^2}.$$

In embodiments utilizing bandpass interpolation filters (e.g., such as exemplary embodiment 150B in FIG. 8B), sample-rate conversion preferably is based on linear interpolation with a product M·N≥8 to ensure a resampling accuracy of better than 1% (i.e., ~8 effective bits). More preferably, sample-rate conversion is based on linear interpolation with a product M·N≥16 to ensure a resampling accuracy of better than 0.25% (i.e., ~10 effective bits). In alternate embodiments, however, sample-rate conversion can be based on non-linear (e.g., parabolic or cubic spline) interpolation between sampled output values, and a different M·N product.

Figure 12:
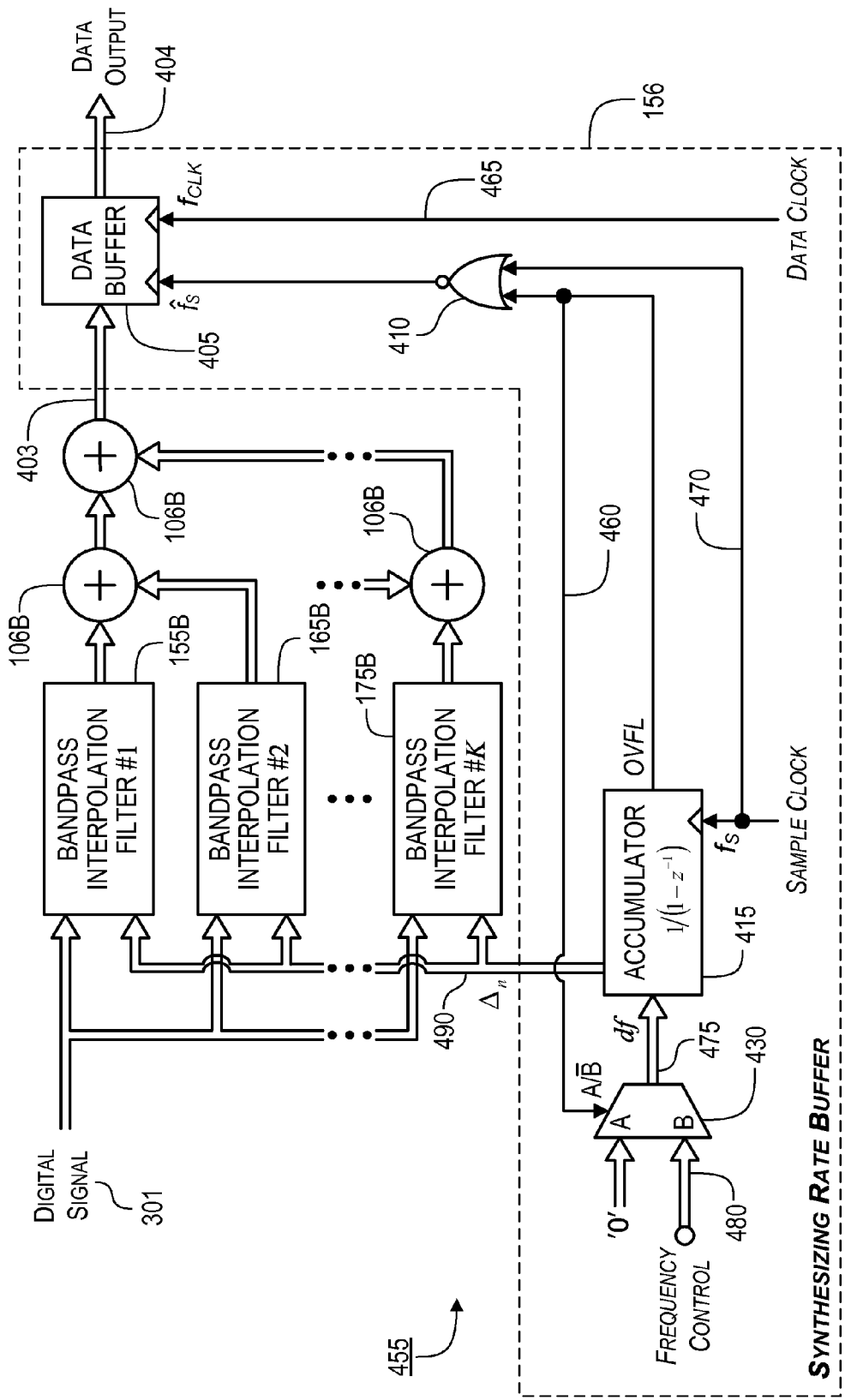
FIG. 12 is a block diagram of a resampling filter bank according to a representative embodiment of the invention that includes multiple bandpass interpolation filters and a synthesizing rate buffer.

In the exemplary rate-converting circuit 400C, shown in FIG. 10C, the resampling circuit (e.g., synthesizing rate buffer 146) is coupled directly to the output of bandpass interpolation filter 145B. The more general embodiment, however, is exemplary resampling filter bank 455, illustrated in FIG. 12, which includes a single resampling circuit (i.e., synthesizing rate buffer 156) that is shared by multiple bandpass interpolation filters (e.g., filters 155B, 165B, and 175B). In the present embodiment, input signal 301 is provided directly to each of the bandpass interpolation filters (e.g., filters 155B, 165B, and 175B), which preferably process different frequency sub-bands. In alternate embodiments, however, input signal 301 can be coupled to such bandpass interpolation filters in any other manner. As used herein, the term "coupled", or any other form of the word, is intended to mean either directly connected or connected through one or more other processing blocks, e.g., for the purpose of preprocessing. Also, it should be noted that signal 301 could have been generated from a signal that is continuous in time and continuously variable (e.g., from signal 101 using one or more circuits 105), as discussed herein. Similarly, rather than providing the same signal 301 to the various branches, in alternate embodiments different signals (e.g., separately generated signals that are identical or substantially identical to each other) are provided to different branches. The outputs of the bandpass interpolation filters 155A, 165A and 175A are coupled to the input of associated synthesizing rate buffer 156 via a set of adders (e.g., first-stage adders 106B), which combine the outputs of multiple bandpass interpolation filters. It should be noted that any number of bandpass interpolation filters can be coupled to a single resampling circuit (e.g., synthesizing rate buffer 156).

Those skilled in the art can readily appreciate that the unique filter bank architecture described above, which performs indirect bandpass filtering using quadrature up/downconversion and lowpass responses, can provide a lower complexity (e.g., reduced multiplier count) alternative to conventional filter bank structures that use transversal filters (e.g., digital FIR filters) to perform direct bandpass filtering at intermediate frequencies. Therefore, the structure of bandpass interpolation filter 145B, shown in FIG. 10C, can have utility beyond the disclosed method for sample-rate conversion when, for example, the digital interpolators (e.g., polynomial estimators 665A&B) are replaced by other signal processing functions. By exchanging the digital interpolators for other signal processing functions, a filter bank comprising a plurality of the modified bandpass interpolation filters can be adapted for use in applications that include: (1) echo cancellation in voice transmission; (2) adaptive equalization in data transmission; (3) companding and decompanding for audio channels; and (4) spectral channelization in multi-user systems. Use of the present bandpass interpolation filter structure for other applications should be considered within the scope of the present invention.

Embodiments Also Employing at Least One Sampling Error Estimator

Variations of a third representative embodiment of a jitter-tolerant converter, according to the present invention, are converter circuits 200A&B illustrated in FIGS. 9A&B. Converter circuits 200A&B are comprised of M processing branches, with each branch (e.g., any of branches 110B&C or 120B&C) including: (1) a sampling/quantization circuit (e.g., circuit 105); and (2) a digital bandlimiting circuit as a distinct filtering element (e.g., digital bandpass filter 115A or 125A) or as a composite filtering element (e.g., bandpass interpolation filter 115B or 125B). In variations of the present embodiment, the sampling/quantization circuits and the bandlimiting circuits form parallel processing branches 110B&C and 120B&C, whose outputs are combined in adders 106A&B. In addition, circuits 200A&B include: (1) sample-rate clock sources (e.g., oscillator 111B) that determine both the nominal sample-rate frequency of the sampling/quantization circuits and the nominal conversion-rate frequency (e.g., data clock 103) of the converter; (2) a sampling error estimator (e.g., circuit 117) coupled to the output of a corresponding sample-rate clock source (e.g., oscillator 111B); and (3) preferably plural digital resampling circuits in the form of: (a) distinct polynomial estimators with companion data buffers (e.g., polynomial estimator 113 combined with data buffer 118 in circuit 200A); or (b) discrete data buffers with polynomial estimation occurring within associated bandlimiting circuits (e.g., data buffer 118 combined with bandpass interpolation filter 115B in circuit 200B). The outputs of the digital bandlimiting circuits associated with parallel processing branches 110B&C and 120B&C are summed within first-stage adders 106B (potentially with outputs from other branches) and provided to a digital resampling circuit (e.g., polynomial estimator 113 in circuit 200A, or data buffer 118 in circuit 200B). In general, each digital resampling circuit is coupled to the single or combined output(s) of $K_j$ digital bandlimiting circuits, where subscript j represents the $j^{th}$ resampling circuit, such that each $K_j \leq M$, and $$K_j \leq M, \text{ and } \sum_j K_j = M.$$

In unison, the $K_j$ digital bandlimiting circuits with their corresponding adders and digital resampling circuit form a resampling filter bank (e.g., filter bank 114C&D). Due to digital resampling (i.e., sample-rate conversion), using both polynomial estimation and rate buffering operations, the digital input and the digital output of the resampling filter bank are potentially different discrete-time representations of the same underlying continuous-time signal. In the present embodiment, the polynomial estimation and rate buffering operations compensate for the effects of sampling errors to approximate a condition of perfect sampling. In other representative embodiments, however, the polynomial estimation and rate buffering operations also compensate for the difference between a desired sample-rate frequency, or frequencies ($f_S$), and a desired conversion-rate frequency ($f_{CLK}$).

In the preferred embodiments, sampling error estimator 117 produces an error signal 108 (i.e., curve-fit interpolant $\Delta_n$) that is directly proportional to the random time-period fluctuations (i.e., jitter) in sample clock 111B. In certain representative embodiments, such as those illustrated by circuits 200A&B in FIGS. 9A&B, the output of sample clock 111B is directly coupled to the input of sampling error estimator 117. In alternate embodiments, however, the input to sampling error estimator 117 can be a different signal that has the same nominal oscillation period as the output of sample clock 111B, e.g. such as the least significant bit at the output of sampling/quantization circuit 105. In the representative embodiment of circuit 200A, the error signal 108 is provided to distinct polynomial estimator 113, which couples the combined (i.e., via first-stage adders 106B) output 107A of the digital bandlimiting circuits (e.g., bandpass filters 115A and 125A) to the input of data buffer 118. In the alternate representative embodiment of circuit 200B, the error signal 108 is provided to bandpass interpolation filters 115B and 125B, and the combined (i.e., via first-stage adders 106B) output 107A of the digital bandlimiting circuits (e.g., bandpass interpolation filters 115A and 125A) is coupled directly to the input of data buffer 118. The combined output 107A of the digital bandlimiting circuits typically has been corrupted by sample-time uncertainty (jitter), and consequently, the resampling circuit does not directly pass on the jitter-corrupted data samples from the output of first-stage adders 106B. Instead, the resampling circuit uses interpolation (e.g., within polynomial estimator 113, or within bandpass interpolation filters 115B or 125B) and rate buffering (e.g., within data buffer 118) to output an estimate of what would have been correct data samples according to error signal 108 (i.e., correct data samples in the absence of sampling uncertainty). In combination, sampling error estimator 117 and the resampling circuit (e.g., polynomial estimator 113 and/or data buffer 118), form a feed-forward control system that mitigates conversion errors due to sample-time jitter. As indicated, the entire subcircuit 201 can be substantially replicated any number of times, with each subcircuit including any number of processing branches and with the different subcircuits potentially using different oscillators, and the outputs of all such subcircuits are coupled into second-stage adder 106A in order to produce the final output signal 102.

Figure 13A:
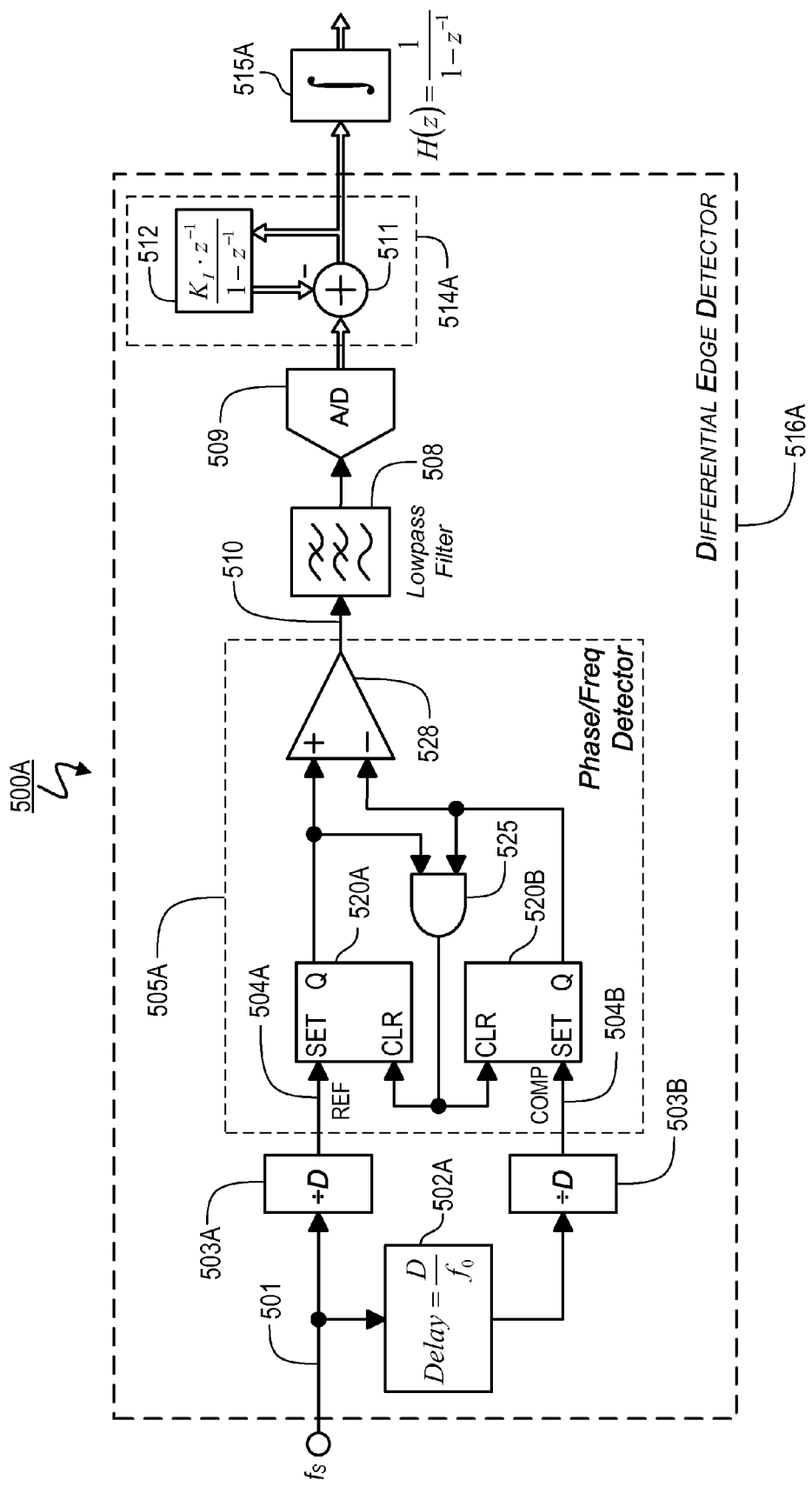
FIG. 13A is a sampling error estimator according to a representative embodiment of the invention that incorporates a differential edge detector, with digital DC offset correction, and a discrete-time integrator.

The preferred sampling error estimator 117, e.g., for use in representative circuits 200A&B shown in FIGS. 9A&B, is circuit 500A shown in FIG. 13A. Although preferred sampling error estimator 500A shares some structural similarities with a conventional frequency-discriminator, such as circuit 70 (which has been used, e.g., for analog FM demodulation) illustrated in FIG. 5A, its principle of operation is substantially different. Deviations in the output amplitude $\Delta y$ of conventional frequency discriminator 70 are proportional to deviations in input frequency $\Delta f$ according to $$\Delta y = \pm K_M \cdot \sin(2\pi \cdot T \cdot \Delta f)$$
$$\approx \pm (2\pi \cdot K_M \cdot T) \cdot \Delta f,$$

where T is the delay associated with the discriminator (i.e., see responses 79A&B illustrated in FIG. 5B) and $2\pi K_M T$ is the constant of proportionality. Due to a periodic (i.e., sinusoidal) output and a conversion sensitivity that depends on delay (i.e., a proportionality constant that is a function of T), conventional frequency discriminator 70 is less sensitive to small frequency deviations than it is to large frequency deviations. Also, the amplitude fluctuations at the output of conventional frequency discriminator 70 are proportional to frequency fluctuations, rather than time-period fluctuations (i.e., actual jitter). In contrast, preferred sampling error estimator 500A directly converts the time-period fluctuations (i.e., the actual jitter) of the signal at its input, into proportional fluctuations in output amplitude. In addition, preferred sampling error estimator 500A overcomes the limitations of conventional frequency discriminators that are related to insensitivity in the detection of small frequency deviations and to ambiguity in the detection of large frequency deviations. The frequency deviation versus output amplitude characteristic for preferred sampling error estimator 500A is overall response 551, shown in FIG. 13B. For detection and estimation of sampling jitter, the preferred response 551 is an improvement over conventional responses 79A&B in two major respects: (1) the frequency deviation versus magnitude response is not frequency dependent, and therefore, the jitter produced by small frequency deviations is detected with the same sensitivity as the jitter produced by large frequency deviations; and (2) there is no ambiguity region which prevents accurate detection of the jitter produced by large deviations in frequency.

Referring to circuit 500A in FIG. 13A, response 551 is generated using: (1) a delay element (e.g., explicit delay 502A); (2) a phase/frequency detector (e.g., detector 505A); and (3) a discrete-time integrator/accumulator (e.g., integrator 515A). In addition, preferred sampling error estimator 500A includes: (1) a first frequency divider (e.g., binary counter 503A), with an input coupled to the input signal and an output coupled to a reference input of the phase/frequency detector; (2) a second frequency divider (e.g., binary counter 503B), with an input coupled to the output of the delay element and an output coupled to the comparison input of the phase/frequency detector; (3) a bandlimiting device (e.g., lowpass filter 508), with an input coupled to the output of the phase/frequency detector; (4) an analog-to-digital converter (e.g., circuit 509), with an input coupled to the output of the bandlimiting device; and (5) a conventional offset correction circuit (e.g., circuit 514 comprised of adder 511 and loop filter 512), with an input coupled to the output of the analog-to-digital converter and an output coupled to the input of the discrete-time integrator. In the present embodiment, input signal 501 is a sample-rate clock with logic transitions (i.e., rising/falling edges) that define the sample-time intervals (i.e., $T_S=1/f_S$) for the $K_j$ processing branches which are associated with the sampling error estimator (e.g., processing branches 110B&C or 120B&C in FIGS. 9A&B). In the present embodiment, input clock signal 501 is coupled to the reference input (REF) of phase/frequency detector 505A via frequency divider 503A, and is coupled to the comparison input (COMP) of phase/frequency detector 505A via delay element 502A and frequency divider 503B. In alternate embodiments, however, input signal 501 can be directly coupled to the reference input, and coupled to the comparison input via delay element 502A (i.e., dividers 503A&B are absent). Also, in the present embodiment, delay 502A is an explicit circuit element, implemented for example as a physical delay. But in alternate embodiments, the delay can be integrated with the phase/frequency detector as an implicit or pipeline (i.e., register) delay, and input signal 501 can be directly coupled to the comparison input of the phase/frequency detector. As used herein, the term "coupled", or any other form of the word, is intended to mean either directly connected or connected through one or more other processing blocks, e.g., for the purpose of preprocessing. In any event, the purpose of delay element 502A is to delay signal 504B provided to the comparison input of phase/frequency detector 505A, by one clock cycle relative to signal 504A provided to the reference input of phase/frequency detector 505A. It should be noted that, in this respect, the purpose of delay element 502A in the present embodiment of circuit 500A, is different from the purpose of the delay element (e.g., delay 72B shown in FIG. 5A) utilized in conventional frequency discriminator 70. Unlike preferred sampling error estimator 500A, a conventional frequency discriminator utilizes a relatively long delay element to create the frequency-dependent phase shift needed for frequency demodulation applications (i.e., conventional delay 72B is not used to create a delay of approximately one clock cycle).

Preferred phase-frequency detector 505A is an edge-triggered (i.e., transition-sensitive) device, comparable in operation to a conventional MC100EP40/140 device from ON Semiconductor, which produces a pulse-modulated output that is a function of the time difference between the logic transitions (i.e., rising or falling edges) of the signal at its reference input (i.e., signal 504A), and the logic transitions of the signal at its comparison input (i.e., signal 504B). In alternate embodiments, the phase/frequency detector function may be performed by a digital or analog multiplier, such as a conventional XOR gate or a conventional diode-bridge mixer. Specifically, the operation of circuit 505A is such that: (1) when the clock transitions at the reference input are precisely aligned in time with the clock transitions at the comparison input, flip-flops 520A&B are reset and the output of differential amplifier 528 is zero; (2) when the clock transition at the reference input occurs earlier in time than the clock transition at the comparison input (i.e., the reference clock edge leads the comparison clock edge), flip-flop 520A is set for a period of time that is equal to the time difference between the clock transitions (i.e., ignoring the latency in logic gate 525), and the output of differential amplifier 528 is a positive pulse; and finally (3) when the clock transition at the reference input occurs later in time than the clock transition at the comparison input (i.e., the reference clock edge lags the comparison clock edge), flip-flop 520B is set for a period of time that is equal to the time difference between the clock transitions, and the output of differential amplifier 528 is a negative pulse. The pulsed output of differential amplifier 528 is then processed by lowpass filter 508 to produce analog (continuously variable) voltage 510, which is proportional to the time difference between the reference and comparison clock edges (i.e., voltage 510 is proportional to the width of the output pulses of differential amplifier 528). The purpose of frequency dividers 503A&B is to reduce the rate at which phase-frequency detector 505A operates. Preferably the frequency divider ratio D=1 (i.e., the input and output frequencies of the divider are equal), but in alternate embodiments D>1, such that phase-frequency comparisons are made at a rate that is less than the input frequency $f_S$. When divider ratio D>1, delay element 502A preferably has a delay equal to $D/f_S$, where $f_S$ is the nominal frequency of sample clock input 501, so that again, signal 504B provided to the comparison input of phase/frequency detector 505A, is delayed by one clock cycle relative to signal 504A provided to the reference input of phase/frequency detector 505A.

Further processing ultimately converts filtered output 510, of phase/frequency detector 505A, into a digital value that is proportional to the time-period fluctuations φ (i.e., actual jitter) of sample clock input 501. Although this further processing is described below with respect to a frequency divider ratio D=1, such that phase-frequency detector 505A makes comparisons at a rate that is equal to the input frequency, those skilled in the art can readily adapt this processing to embodiments with arbitrary frequency divider ratios. Analog-to-digital converter circuit 509 transforms the analog voltage at the output of lowpass filter 508, into a digital value in the preferred embodiment of circuit 500A. But in alternate embodiments, processing can occur entirely in the analog/RF domain, such as in exemplary circuit 500B illustrated in FIG. 13C. Referring to circuit 500A, when the input signal to phase-frequency detector 505A is a jitter-corrupted clock with period $T=T_{nom}+\phi$ (i.e., nominal period $T_{nom}$ and jitter $\phi$), and delay element 502A has a matched delay equal to $T_{nom}$ (i.e., due to a frequency divider ratio D=1), an equivalent discrete-time representation $\Delta y_n$ of filtered output 510 is given by the difference equation $$\Delta y_n = K_P \cdot (T_n + \varphi_n - T_{n-1} - \varphi_{n-1})$$
$$= K_P \cdot (T_{nom} + \varphi_n - T_{nom} - \varphi_{n-1})$$
$$= K_P \cdot (\varphi_n - \varphi_{n-1}),$$

such that $$\Delta Y(z) = K_P \cdot \varphi(z) \cdot (1 - z^{-1}) \rightarrow \Delta y_n = K_P \cdot \frac{\Delta}{\Delta t} \varphi_n,$$

where the

"$\frac{\Delta}{\Delta t}$"

operator represents discrete-time differentiation. The constant of proportionality $K_P$, which is independent of delay 502A, is a function of the gain of differential amplifier 528 and the logic levels (e.g., emitter-coupled logic, current-mode logic, etc.) associated with phase-frequency detector 505A. The filtered output 510 has the differentiator response 552 shown in FIG. 13B, conditioned upon delay element 502A having a delay that is greater than zero and less than $2 \cdot T_{nom}$. Under this condition, filter output 510 is the difference in duration between two adjacent clock periods, and is a quantity that sometimes is referred to in the prior art as cycle-to-cycle jitter. A circuit that quantifies the difference in duration between two adjacent clock periods is sometimes referred to herein as a differential edge detector. Differentiator response 552 is such that low-frequency fluctuations are appreciably attenuated, while high-frequency fluctuations are only nominally attenuated.

If the delay of delay element 502A is other than $T_{nom}$ (i.e., but within the range of zero to $2 \cdot T_{nom}$), filtered output 510 is offset by a relatively static (constant) amount which is proportional to the difference between $T_{nom}$ and the actual delay. The purpose of offset correction circuit 514A is to remove, prior to integration by discrete-time integrator 515A, any offsets (i.e., DC biases) in filtered output 510 that result from unintended variations in delay element 502A and/or other circuits (e.g., due to temperature or manufacturing tolerances). By degrading the accuracy of the sampling error estimator, these offsets limit the extent to which sampling jitter is mitigated, and thereby, increase residual quantization noise at the output of the resampling filter bank (e.g., output 109 of resampling filter bank 114C&D shown in FIGS. 9A&B). In the present embodiment, offset correction circuit 514A is a conventional first-order feedback loop (i.e., servo loop) which implements the difference equation $$y_n = \Delta y_n - \Delta y_{n-1} + (1 - K_1) \cdot y_{n-1},$$

where: (1) $\Delta y_n$ is the output of analog-to-digital converter 509; (2) $y_n$ is the output of adder 511; and (3) $K_I$ is a programmable loop parameter. In the present embodiment, the input to loop filter 512 is the output of adder 511. In alternate embodiments, however, the input to loop filter 512 can be the output of integrator 515A. Also, in alternate embodiments, the entire offset correction function can be implemented using other conventional techniques, such as for example AC-coupling. In the present embodiment, the output level of loop filter 512 adapts to force the mean level at the output of adder 511 to zero (i.e., the servo loop reaches steady-state when the loop filter input has an average value of zero). More specifically, for an offset of $\Delta y_n = C$ (i.e., C is a constant value), it can be shown from the final value theorem of the Z-transform that $y_n$ converges to a steady-state value of zero:

$$\lim_{n \to \infty} y_n = \lim_{z \to 1}(z - 1) \cdot Y(z)$$
$$= \lim_{z \to 1}(z - 1) \cdot \left(\frac{z - 1}{z - (1 - K_I)}\right) \cdot \Delta Y(z)$$
$$= \lim_{z \to 1}(z - 1) \cdot \left(\frac{z - 1}{z - 1 + K_I}\right) \cdot \left(\frac{C}{z - 1}\right) = 0.$$

Programmable loop parameter $K_I$ determines the tracking and acquisition dynamics of offset correction loop 514A, such that: (1) small $K_I$ improves tracking performance by minimizing variations in the offset estimate at the expense of increased adaptation time (i.e., variance at the output of loop filter 512 is minimized); and (2) large $K_I$ improves acquisition performance by minimizing adaptation time at the expense of increased variations in the offset estimate. Since the purpose of the offset correction loop is to cancel relatively static (i.e., slowly varying) offsets, loop parameter $K_I$ preferably is small to improve tracking performance and minimize variances in the output of loop filter 512. Although exemplary sampling error estimator 500A utilizes conventional offset correction circuit 514A, offsets at filtered output 510 are more preferably cancelled via methods that utilize feedback to directly minimize the residual quantization noise at the output of the resampling filter bank (e.g., by adjusting the offset correction value until the signal-plus-noise level at output 109 of resampling filter bank 114C&D is minimized). For example, applicable methods of using residual quantization noise to compensate for circuit imperfections are disclosed in U.S. patent application Ser. No. 12/824,171 (filed on Jun. 26, 2010 by the present inventor) and titled "Sampling/Quantization Converters".

Assuming the output of loop filter 512 is zero, such that the output of adder 511 is equal to filtered output 510, the output of discrete-time integrator 515A has a value that is directly proportional to the jitter $\phi$ appearing on input 501. Discrete-time integrator 515A has response 553 (i.e., shown in FIG. 13B), for a time constant of integration equal to $T_{nom}$, such that the output of the integrator $\Delta_n$ can be represented by the difference equation $$\Delta_b = y_n + \Delta_{n-1},$$

where $y_n$ is the integrator input (i.e., the output of differential edge detector 516A). Accordingly, the output of integrator 515A is given by $$\Delta_n = y_n + \Delta_{n-1}$$
$$= K_P \cdot (\varphi_n - \varphi_{n-1}) + \Delta_{n-1},$$

such that $$\Delta(z) = K_P \cdot \varphi(z) \cdot (1 - z^{-1}) \cdot \left(\frac{1}{1-z^{-1}}\right)$$
$$= K_P \cdot \varphi(z) \to \Delta_n$$
$$= K_P \cdot \varphi_n.$$

Figure 13B:
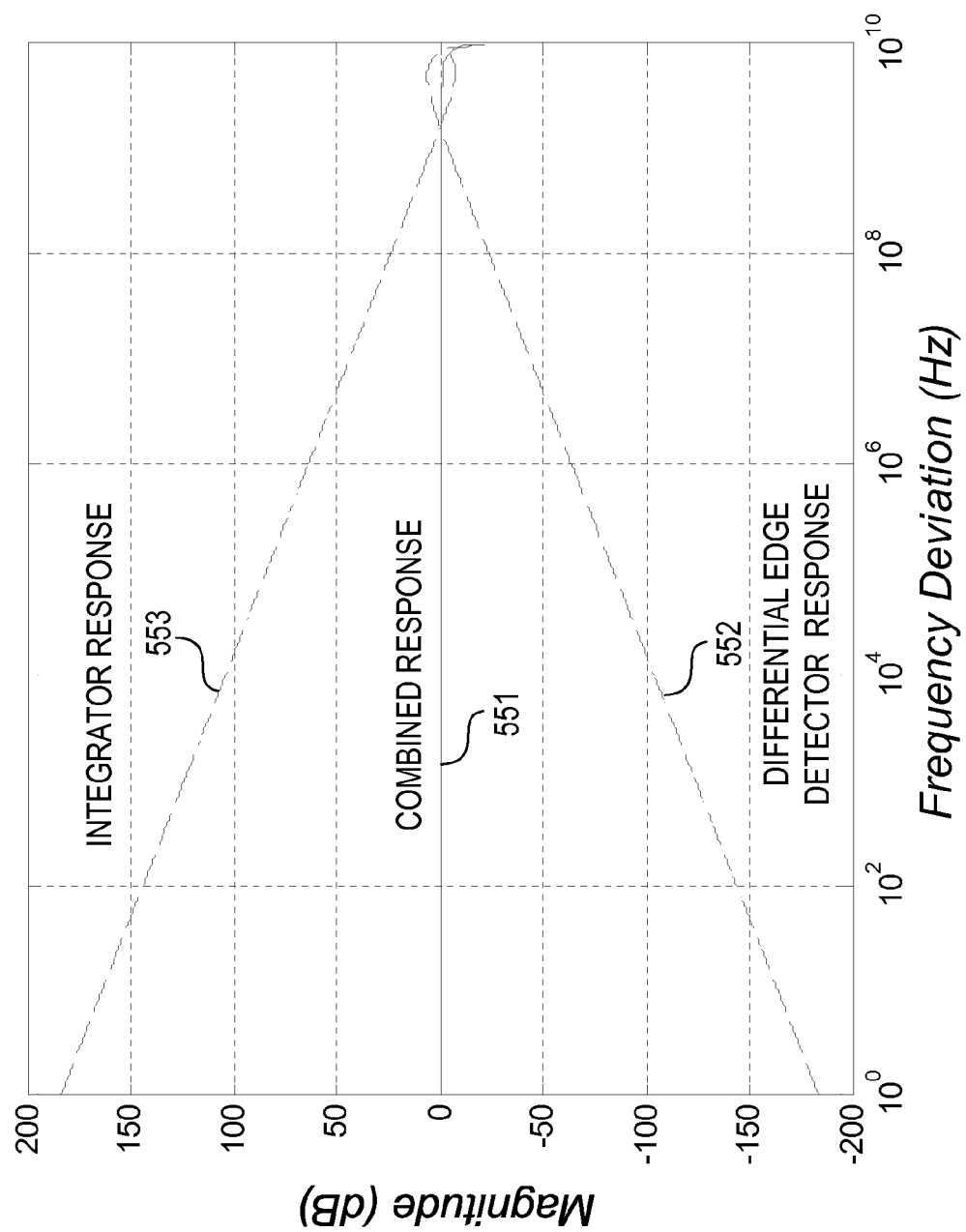
FIG. 13B is a plot of jitter transfer functions for a sampling error estimator according to a representative embodiment of the invention with respect to output magnitude in dB (y-axis) versus frequency deviation in hertz (x-axis)

Preferably, the time constant of integration is exactly equal to $T_{nom}$ (i.e., the discrete-time integrator is clocked at a rate equal to $1/T_{nom}$ for an exemplary frequency divider ratio of D=1), or otherwise, is approximately equal to $T_{nom}$. (Those skilled in the art will readily appreciate that the time constant of integration is more generally equal to $D \cdot T_{nom}$, where D is the frequency divider ratio.) Referring to FIG. 13B, integrator response 553 equalizes the differentiator response 552 of differential edge detector 516A, to produce overall (combined) response 551. Overall frequency-to-magnitude response 551 of sampling error estimator 500A is all-pass, such that fluctuations in the frequency of input signal 501 are converted to fluctuations in output magnitude with a constant of proportionality that is frequency independent (i.e., small frequency fluctuations are not attenuated more than large frequency fluctuations). Therefore, preferred sampling error estimator 500A provides a suitable means for correcting conversion errors related to sampling uncertainty (jitter). It should be noted that since sample-time jitter is assumed to be zero-mean (i.e., sample-time jitter is defined as a variance about a nominal sample-rate period), the accumulated unit-interval offset produced by sample-time jitter is also zero-mean. Therefore, the output of integrator 515A is bounded, and integrator 515A may be implemented as either a standard integrator (i.e., an integrator with an output that saturates on overflow) or as a modulo integrator (i.e., an integrator with an output that wraps on overflow).

Figure 5A:
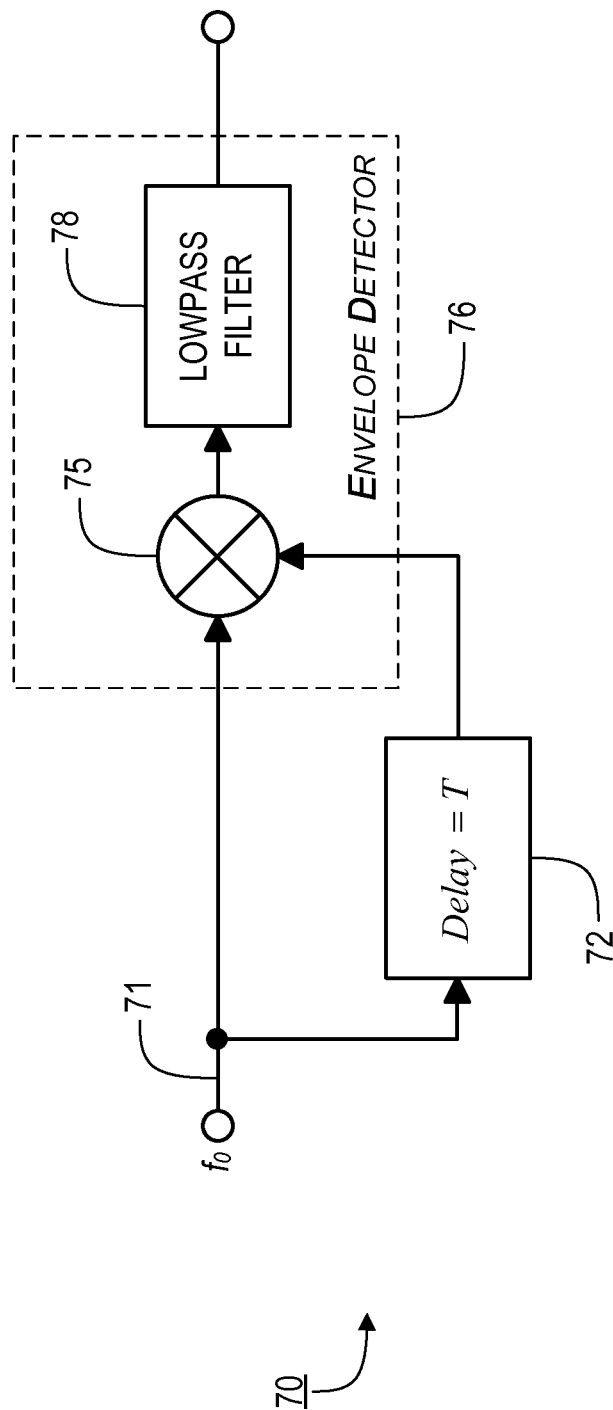
FIG. 5A is a block diagram of a conventional frequency discriminator circuit that incorporates a delay element, a mixer, and a lowpass filter.
Figure 5B:
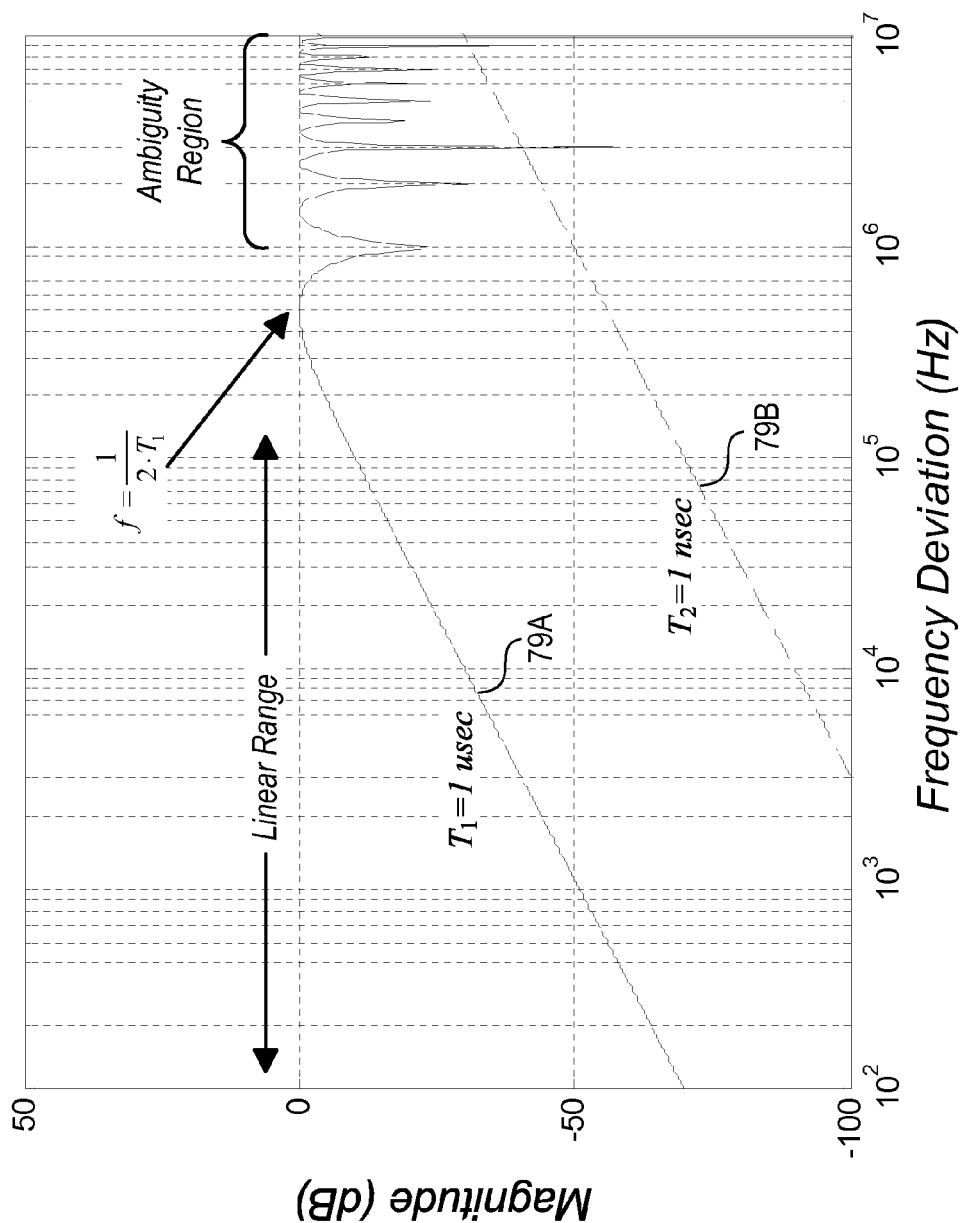
FIG. 5B is a plot of frequency responses for a conventional frequency discriminator circuit with respect to output magnitude in dB (y-axis) versus input frequency deviation in hertz (x-axis).

A conventional frequency discriminator, e.g., similar to circuit 70 in FIG. 5A, can be enhanced for use as a sampling error estimator according to the preferred embodiments. The present inventor has determined that deviations in instantaneous frequency $\Delta f$ are related to jitter $\varphi$ according to the relationship $$\Delta f = f_0 \cdot \frac{d}{dt}\varphi,$$

where $f_0$ is the nominal frequency at the discriminator input. Therefore, the variations in discriminator output amplitude $\Delta y$ are related to input jitter $\varphi$ according to the equation $$\Delta y \approx 2\pi \cdot K_M \cdot T \cdot \Delta f$$
$$\approx 2\pi \cdot K_M \cdot T \cdot \left(f_0 \cdot \frac{d}{dt}\varphi\right);$$

and with the addition of a suitable integrator function (e.g., standard or modulo integrator in the digital or analog domain), the output amplitude $\Delta_n$ of the modified discriminator is $$\Delta_n = \tilde{K}_M \cdot \varphi_n,$$

where $T=1/f_0$ and $\tilde{K}_M = 2\pi \cdot K_m$. An enhanced frequency discriminator, according to the preferred embodiments, is exemplary sampling error estimator 500B, illustrated in FIG. 13C. It should be noted that unlike conventional frequency discriminator 70, where delay T is typically set to be as long as practical, sampling error estimator 500B incorporates delay element 502B, which has a delay T that is equal to the nominal sampling clock period of $1/f_S$ (i.e., plus or minus an additional delay of ¼·T to produce a quadrature relationship between the signals at the inputs of mixer 505B). The operation of alternate sampling error estimator 500B is similar to that of preferred sampling error estimator 500A, except that: (1) circuit 500B utilizes a continuous-time integrator (e.g., circuit 515B) that is suitable for implementation at high sample-rate frequencies (e.g., such as microwave frequencies greater than 1 gigahertz); and (2) circuit 500B utilizes AC-coupling (i.e., via capacitor 514B) to remove offsets that are introduced by unintended variations in delay element 502B and/or other circuits.

A conventional microwave integrator cannot fully equalize the differentiator response at lowpass filter output 518 of exemplary sampling error estimator 500B (i.e., cannot fully equalize the response of differential edge detector 516B). Conventionally, microwave integrators are implemented using a transconductance (g, amplifier (i.e., current source or charge pump) to drive a capacitive load (i.e., a shunt capacitor). Ideally, the source impedance of the transconductance amplifier is infinite, such that the transconductance amplifier approximates a perfect current source. Compared to ideal integrator response 554 illustrated in FIG. 13D, however, the present inventor has discovered that the response 555 of a conventional microwave integrator is degraded at low frequencies (i.e., the magnitude versus frequency response flattens) as a result of physical design constraints that prevent controlled impedances from exceeding about 200 ohms (i.e., at microwave frequencies, the source impedance of current sources cannot exceed more than a few hundred ohms). To overcome the limitations of conventional integrators at microwave frequencies, therefore, exemplary sample error estimator 500B employs preferred microwave integrator 515B (i.e., shown in FIG. 13C), which uses feedback to realize near-perfect integrator response 556. Compared to conventional microwave integrators, the operation of preferred microwave integrator 515B does not depend on maintaining controlled impedances that are nearly infinite More specifically, preferred microwave integrator 515B performs continuous-time accumulation of input signal 518 using a structure that includes: (1) a signal combiner (e.g., power combiner 520A) with a first input coupled to the input signal; (2) a gain block (e.g., amplifier 525) coupled to the output of the power combiner; (3) a signal distributor (e.g., power splitter 520B) with an input coupled to the output of the gain block and two outputs; and (4) a bandlimiting device (e.g., lowpass filter 523 and delay element 524) with an input coupled to one output of the signal distributor and an output coupled to a second input of the signal combiner. As used herein, the term "coupled", or any other form of the word, is intended to mean either directly connected or connected through one or more other processing blocks, e.g., for the purpose of preprocessing. Preferably, the response of the bandlimiting device: (1) exhibits constant group delay and insertion gain/loss over the usable frequency range of the integrator (i.e., frequencies below which the integrator has gain of +10 dB or more); and (2) approaches zero at frequencies that exceed the usable frequency range of the integrator (i.e., frequencies above which the integrator has gain of less than +10 dB). This preferred bandlimiting response ensures that the integrator will have sufficient open-loop gain margin and phase margin for stable operation.

Figure 13C:
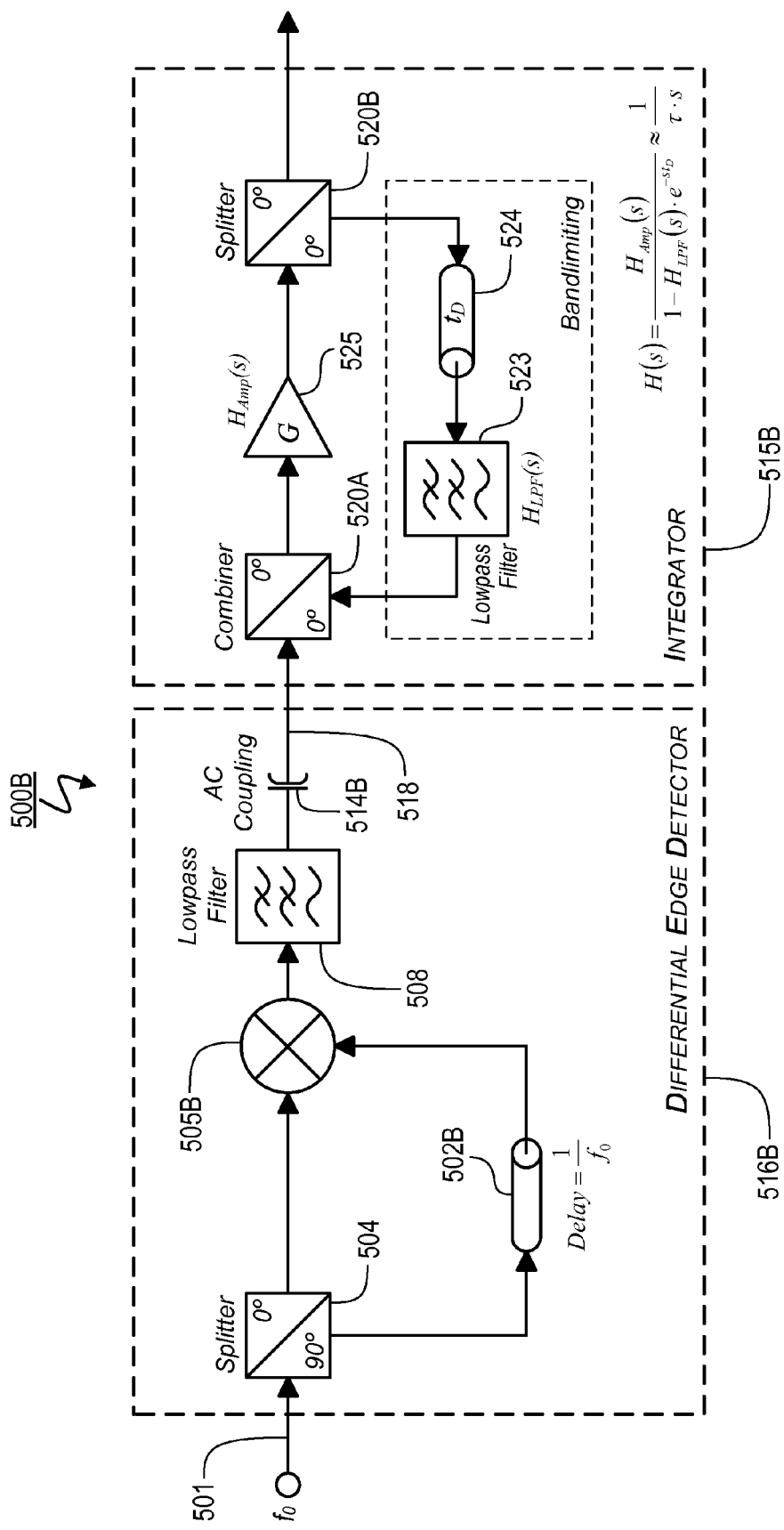
FIG. 13C is a block diagram of a sampling error estimator according to a second representative embodiment of the invention that incorporates a differential edge detector, with AC-coupling, and a continuous-time integrator.
Figure 13D:
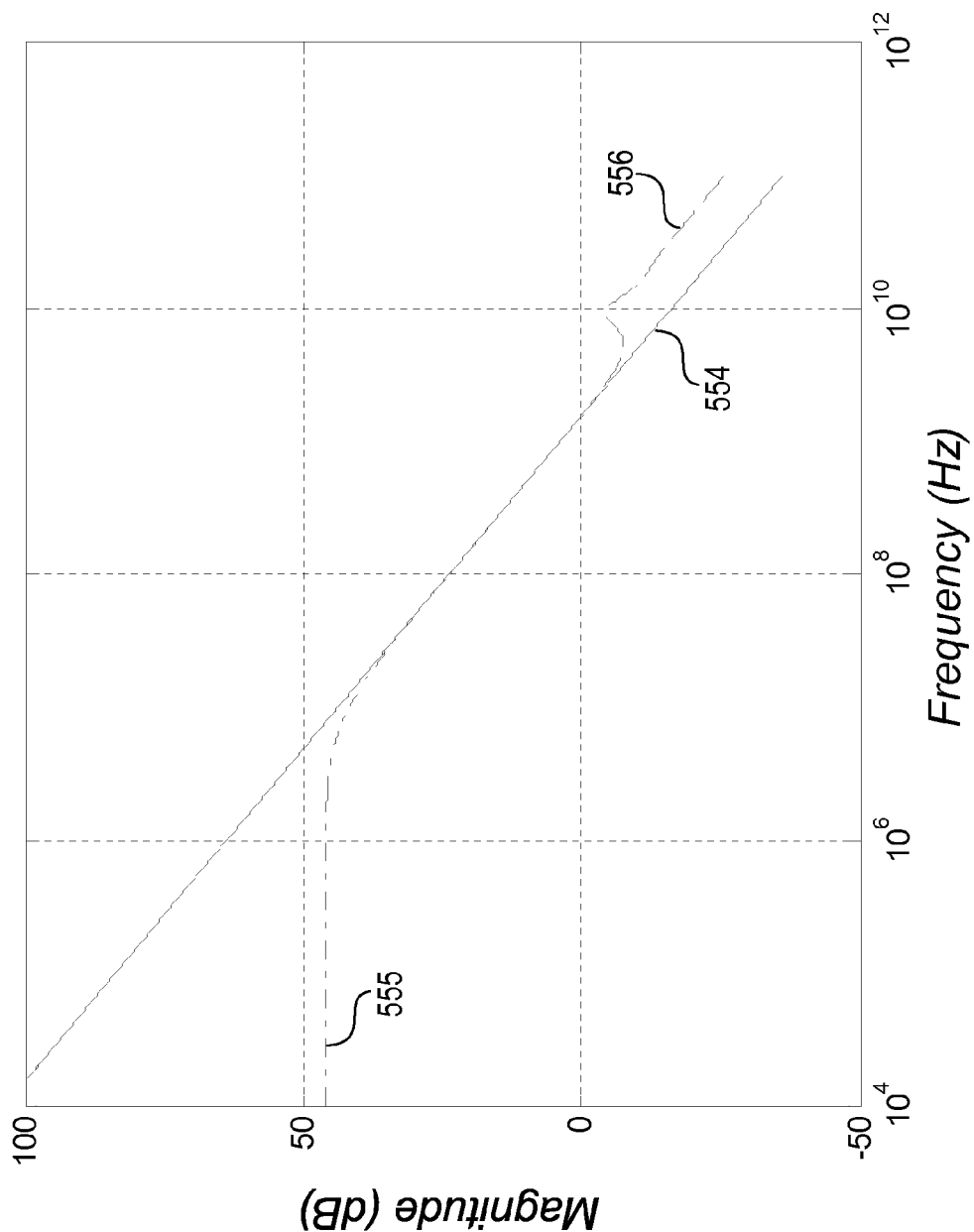
FIG. 13D is a plot comparing the frequency responses of a conventional analog integrator, an ideal integrator, and a continuous-time integrator according to a representative embodiment of the invention with respect to magnitude in dB (y-axis) versus frequency in hertz (x-axis).

Referring to FIG. 13C, it can be shown that if the gain G of amplifier 525 is approximately +3 dB, the loop gain from the input of combiner 520A to the output of the bandlimiting device is unity (i.e., total feedback loop loss/gain is 0 dB), and the continuous-time transfer function of preferred microwave integrator 515B is given by $$H(s) = \frac{H_{Amp}(s)}{1 - H_{LPF}(s) \cdot e^{-st_D}} \approx \frac{1}{\tau \cdot s},$$

where the time constant of integration τ is equal to the nominal group delay within the passband of the bandlimiting device (i.e., the combined group delay of lowpass filter 523 and delay element 524). Curve 556 of FIG. 13D is a plot of the transfer function of integrator 515B with respect to output magnitude in dB (y-axis) versus frequency in hertz (x-axis). As illustrated in FIG. 13D, the response of continuous-time integrator 515B deviates from that of an ideal integrator (i.e., response 554 in FIG. 13D) only in the unusable high-frequency region where the integrators have run out of gain (i.e., magnitude is negative). Therefore, the continuous-time integrator of embodiment 500B provides superior integration functionality compared to a conventional microwave integrator circuit. It should be noted that such an integrator function serves as a primary processing block in many electronic applications, including electronic filtering. For example, relatively arbitrary filter responses can be realized using structures, referred to in the prior art as state-variable filters, which are comprised of integrators (e.g., integrator 515B), distribution nodes (e.g., power splitter 520B), and summing junctions (e.g., power combiner 520A). See "A Filter Primer", AN-733, Maxim Integrated, 2008 and Zumbahlen, H., "State Variable Filters", MT-223, Analog Devices, 2012. Therefore, preferred microwave integrator 515B has utility in applications that go beyond the method for sampling error estimation that is described above.

Referring back to representative circuits 200A&B in FIGS. 9A&B, when the output frequency (i.e., sample-rate frequency) of sample-rate clock source 111B has been corrupted by noise and/or circuit instabilities that produce frequency fluctuations (e.g., resulting in jitter, wander, or drift), the output $\Delta_n$ of sampling error estimator circuit 117 fluctuates by an amount that is proportional to the resultant time-period jitter, as described above. Similarly, fluctuations in the frequency of the sample-rate clock (e.g., the output of oscillator 111B) produce corresponding errors in the values (magnitudes) of the signals at the output of the bandlimiting circuits (e.g., digital bandpass filter 115A or 125A, or bandpass interpolation filters 115B or 125B). The response of the bandlimiting circuits, however, introduces delay and amplitude transients (e.g., group delay variation and passband droop) that degrade the correlation between the time-period errors detected by the sampling error estimator, and the actual sampling errors in the outputs of the bandlimiting circuits. Therefore, sampling error estimator 117 preferably includes a means for replicating the delay transients of the bandlimiting response, and more preferably, includes a means for replicating both the delay and amplitude transients of the bandlimiting response, such that the error signal at the output of sampling error estimator 117 is strongly correlated with the actual sampling errors present in the output of the bandlimiting circuits (e.g., digital bandpass filter 115A or 125A, or bandpass interpolation filters 115B or 125B). In the preferred embodiments, the bandlimiting circuits have a cosine-modulated window response or a bandpass moving-average response (as discussed in more detail in the Digital Bandlimiting (Signal Reconstruction) Considerations section below), such that replication of the bandlimiting response is realized via a lowpass prototype filter, with a discrete-time transfer function $g'_k(n)$ given by $$g'_k(n) = \frac{g_k(n)}{\cos(2\pi \cdot n \cdot \omega_k / f_S)},$$

where: (1) $g_k(n)$ is the equivalent or actual discrete-time transfer function of the bandlimiting circuit(s) in the associated resampling filter bank; (2) $\omega_k$ is the center of the frequency response produced by impulse response $g_k(n)$; and (3) $f_S$ is the frequency of the sample-rate clock (e.g., the clock sourced by oscillator 111B). It should be noted that when $\omega_k=0$, the bandlimiting circuit has a lowpass response and $g'_k(n)=g_k(n)$. In the preferred embodiments, the transfer function $g'_k(n)$ is applied to the curve-fit interpolant $\Delta_n$, which sample error estimator 117 provides to the resampling filter bank. Based on the value of curve-fit interpolant $\Delta_n$, the resampling filter bank utilizes polynomial estimation and rate buffering to fabricate output samples which are corrected for the errors caused by sampling uncertainty (jitter). In the various embodiments of the present invention, polynomial estimation is based on linear or nonlinear (e.g., sinusoidal or cubic) interpolation between the sampled data values provided to the resampling filter bank.

Figure 14A:
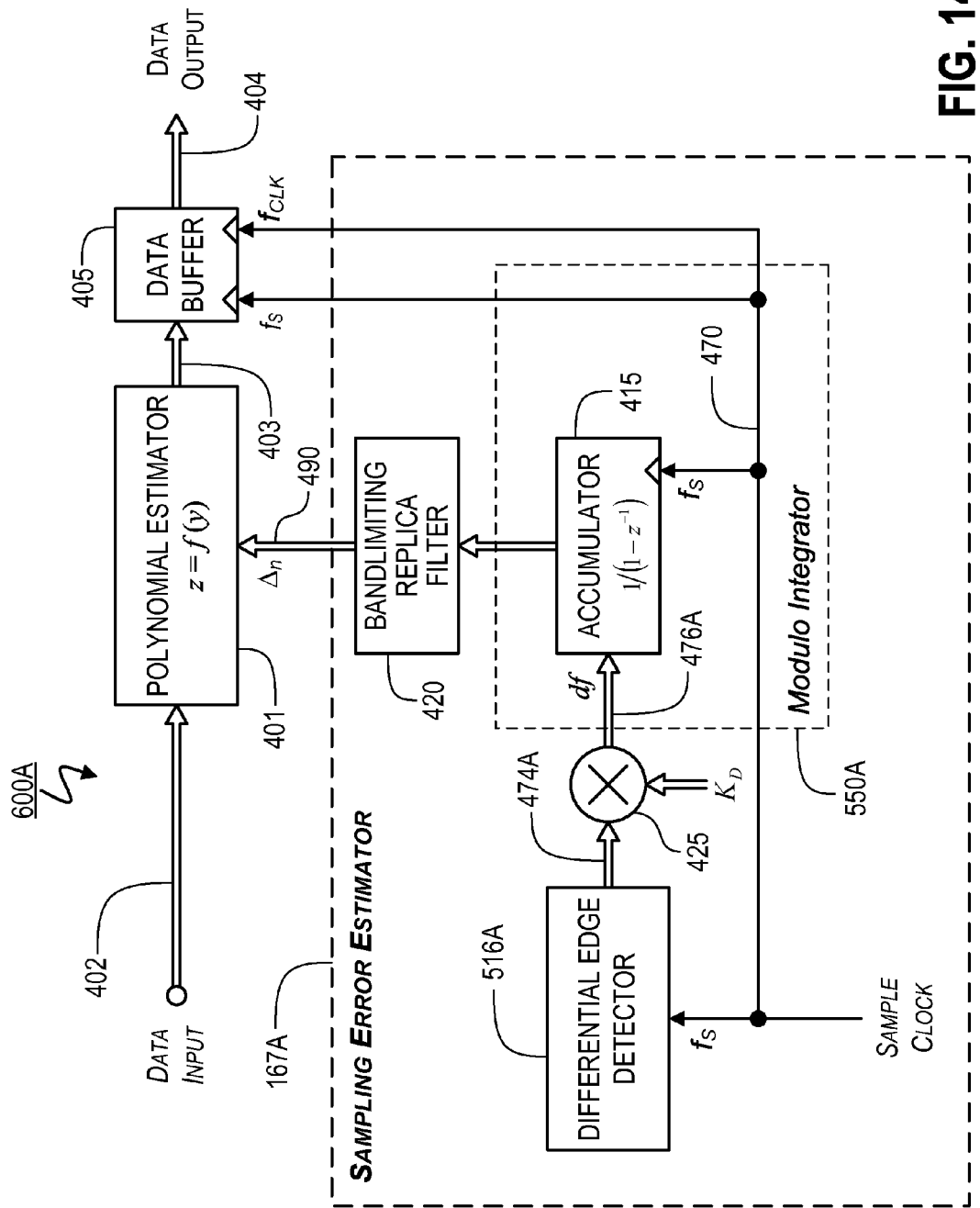
FIG. 14A is an exemplary implementation of a resampling interpolator circuit that uses a polynomial estimator, a sampling error estimator, and a data buffer to digitally compensate for sample-rate uncertainty.
Figure 14B:
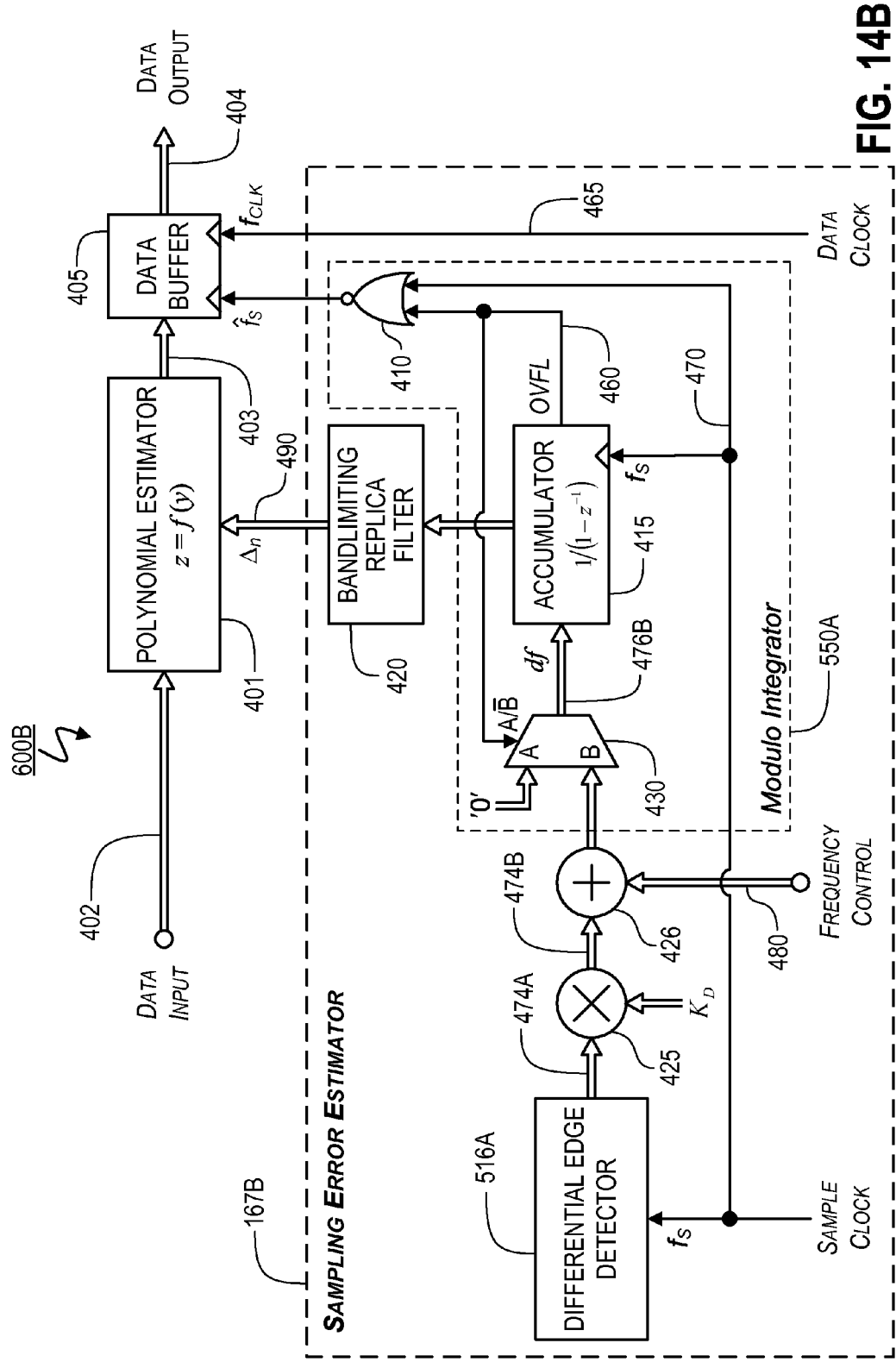
FIG. 14B is an exemplary implementation of a resampling interpolator circuit that uses a polynomial estimator, a sampling error estimator, and a data buffer to digitally compensate for both sample-rate uncertainty and differences between a sample-rate frequency and a conversion-rate frequency.

In the preferred embodiments, digital resampling within a resampling filter bank, compensates for undesired fluctuations (i.e., and resultant jitter) in sample-rate frequency $f_S$, e.g., using exemplary circuits 600A&B shown in FIGS. 14A&B. Polynomial estimator 401 is implemented as a distinct circuit (e.g., circuit 600A), or as an embedded function within a bandpass interpolation filter (e.g., bandpass interpolation filters 115B and 125B of circuit 600B). The operation of circuit 600A is similar to that of circuit 400A in FIG. 10A, except that: (1) the frequency control input (e.g., input 476A provided to accumulator 415) is generated by differential edge detector 516A, based on the difference in duration between two adjacent periods of sample-rate clock 470; and (2) input samples enter and exit data buffer 405 at the same rate (i.e., sample-rate frequency $f_S$), because sampling jitter does not produce a mean shift in nominal frequency (i.e., the accumulated unit-interval offset produced by sample-time jitter is assumed to be zero-mean). The operation of circuit 600B is also similar to that of circuit 400A, except that the frequency control input (e.g., input 476B provided to accumulator 415) is a combination of: (1) automatic frequency control (AFC) value 474B, which accounts for undesired fluctuations (i.e., and resultant sampling jitter) in the sample-clock frequency $f_S$; and (2) manual frequency control (MFC) value 480, which accounts for nominal differences between the sample-rate frequency $f_S$ and the conversion-rate frequency $f_{CLK}$. Automatic frequency control values 476A and 474B preferably are scaled versions of output 474A from differential edge detector 516A. In circuits 600A&B, a scaling term $K_D$ is applied to the output of differential edge detector 516A using multiplier 425; and in circuit 600B, the AFC value is combined with the MFC value within adder 426.

As described above, a differential edge detector according to the preferred embodiments produces an output that is proportional to the derivative of sample-rate jitter $\phi$. For a scaling factor of $K_D$, therefore, the resulting output $\Delta_n$ of sampling error estimator 167A&B is $$\Delta_n = g'_k * \sum_n K_D \cdot \left(K_P \cdot \frac{\Delta}{\Delta t} \varphi_n\right)$$
$$= g'_k * K_D \cdot K_P \cdot \varphi_n,$$

where: (1)

$$\frac{\Delta}{\Delta t} \varphi$$

is the discrete-time derivative (i.e., first difference) of φ; (2) $g'_k$ is the discrete-time impulse response of bandlimiting replica filter 420; and (3) the "*" operator represents discrete-time linear convolution according to $$u_n * v_n = \sum_m u_{n-m} \cdot v_m.$$

Bandlimiting replica filter 420 replicates the delay and amplitude transients in the sampling errors at the input of polynomial estimator 401. As will be readily appreciated, the function of bandlimiting replica filter 420 can be moved upstream of accumulator 415 using a filter with transfer function $$\frac{\Delta}{\Delta t} g'_k.$$

A scaling factor of $$K_D = \frac{1}{K_P}$$

(or $1/\tilde{K}_M$ for exemplary sampling error estimator 500B) is preferably applied to the automatic frequency control (AFC) value at the input of accumulator 415, such that the output of the preferred sampling error estimator (e.g., sampling error estimator 167A&B) is $$\Delta_n = g'_k * \phi_n.$$

More preferably, the value of scaling factor $K_D$ is dynamically set to minimize the residual quantization noise at the output of the resampling filter bank (e.g., output 109 of resampling filter bank 114C&D). This condition results when the sampling error estimate is closely matched to the actual fluctuations in the sample-rate period. Applicable methods for utilizing feedback to directly minimize the residual quantization noise at the output of an oversampled data converter (e.g., by adjusting a scaling factor until the signal-plus-noise level at the output of a processing branch is minimized) are disclosed in U.S. patent application Ser. No. 12/824,171 (filed on Jun. 26, 2010 by the present inventor) and titled "Sampling/Quantization Converters".

Digital Bandlimiting (Signal Reconstruction) Considerations

The primary considerations for the digital bandlimiting circuit, implemented as either a distinct filtering element (e.g., bandpass filters 115A, 125A, and 135A) or as a composite filtering element (e.g., bandpass interpolation filters 115B, 125B, and 135B), according to the preferred embodiments of the present invention are: (1) design complexity (preferably expressed in terms of required multiplications and additions); (2) frequency response (particularly stopband attenuation); (3) amplitude and phase distortion; and (4) latency. The best converter-resolution and jitter-tolerance performance is obtained for digital filtering elements having frequency responses that exhibit high stopband attenuation, which generally increases with increasing filter order. In addition, it is preferable for the digital bandlimiting responses to have suitable (e.g., perfect or near-perfect) signal-reconstruction properties to prevent conversion errors due to amplitude and phase distortion. Amplitude and phase distortion in the response of the digital filtering element is a particularly important consideration because, unlike noise from quantization and jitter, distortion levels do not improve as the order of the bandlimiting response increases, or as the number of parallel-processing branches M increases. Therefore, bandlimiting filter distortion prevents converter resolution from improving with increasing filter order or with increasing M. Also, although stopband attenuation generally increases with filter order, increases in filter order result in greater processing latencies, especially for transversal, finite-impulse-response (FIR) filters. Digital bandlimiting responses with low latency are preferred to support applications where latency can be a concern, such as those involving control systems and servo mechanisms. For these reasons, the jitter-tolerant converter preferably employs bandpass moving-average (BMA) filters as bandlimiting circuits, which can result in: (1) high levels of stopband attenuation (i.e., attenuation of noise from quantization and jitter); (2) insignificant amplitude and phase distortion (i.e., near-perfect signal reconstruction); and (3) significantly lower complexity than other filtering approaches.

For high-resolution converter applications (e.g., requiring up to 10 bits of conversion accuracy), the present inventor has discovered that conventional, transversal window filters (e.g., Blackman-Harris, Hann or Kaiser window filters) have suitable stopband attenuation and signal-reconstruction properties for two-sided bandwidths of $\Omega_B/(N \cdot M)$ and impulse-response lengths of $4 \cdot N \cdot M$, or less, where M is the number of processing branches and N is the excess-rate oversampling ratio (i.e., $$N = \frac{1}{2} \cdot f_s / \Omega_B).$$

Conventionally, the lowpass response of these transversal window filters is transformed into a bandpass (FIR) response via multiplication of the window filter coefficients by a cosine wave, which has a frequency equal to the desired center frequency ($\omega_k$) of the bandpass response (i.e., cosine-modulation). However, the present inventor has also discovered that recursive window filters are a preferable alternative to conventional, transversal FIR filters, because recursive window filters exhibit equivalent properties to transversal window filters, but typically can be implemented more efficiently, i.e., with fewer adds (adders or addition operations) and multiplies (multipliers or multiplication operations). For example, consider a lowpass prototype (i.e., zero-frequency-centered) filter with impulse response $$h_{win}(n) = a_0 - a_1 \cdot \cos\left(\frac{2\pi n}{L-1}\right) + a_2 \cdot \cos\left(\frac{4\pi n}{L-1}\right) - a_3 \cdot \cos\left(\frac{6\pi n}{L-1}\right),$$

where $a_0=0.35875$, $a_1=0.48829$, $a_2=0.14128$, $a_3=0.01168$, and $L=4 \cdot (N \cdot M-1)$. This filter response, which is defined in the prior art as the response of a Blackman-Harris window filter, realizes signal-to-distortion power ratios (SDR) of greater than 84 dB (i.e., 14-bit resolution). As significantly, this filter has a transfer function that can be realized in a recursive form given by $$T_{win}(z) = a_0 \cdot \frac{1-z^{-L}}{1-z^{-1}} - \sum_{i=1}^{3} a_i \cdot \frac{1-\cos\left(\frac{2\pi i}{L-1}\right) \cdot (z^{-1}+z^{-L})+z^{-(L+1)}}{1-2\cdot\cos\left(\frac{2\pi i}{L-1}\right)\cdot z^{-1}+z^{-2}},$$

which requires only 10 multiply operations for lowpass filtering, regardless of the filter impulse response length L. Additional multiplication operations are required for transforming the lowpass prototype response to a bandpass response, preferably using quadrature downconversion followed by quadrature upconversion, but the recursive window filters still represent a considerable complexity savings over the transversal FIR approaches used in conventional filter banks. However, the present inventor has discovered that when recursive window filters of this form are implemented using high-frequency, parallel-processing methods, such as conventional polyphase decomposition, the complexity costs associated with coefficient dynamic range expansion can exceed any complexity savings afforded by the recursive structure.

Figure 15A:
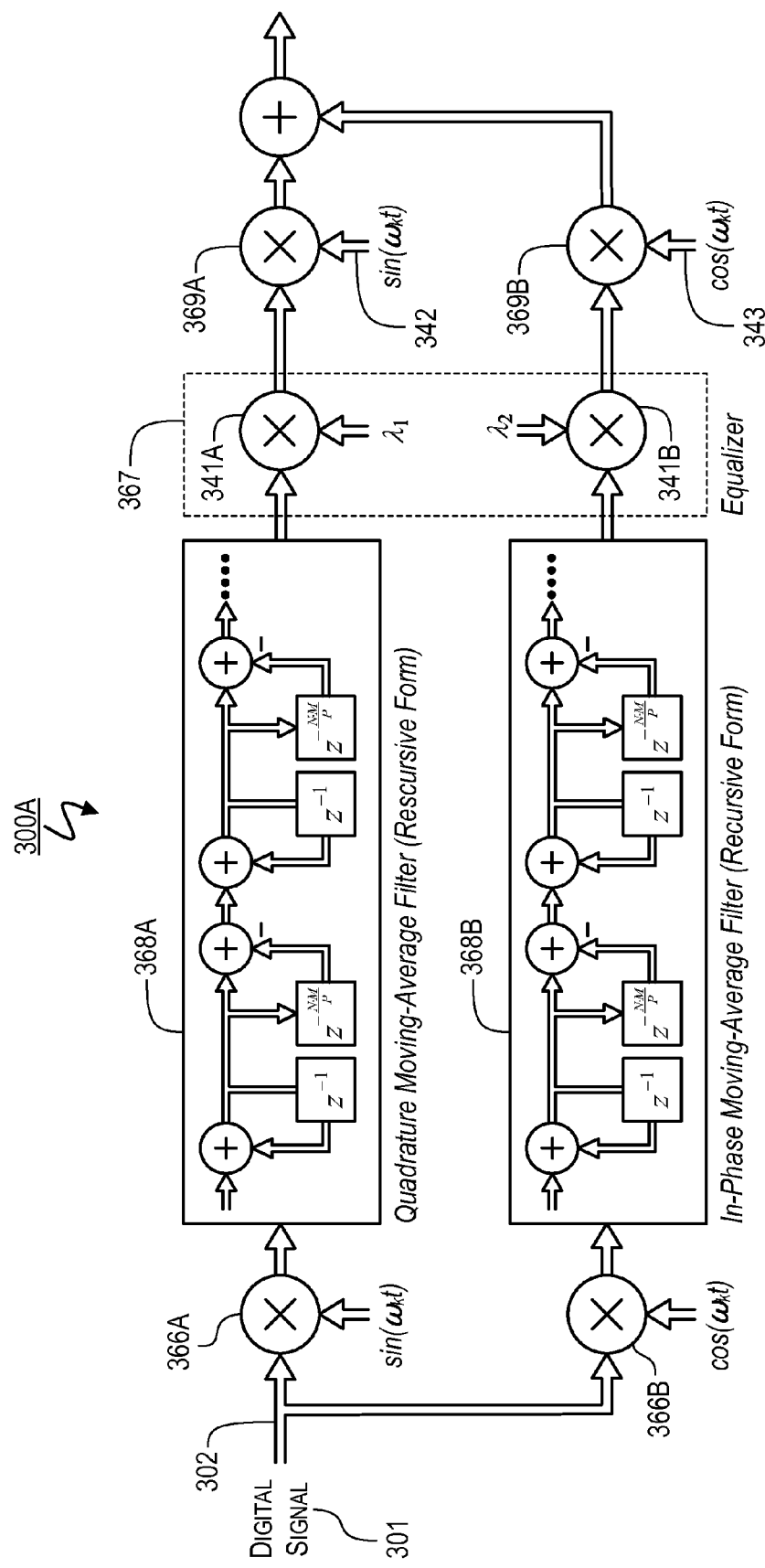
FIG. 15A is a block diagram of a digital bandlimiting (bandpass) filter according to a representative embodiment of the invention that includes recursive moving-average filters with quadrature frequency conversion.

Bandpass moving-average (BMA) filters are used in the preferred embodiments of the invention, instead of conventional transversal window filters or recursive window filters, because BMA filters feature high stopband attenuation and negligible amplitude and phase distortion, in conjunction with low complexity. A block diagram of an exemplary BMA filter is circuit 300A, shown in FIG. 15A. As FIG. 15A illustrates, a BMA filter according to the preferred embodiments of the invention consists of: (1) a quadrature downconverter (i.e., the combination of multipliers 366A&B) that uses sine and cosine sequences to shift the band of input digital signal 302 from a center frequency of $\omega_k$ (i.e., the center frequency of the associated processing branch) to a center frequency of zero; (2) a pair of cascaded moving-average filters 368A&B that, using operations comprising only adders and delay registers (i.e., no multipliers), preferably attenuate noise from quantization and jitter without introducing appreciable amplitude or phase distortion; (3) complex single-tap equalizer 367 (i.e., dual multiplier) that applies an amplitude and/or phase correction factor to the output of moving-average filters 368A&B (i.e., via scalar coefficients $\lambda_1$ and $\lambda_2$); and (4) a quadrature upconverter (i.e., the combination of multipliers 369A&B) that uses sine and cosine sequences to shift the output of moving-average filters 368A&B from a center frequency of zero back to a center frequency of $\omega_k$ (i.e., the original center frequency of the associated processing branch). It should be noted that when the sub-band associated with a particular processing branch is centered at zero hertz, the quadrature downconversion function can be eliminated, for example, by: (1) setting the up/downconversion cosine sequence to all ones; and (2) setting the up/downconversion sine sequence to all zeros. BMA filter 300A preferably introduces negligible amplitude and phase distortion by combining cascaded moving-average filters (e.g., filters 368A&B), having near-perfect reconstruction properties, with sinusoid-based quadrature downconversion (e.g., multipliers 366A&B) and upconversion (e.g., multipliers 369A&B) operations to transform a lowpass prototype response to a bandpass response.

The BMA equalizer, shown as complex, single-tap filter 367 in FIG. 15A, corrects for phase and/or amplitude (i.e., gain) offsets that may occur among the M parallel processing branches due to: (1) mismatches in the insertion loss and propagation delay of analog input filters (e.g., filters 112 and 122), and/or (2) sampling/quantization circuits (e.g., circuit 105) with signal transfer functions that deviate from an ideal all-pass response. As will be readily appreciated, BMA equalizer 367 can be moved upstream of moving-average filters 368A&B, and/or any portion or all of the equalizer transfer function can be moved upstream of moving-average filters 368A&B, without affecting the overall transfer function of BMA filter 300A. As will be further readily appreciated, BMA equalizer 367 can be moved downstream of the quadrature upconverter (i.e., dual multipliers 369A&B). In other embodiments of the present invention, the function of BMA equalizer 367 is integrated with the quadrature upconverter by directly scaling the amplitude and/or phase of the sine sequence (e.g., sequence 342) and cosine sequence (e.g., sequence 343) that shift the output of BMA filter 300A from a center frequency of zero back to a center frequency of $\omega_k$ (i.e., dual multipliers 369A&B simultaneously provide equalization and upconversion). More specifically, in these other embodiments, sine sequence 342 becomes $A \cdot \sin(\omega_k + \theta)$ and cosine sequence 343 becomes $A \cdot \cos(\omega_k + \theta)$, where $A = \sqrt{\lambda_1^2 + \lambda_2^2}$ and $\theta = \tan^{-1}(\lambda_1/\lambda_2)$. Similarly, it will be readily appreciated that the function of BMA equalizer 367 can be integrated with the quadrature downconverter that shifts the input of BMA filter 300A from a center frequency of $\omega_k$ to a center frequency of zero (i.e., dual multipliers 366A&B simultaneously provide equalization and downconversion).

The moving-average prototype filters utilized in the bandpass moving-average (BMA) filters preferably have the general transfer function $$F(z) = \prod_{i=0}^{R-1} \left( \frac{1-z^{-2NM/P_i}}{1-z^{-1}} \right)^{p_i},$$

where filter parameters R, $P_i$ and $p_i$ are integers, and the exponent $-2 \cdot N \cdot M/P_i$ is also an integer. This moving-average prototype filter has a one-sided, 3 dB bandwidth of $$f_{3dB} \approx \frac{1}{2} \cdot \frac{f_S}{N \cdot M/P_i},$$

where $f_S$ is the filter sample-rate frequency (i.e., the sample-rate frequency of the associated processing branch), M is the number of processing branches, and N is the converter excess-rate oversampling ratio defined above. Therefore, the one-sided bandwidth of the moving-average prototype filter is inversely proportional to N, and for M filters (i.e., M processing branches), the overall, two-sided bandwidth of the composite BMA filter bank is $f_S/N$ for $P_i = 1$. The center frequency of each BMA filter is determined directly by the period of the sine and cosine sequences used for quadrature downconversion and upconversion, and preferably is set to coincide with the center of the sub-band intended to be converted by the corresponding processing branch.

The complexity of the moving-average prototype filter increases as the number S of cascaded stages increases. Therefore, S which is given by $$S = \sum_{i=0}^{R-1} p_i,$$

is preferably small, e.g., S≤3. The stopband attenuation of the BMA filter bank increases as the impulse response length, L, of the prototype filter increases, where $$L = 1 + \sum_{i=0}^{R-1} p_i \cdot (2NM/P_i - 1).$$

The amplitude and phase distortion introduced by the BMA filter bank is minimized (i.e., SDR is maximized) for prototype filter impulse responses of length L≤4·N·M−1, where as before, M is the number of processing branches and N is the converter excess-rate oversampling ratio. Thus, for maximum converter resolution, the prototype filter parameters R, $P_i$ and $p_i$ preferably result in a prototype filter of length L=4·N·M−1, or as close to that as possible. However, stopband attenuation is not a one-to-one function of L. Specifically, some L-length prototype moving-average filters realize greater stopband attenuation than other L-length prototype moving-average filters. More preferably, therefore, the three BMA prototype filter parameters are optimized, for example using trial-and-error or a conventional constrained optimization method, such that both signal-to-distortion ratio (SDR) and stopband attenuation meet the minimum levels needed to achieve a desired converter resolution (e.g., combined SDR and stopband attenuation preferably exceeding ~60 dB for 10-bit resolution)

Besides exhibiting near-perfect reconstruction properties and realizing high levels of stopband attenuation, cascaded moving-average filters can be very low in complexity because they require no multiplication operations. For example, the 3-stage (i.e., S=3) prototype filter transfer function given by $$F'(z) = \left( \frac{1 - z^{-2NM}}{1 - z^{-1}} \right) \left( \frac{1 - z^{-NM}}{1 - z^{-1}} \right)^2$$

requires only 6 additions, independent of filter length (L=4·N·M−2), plus 4·M+3 registers. With these moving-average prototype filters, the only multiplication operations required are those necessary for transforming lowpass prototype responses to bandpass responses. Bandpass transformation based on quadrature downconversion and upconversion, as shown in FIG. 15A, requires only 4 multiplies when direct digital synthesis (e.g., employing digital accumulators with sine/cosine lookup memories) is employed to generate the sine and cosine sequences that are used for the quadrature downconversion and upconversion operations. Alternatively, the sine ($x_n$) and cosine ($y_n$) sequences can be generated using CORDICs (i.e., COordinate Rotation DIgital Computer) or other recursive operations that require no memory, such as those represented by the difference equations:

$x_n = 2 \cdot \cos(\omega_0) \cdot x_{n-1} - x_{n-2}$ $y_n = 2 \cdot \cos(\omega_0) \cdot y_{n-1} - y_{n-2}.$ with initial conditions:

$x_0 = -A \cdot \sin(2 \cdot \omega_0 - \theta), x_1 = -A \cdot \sin(\omega_0 - \theta)$ $y_0 = A \cdot \cos(2 \cdot \omega_0 - \theta), y_1 = A \cdot \cos(\omega_0 - \theta).$ Although bandpass moving-average (BMA) filters based on cascaded moving-average prototype filters, such as filter 368 described above, generally are preferred because such structures provide a substantial savings in computational complexity, particularly for large M (i.e., M≥8), the conventional, transversal FIR filter bank and transversal window filter approaches can provide equal or less complexity for small M.

Figure 15B:
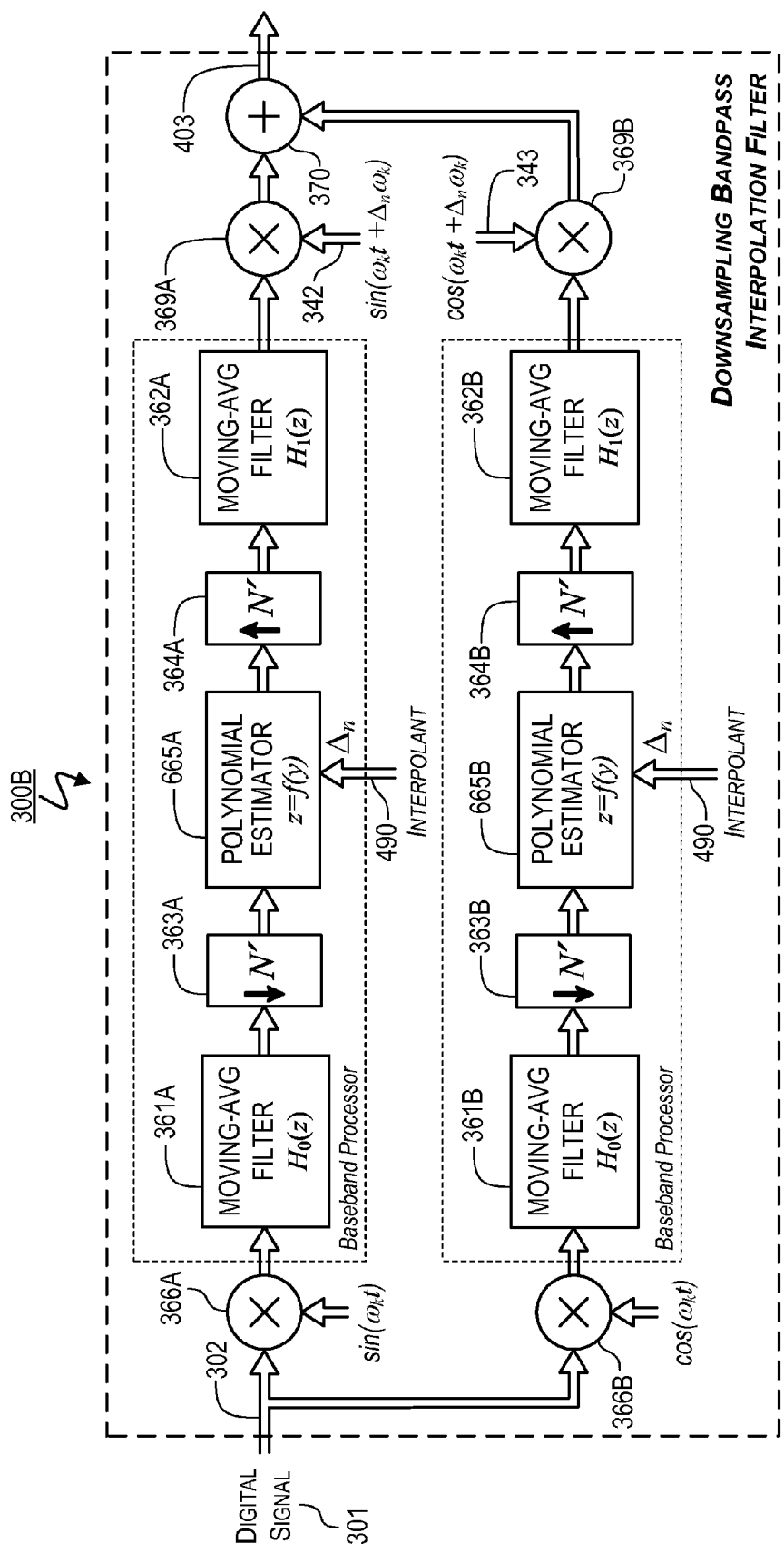
FIG. 15B is a block diagram of a bandpass interpolation filter according to a representative embodiment of the present invention that employs quadrature frequency conversion and baseband processors that incorporate up/downsampling, multi-stage moving-average filtering, and quadrature polynomial estimators.

Referring to FIG. 15B, a more general bandpass moving-average (BMA) filter, according to the preferred embodiments, is circuit 300B. In addition to the processing elements comprising exemplary circuit 300A, shown in FIG. 15A, BMA filter 300B includes programmable downsampling (i.e., subsampling to a lower rate), programmable upsampling (i.e., insertion of zeros to increase sampling rate), and digital interpolation. Also, in exemplary circuit 300B, the multiple stages of the bandpass moving-average prototype filter are split between an input filter and an output filter, such that: (1) the signal at the input of the digital interpolator (e.g., polynomial estimator 665A&B) is sufficiently bandlimited for accurate fabrication of new samples using polynomial functions; and (2) the signal at the output of the upsampling circuit has been filtered to sufficiently attenuate, prior to quadrature upconversion, the signal images introduced by the upsampling operation. More specifically, circuit 300B includes: (1) a quadrature downconverter with a quadrature output and an in-phase output (e.g., multipliers 366A&B); (2) a first baseband processor (e.g., moving-average filters 361A and 362A, downsampling circuit 363A, polynomial estimator 665A, and upsampling circuit 364A) coupled to the quadrature output of the quadrature downconverter; (3) a second baseband processor (e.g., moving-average filters 361B and 362B, downsampling circuit 363B, polynomial estimator 665B, and upsampling circuit 364B) coupled to the in-phase output of the quadrature downconverter; and (4) a quadrature upconverter with quadrature and in-phase inputs (e.g., multipliers 369A&B and adder 370) that are coupled to the outputs the first and second baseband processors, respectively. Furthermore, the quadrature upconverter utilizes sine and cosine sequences with non-zero phase to provide equalization and/or phase rotation functions. Output noise and distortion levels are lowest (e.g., signal to noise and distortion ratios are 50 dB or better) when up/downsampling is by a factor of one (i.e., N'=1) and bandlimiting occurs entirely within the input moving-average filters (e.g., filters 361A&B), such that $H_0(z) = F'(z)$ and $H_1(z) = 1$, where, for example, F'(z) is the 3-stage prototype lowpass response given by $$F'(z) = \left( \frac{1 - z^{-2NM}}{1 - z^{-1}} \right) \left( \frac{1 - z^{-NM}}{1 - z^{-1}} \right)^2.$$

In alternate embodiments, where higher noise and distortion can be tolerated in exchange for reducing the complexity of polynomial estimators 665A&B (e.g., signal to noise and distortion ratios can be 30 dB or worse), the up/downsampling factors can be other than one (i.e., N'≠1), and the various stages of the bandlimiting function can be split (allocated) between the input moving-average filters (e.g., filters 361A&B) and the output moving-average filters (e.g., filters 362A&B). For example, the three stages of exemplary prototype response F'(z) can be split between the input moving-average filter and the output moving-average filter according to:

$$H_0(z) = \left(\frac{1-z^{-NM}}{1-z^{-1}}\right)^2 \text{ and } H_1(z) = \left(\frac{1-z^{-2NM}}{1-z^{-1}}\right).$$

It should be noted that other lowpass prototype responses (i.e., responses other than exemplary response F'(z)) can be utilized, and/or other allocations of the moving-average stages to the input and output filters can be applied, provided that the cascaded input and output filters produce an overall response that is approximately all-pass (i.e., the cascaded response introduces negligible amplitude and phase distortion). It will be readily appreciated that the exemplary bandpass moving-average filter 300B can perform the bandpass interpolation filter function (e.g., associated with filters 155B, 165B and 175B) utilized within resampling filter bank 455 shown in FIG. 12. Also, although the present embodiment of circuit 300B incorporates a pair of interpolation functions (e.g., polynomial estimators 665A or 665B) between the up/downsampling operations (e.g., downsamplers 663A&B and upsamplers 664A&B) for the purpose of sample-rate conversion, other signal processing functions can be incorporated to perform operations other than interpolation, including: (1) echo cancellation in voice transmission applications; (2) adaptive equalization in data transmission applications; (3) companding and decompanding in audio applications; and (4) capacity channelization in multi-user applications.

Additional Considerations

To improve overall conversion accuracy, the present invention can incorporate any combination of: (1) analog input filters to reduce the level of output noise introduced by sampling uncertainty; (2) resampling filter banks to compensate for the sample-time offsets introduced by sampling uncertainty; and (3) precision, fixed-frequency oscillators to reduce the fluctuations in sample-rate frequency that produce sampling uncertainty. An exemplary jitter-tolerant converter that incorporates all three of the above components, according to a representative embodiment of the invention, is circuit 250 illustrated in FIG. 16. In exemplary circuit 250, each of the M processing branches incorporates a dedicated sampling error estimator (e.g., circuit 117 or 137) and a standalone resampling interpolator (e.g., circuit 119 or 139). In other embodiments, however, the function of the resampling interpolator can be distributed between a bandpass interpolation filter and a discrete data buffer. In addition, use of the present invention with complementary conventional jitter attenuators, such as phase-locked loops should be considered within the scope of the invention.

Figure 17:
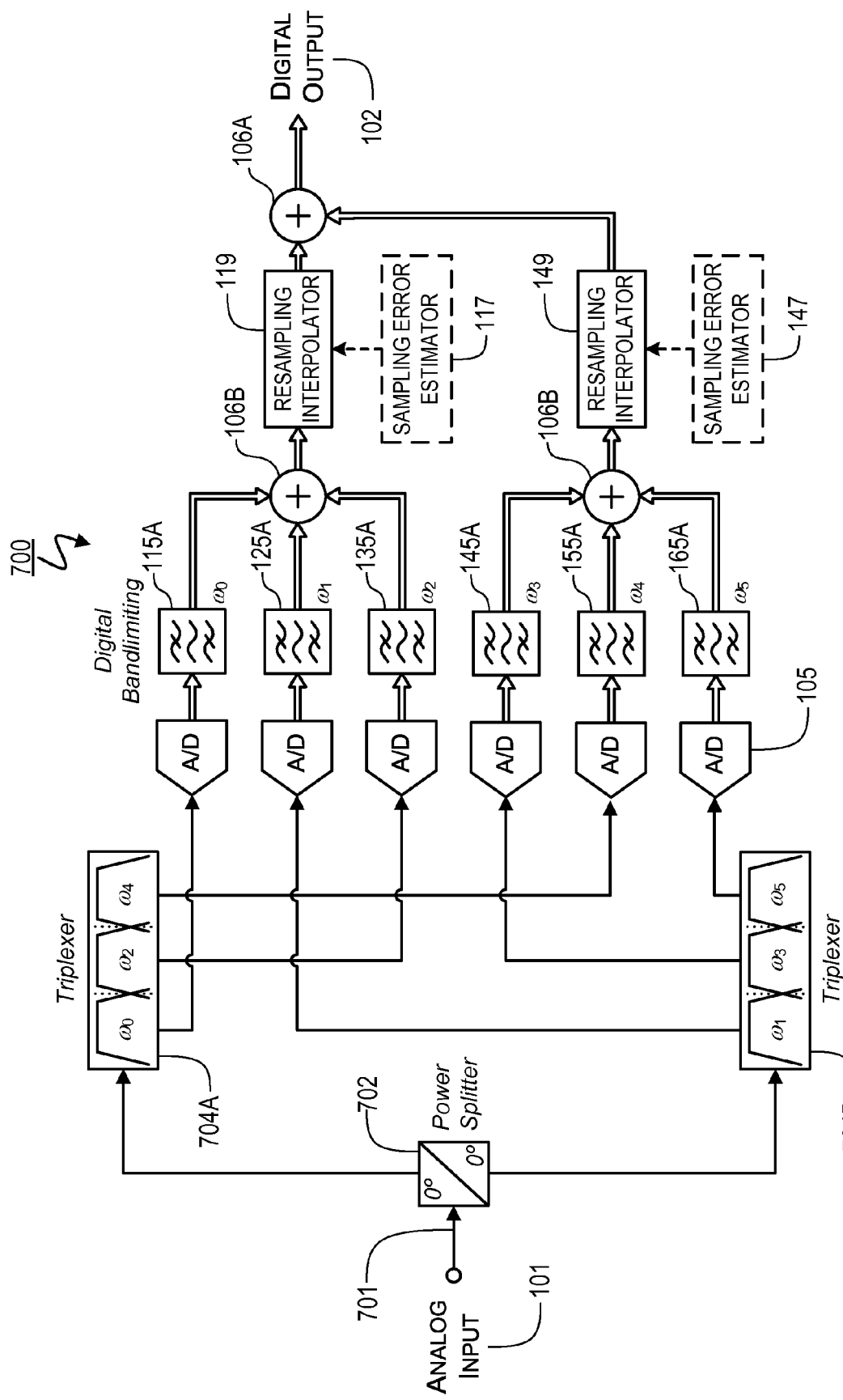
FIG. 17 is a block diagram of a complete converter according to a representative embodiment of the invention, illustrating an exemplary method for signal distribution across multiple converter processing branches using a power splitter, and a set of analog triplexers that together form overlapping sub-bands.

Furthermore, to simplify the distribution of a continuous-time input signal to the various processing branches of a converter according to the representative embodiments of the invention, the analog input filters may be grouped in combinations of two (i.e., conventional diplexers), three (i.e., conventional triplexers), or more. Exemplary circuit 700, illustrated in FIG. 17, uses conventional power splitter 702, in conjunction with triplexers 704A&B, to couple continuous-time input signal 101 (one input line 701) to the exemplary converter's six processing branches. The alternating arrangement of the filter responses within triplexers 704A&B, allows analog input filters with overlapping passbands to be grouped into triplexers with non-overlapping responses. With respect to circuit 700, in particular, the passband of the analog input filter having center frequency $\omega_0$ (i.e., the first filter in triplexer 704A) preferably overlaps with the passband of the analog input filter having center frequency $\omega_1$ (i.e., the first filter in triplexer 704B), and the passband of the analog input filter having center frequency $\omega_1$ (i.e., the first filter in triplexer 704B) preferably overlaps with the passband of the analog input filter having center frequency $\omega_2$ (i.e., the second filter in triplexer 704A). But the passband of the analog input filter having center frequency $\omega_0$ (i.e., the first filter in triplexer 704A) does not overlap with the passband of the analog input filter having center frequency $\omega_2$ (i.e., the second filter in triplexer 704A), allowing these two filters to be grouped together in conventional triplexer 704A arrangement, without undesired interactions. The outputs of bandpass filters 115A, 125A and 135A are then combined in first-stage adder 106B, and the result is processed by standalone resampling interpolator 119, either with input from an optional sampling error estimator 117 (in which case resampling interpolator 119 would be similar to resampling interpolators 600A&B) or without (in which case resampling interpolator 119 would be similar to resampling interpolator 400A). It is noted that circuit 700 illustrates one way in which $K_j$ of M total processing branches can be grouped together and processed by a single resampling interpolator (with $K_j=3$ and M=6 in the present example), as discussed above. As indicated above, similar circuits can be constructed in which analog bandpass filters (e.g., triplexers 704A&B) are omitted, i.e., in which the input signal 101 is coupled to the inputs of the various sampling/quantization circuits 105 without first being processed by such filters.

As used herein, the term "coupled", or any other form of the word, is intended to mean either directly connected or connected through one or more other processing blocks, e.g., for the purpose of preprocessing.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the more recently filed disclosure shall take precedence.

Several different embodiments of the present invention are described above, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention be considered as within the scope thereof as limited solely by the claims appended hereto.

What is claimed is:

1. An apparatus for converting a continuous-time, continuously variable signal into a sampled and quantized signal, comprising:
    an input line for accepting an input signal that is continuous in time and continuously variable;
    a plurality of processing branches coupled to the input line, each of said processing branches including: (a) a sampling/quantization circuit, and (b) a digital bandpass interpolation filter having an input coupled to an output of the sampling/quantization circuit; and
    an adder coupled to outputs of the plurality of processing branches,
    wherein the digital bandpass interpolation filters in different ones of the plurality of processing branches have frequency responses that are centered at different frequencies,
    wherein the digital bandpass interpolation filter in at least one of said processing branches comprises: (i) a quadrature downconverter, (ii) a first lowpass filter and a second lowpass filter, (iii) a first interpolator and a second interpolator, each having an input for inputting a variable interpolant value, and (iv) a quadrature upconverter, and
    wherein input samples and output samples of said digital bandpass interpolation filter in at least one of said processing branches are different discrete-time representations of an underlying continuous-time signal, with the output samples representing an altered sampling period, as compared to the input samples, and with the sampling period being altered by an amount that depends on the variable interpolant value.

2. An apparatus according to claim 1, wherein at least two of the processing branches share a common sampling/quantization circuit, such that the output of the common sampling/quantization circuit is coupled to the input of the bandpass interpolation filter in each of said at least two of the processing branches.

3. An apparatus according to claim 1, further comprising:
    a sampling error estimator having an output coupled to at least one of the bandpass interpolation filters, and
    wherein the output of the sampling error estimator has a value which is based on fluctuations in a nominal oscillation period of a signal provided to an input of the sampling error estimator.

4. An apparatus according to claim 3, further comprising a second sampling error estimator coupled to a different one of the bandpass interpolation filters.

5. An apparatus according to claim 3, further comprising a lowpass prototype filter that replicates at the output of the sampling error estimator, at least one of an equivalent baseband delay or an equivalent baseband amplitude response of at least one of the bandpass interpolation filters.

6. An apparatus according to claim 3, wherein gain and DC offsets of the sampling error estimator are corrected by minimizing at least one of a mean absolute value or a variance of a residual quantization noise at the output of at least one of the processing branches.

7. An apparatus according to claim 1, further comprising:
    a resampling data buffer coupled to a least one of the bandpass interpolation filters,
    wherein the resampling data buffer receives data samples at time intervals that are different from the time intervals at which the resampling data buffer delivers data samples.

8. An apparatus according to claim 7, wherein rates at which the sampling/quantization circuits operate are greater than an overall output data rate of said apparatus, and wherein the digital bandpass interpolation filters and associated resampling data buffers reduce said rates to the overall output data rate of said apparatus.

9. An apparatus according to claim 7, wherein there are at least 4 times as many processing branches as resampling data buffers.

10. An apparatus according to claim 1, further comprising:
    a rotation matrix multiplier coupled to an output of one of: (i) the quadrature downconverter, (ii) the first and second lowpass filter, or (iii) the first and second interpolator,
    wherein the rotation matrix multiplier applies a phase rotation to complex-valued data samples that is based on the variable interpolant value.

11. An apparatus according to claim 1, wherein the variable interpolant value is generated using an accumulator.

12. An apparatus according to claim 1, wherein the variable interpolant value is generated using an integrator.

13. An apparatus according to claim 1, wherein there are a total of M processing branches, and wherein M is at least 8.

14. An apparatus according to claim 1, wherein each of the processing branches also includes an analog bandpass filter.

15. An apparatus according to claim 1, wherein an interpolation operation performed by at least one of the bandpass interpolation filters is based on a second-order function.

16. An apparatus according to claim 1, wherein an interpolation operation performed by at least one of the bandpass interpolation filters is based on a first-order function.

17. An apparatus according to claim 1, wherein the digital bandpass interpolation filter in each of a plurality of said processing branches introduces total distortion power which is at least 40 dB below a level of a signal output by said digital bandpass interpolation filter.

18. An apparatus according to claim 1, wherein sine and cosine sequences are used by the quadrature downconverter and the quadrature upconverter and are generated using a direct digital synthesis method that comprises digital accumulators and phase lookup tables.

19. An apparatus according to claim 1, wherein sine and cosine sequences are used by the quadrature downconverter and the quadrature upconverter and are generated using recursive operations.

20. An apparatus according to claim 1, wherein sine and cosine sequences are used by the quadrature downconverter and the quadrature upconverter, and wherein at least one of said sine and cosine sequences is adjustable in at least one of amplitude or phase.

21. An apparatus according to claim 20, wherein the variable interpolant value determines adjustment of the phase of the sine and cosine sequences used by at least one of the quadrature downconverter or the quadrature upconverter.

22. An apparatus according to claim 1, wherein at least one of the first lowpass filter and the second lowpass filter incorporates a recursive moving-average operation.

23. An apparatus according to claim 1, wherein the digital bandpass interpolation filter in at least one of said processing branches incorporates an equalizer having at least one complex tap.

24. An apparatus according to claim 23, wherein the equalizer has plural complex taps.

25. An apparatus according to claim 1, wherein the center frequencies of the plurality of digital bandpass interpolation filters are spaced at equal frequency intervals.

26. An apparatus according to claim 1, wherein the center frequencies of the plurality of digital bandpass interpolation filters are spaced at non-equal frequency intervals.

* * * * *